US007132212B2

(12) United States Patent
Teraoka et al.

(10) Patent No.: US 7,132,212 B2
(45) Date of Patent: Nov. 7, 2006

(54) PRESENSITIZED PLATE

(75) Inventors: Katsuyuki Teraoka, Shizuoka (JP); Hisashi Hotta, Shizuoka (JP); Yoshitaka Kawamura, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 110 days.

(21) Appl. No.: 10/166,629

(22) Filed: Jun. 12, 2002

(65) Prior Publication Data

US 2003/0044714 A1 Mar. 6, 2003

(30) Foreign Application Priority Data

Jun. 13, 2001 (JP) ............................ 2001-178707
Jun. 27, 2001 (JP) ............................ 2001-194298
Jul. 5, 2001 (JP) ............................ 2001-204968

(51) Int. Cl.
*G03F 7/09* (2006.01)
*B41N 3/03* (2006.01)
*B41C 1/005* (2006.01)

(52) U.S. Cl. ................ 430/138; 430/278.1; 430/276.1; 430/944; 430/302

(58) Field of Classification Search ................ 430/138, 430/278.1, 944
See application file for complete search history.

(56) References Cited

U.S. PATENT DOCUMENTS 5,888,695 A 3/1999 Robinson et al.
5,985,515 A * 11/1999 Van Rompuy et al. .. 430/272.1
5,988,066 A 11/1999 Robinson et al.
6,014,929 A * 1/2000 Teng .......................... 101/456
2002/0182538 A1* 12/2002 Tomita et al. ........... 430/278.1

FOREIGN PATENT DOCUMENTS

EP 0 689 096 A1 12/1995
EP 0 894 622 A2 2/1999

(Continued)

OTHER PUBLICATIONS

Registry Search Transcript, 12 pages, results of search in Registry file of STN International via Columbus for "Aryl" and "methacrylate" done on Jun. 20, 2004, copyright 2004 by American Chemical Society.*

(Continued)

*Primary Examiner*—Cynthia Hamilton
(74) *Attorney, Agent, or Firm*—Sughrue Mion, PLLC

(57) ABSTRACT

A presensitized plate comprising a support for a lithographic printing plate including an anodized layer formed on an aluminum plate and a recording layer recordable by infrared laser exposure on the support, wherein in a section of the anodized layer after the recording layer is provided, an atomicity ratio of carbon to aluminum (C/Al) represented by Auger Electron Spectroscopic analysis is 1.0 or less. In the case of being used as an on-machine development type, it exhibits a good on-machine development characteristic, a high sensitivity, a high press life, and high scum resistance during printing and while left (ink discharging). In the case of being used as a conventional thermal positive or negative working type, it exhibits an efficient use of heat for image formation, a high sensitivity, a high press life, and a slight possibility of scum occurrence at non-image areas.

14 Claims, 3 Drawing Sheets

FOREIGN PATENT DOCUMENTS

| | | | |
|---|---|---|---|
| EP | 0 908 305 | A1 | 4/1999 |
| EP | 1 038 668 | A2 | 9/2000 |
| EP | 1 147 885 | A2 | 10/2001 |
| EP | 1 219 464 | A2 | 7/2002 |
| EP | 1 247 644 | A2 | 10/2002 |
| JP | 9-127683 | | 5/1997 |
| JP | 2938397 | | 5/1997 |
| WO | WO 99/10186 | | 3/1999 |

OTHER PUBLICATIONS

Bubert et al, “Surface and Thin-Film Analysis, 2. Electron Detection”, Ullmann’s Encyclopedia of Industrial Chemistry, Wiley-VCH Verlag GmbH & Co. KGaA, Article online posting date Jan. 15, 2002, 36 pages and one page of Figure 21showing KLL.*

* cited by examiner

PRESENSITIZED PLATE

BACKGROUND OF THE INVENTION

1. Field of the Invention

The present invention relates to a support for a lithographic printing plate, and a presensitized plate, particularly, a thermosensitive presensitized plate suitably used for a computer to plate system requiring no development, more particularly, a thermosensitive presensitized plate, which can record images by infrared ray scanning exposure based on digital signals, and can carry out printing by being directly loaded on a printing machine without any execution of a conventional development process including use of developer and the like after exposure, and a support for a lithographic printing plate used for the same.

2. Description of the Related Arts

A number of studies have been conducted on presensitized plates for a computer to plate system, which have developed remarkably in recent years. Particularly among them, for the purpose of further streamlining a process and solving a problem of waste liquid disposal, many studies have been conducted and various ideas have been presented on a presensitized plate capable of carrying out printing by being directly loaded on a printing machine after exposure.

One of promising technologies may be a thermosensitive presensitized plate including a water receptive layer formed as an image forming thermosensitive layer, the water receptive layer containing hydrophobic thermoplastic polymer particles dispersed in hydrophilic binder polymer. This presensitized plate uses a principle that when heat is applied to the thermosensitive layer, hydrophobic thermoplastic polymer particles are fusion-bonded, and a surface of the water receptive thermosensitive layer is converted into an ink receptive image area.

One of methods for reducing processing steps in such a presensitized plate using the fusion bonding of hydrophobic thermoplastic polymer particles may be so-called on-machine development, which loads the presensitized plate after exposure to a cylinder of a printing machine without treating it in developer, and supplies ink and/or fountain solution while rotating the cylinder, thereby removing non-image areas of a recording layer of the presensitized plate. In this method, after the exposure, the presensitized plate is directly loaded on the printing machine, and development is completed in a normal printing process.

Such a presensitized plate suited to the on-machine development must have a thermosensitive layer soluble in fountain solution or ink solvent, and a lighted room handling characteristic suited to development on the printing machine placed in the lighted room.

For example, JP 2938397 B (the term "JP XXXXXXX B" as used herein means an "Japanese patent") describes a presensitized plate including a thermosensitive layer formed on a water receptive support, the thermosensitive layer containing fine particles of thermoplastic hydrophobic polymer dispersed in hydrophilic binder polyer. In this specification, it is described that the presensitized plate is subjected to infrared laser exposure, the fine particles of thermoplastic hydrophobic polymer are combined by heat to form an image, then the plate is attached onto a printing machine cylinder and, by supplying ink and/or fountain solution, on-machine development can be carried out.

In addition, in JP 9-127683 A (the term "JP XX-XXXXXX A" as used herein means an "unexamined published Japanese patent application") and WO 99/10186, it is described that after thermoplastic fine particles are combined by heat, on-machine development is carried out to manufacture a lithographic printing plate.

However, in the case of the presensitzed plate, which combines fine particles by heat to form images, problems have been inherent, including a low sensitivity caused by releasing of heat to a metal support and an insufficient press life caused by a low strength of the image area of the thermosensitive layer when the fine particles are not sufficiently combined while a good on-machine developing characteristic is exhibited.

As a countermeasure, a method of providing water insoluble organic polymer between an aluminum support and a thermosensitive layer has been presented (e.g., JP 2000-23983 A). However, this method has had a scumming problem while a sensitivity has been increased.

The following problems have been inherent in conventional presensitized paltes of thermal types which don't carry out on-machine development. Those plates include a positive presensitized plate of a so-called thermal type for causing photothermal conversion by infrared absorbent present in a thermosensitive layer, generating heat by exposure, and making the exposed portion of the thermosensitive layer alkali-soluble by the heat to form a positive image, and a negative presensitized plate of a thermal type for generating radicals or acids with radical generator or acid generator by the heat, thereby progressing radical polymerization reaction or acid crosslinking reaction to form a negative image.

That is, in the thermal type image forming, laser beam irradiation makes photothermal conversion material generate heat in the thermosensitive layer, and this heat causes image forming reaction. However, in an aluminum support which is grained and provided with an anodized layer, heat generated in the vicinity of an interface between the thermosensitive layer and the support is diffused inside the support before it is sufficiently used for image formation because heat conductivity of the support is extremely higher than a thermosensitive layer. Consequently, the following problems occur in the interface between the thermosensitive layer and the support.

First, in the thermosensitive layer of the positive working type, when alkali solubilization reaction isn't enough, heat is diffused inside the support and a problem of a low sensitivity causes, that is, residual layers are formed on an area to be a non-image area. This is a basic problem inherent in the positive working type thermosensitive layer.

In addition, in the presensitized plate of such a thermal positive working type, the use of infrared absorbent having a photothermal conversion function is essential. However, the absorbent has low solubility because of its relatively large molecular weight, and adsorbed on micropores formed by anodizing, and made difficult to be removed. Thus, residual layers are easily formed in the development process using alkali developer.

In the case of the negative working type thermosensitive layer, when heat is diffused inside the support, and developer insolubilization of the thermosensitive layer becomes insufficient in the vicinity of the interface between the thermosensitive layer and the support, an image is not sufficiently formed in an area to be an image area, disappearing during development, and even if an image is formed, the image area is easily peeled off during printing.

In order to solve the foregoing problems, attempts have been made to increase micropores on an anodized layer with a view to suppressing diffusion of heat generated on the thermosensitive layer in the aluminum support.

However, in the method of increasing micropores on the anodized layer, scum resistance is reduced while a sensitivity and a press life are increased. In addition, when a thermosensitive layer of an on-machine development type is provided, an on-machine development characteristic is also deteriorated.

From a similar perspective, attempts have been made to seal micropores by a method of dipping an aluminum support having an anodized layer formed on an aluminum plate in hot aqueous solution containing hot water, or inorganic or organic salt, a method of exposing it to steam bath, and the like.

However, in the method of sealing the micropores, a sensitivity and a press life are reduced while scum resistance is increased. In any case, therefore, it has not achieved a satisfactory level yet.

Under these circumstances, the inventors have presented a presensitized plate in Japanese Patent Application No. 2001-9871, which comprises an aluminum support including an anodized layer formed on an aluminum plate, and a particle layer containing particles having an average particle size of 8 to 800 nm and a recording layer recordable by infrared laser exposure formed in this order on the aluminum support. In this specification referenced herein, the inventors have also presented a method of providing the particle layer on the aluminum support by electrolyzing the aluminum support using electrolyte containing hydrophilic particles having an average particle size of 8 to 800 nm. According to this method, openings thereof can be sealed while voids are left inside micropores present on the anodized layer. Thus, it is possible to provide a presensitized plate high in sensitivity and press life, and also scum resistance can be increased.

However, regarding the increase in scum resistance, a level of increase achieved has not been satisfactory.

SUMMARY OF THE INVENTION

A first object of the present invention is to provide a thermosensitive presensitized plate capable of solving the foregoing drawbacks of the related arts, and a support for a lithographic printing plate, which is suitably used for the same. That is, a thermosensitive sensitized plate is provided, which exhibits a good on-machine development characteristic, a high sensitivity, a high press life, and high scum resistance during printing and while left (ink discharging) in the case of being used as an on-machine development type. In the case of being used as a conventional thermal positive or negative working type, the thermosensitive presensitized plate exhibits an efficient use of heat for image formation, a high sensitivity, a high press life, and a slight possibility of scum occurrence at a non-image area. Also, a support for a lithographic printing plate suitably used for the same is provided.

A second object of the present invention is to provide a method of manufacturing a presensitized plate, which exhibits a capability of efficiently using heat for image formation, a high sensitivity, a high press life, and high scum resistance.

In order to achieve the first object, the inventors conducted serious studies, and discovered the following. That is, in the case of the presensitized plate including the recording layer recordable by infrared laser exposure on the anodized layer, a recording layer component enters into the micropores on the anodized layer. Since this recording layer component has a higher thermal conductivity than that of voids (micropores) of the anodized layer, a thermal conductivity of the anodized layer is increased after the recording layer is provided, consequently causing the foregoing problems. Based on the above discovery, the inventors conductive further serious studies, and discovered the following to complete a first aspect of the present invention. That is, by setting a ratio of carbon to aluminum components in the anodized layer to a predetermined value or less, it is possible to provide a presensitized plate excellent in all of press life, sensitivity and scum resistance when it is processed into a lithographic printing plate.

That is, the present invention provides a presensitized plate comprising:

a support for a lithographic printing plate including an anodized layer formed on an aluminum plate and a recording layer recordable by infrared laser exposure on the support, wherein in a section of the anodized layer after the recording layer is provided, an atomicity ratio of carbon to aluminum (C/Al) represented by a following formula (1) is 1.0 or less:

$$C/Al=(I_c/S_c)/(I_{al}/S_{al}) \quad (1)$$

$I_c$: carbon (KLL) Auger electron differential peak-to-peak amplitude $I_{al}$: aluminum (KLL) Auger electron differential peak-to-peak amplitude $S_c$: relative sensitivity factor of carbon (KLL) Auger electron $S_{al}$: relative sensitivity factor of aluminum (KLL) Auger electron Preferably, a porosity of the anodized layer is 20 to 70% before the recording layer is provided.

Preferably, a porosity of the anodized layer is 20 to 70% before the recording layer is provided, and a diameter of micropores exposed on a surface of the anodized layer is 15 nm or less.

The anodized layer having a predetermined porosity is formed on the surface of the aluminum support. Accordingly, the anodized layer functions as a heat insulating layer having a number of voids inside, reducing a thermal conductivity of an interface between the thermosensitive layer and the support, and increasing a sensitivity and a press life.

Moreover, by controlling the diameter (also referred to as "surface pore diameter", hereinafter) of the micropores exposed on the surface of the anodized layer to a predetermined value or less, an on-machine development characteristic and scum resistance when left are prevented from being deteriorated while the advantage of increasing a sensitivity and a press life is maintained. This can effectively prevent residual layers or the like caused by an ink receptive component such as a dye or a binder in the recording layer. Moreover, because of high hydrophilicity (water wettability), high scum resistance is provided.

To set a predetermined porosity and a predetermined surface pore diameter of the anodized layer, for example, a method of treating the anodized layer by acid or alkali may be suitably used. Also, this may be combined with a sealing treatment.

Preferably, the recording layer is a thermosensitive layer containing:

(a) fine particle polymer having a thermo-reactive functional group, or (b) a microcapsule containing a compound having a thermo-reactive functional group.

In order to achieve the foregoing second object, the inventors have conducted serious studies, and discovered that in the presensitized plate in Japanese Patent Application No. 2001-9871, which comprises an aluminum support including an anodized layer formed on an aluminum plate, and a particle layer containing particles having an average particle size of 8 to 800 nm and a recording layer recordable by infrared laser exposure formed in this order on the aluminum support, when the particle layer is provided on the support by dipping or coating, occurrence of scum on a non-image area was further suppressed, and completed a second aspect of the present invention.

That is, the present invention provides a method of manufacturing a presensitized plate, comprising the steps of dipping an aluminum support including an anodized layer formed on an aluminum plate in liquid containing hydrophilic particles having an average particle size of 8 to 800 nm to form a particle layer on the aluminum support; and forming a recording layer recordable by infrared laser exposure on the particle layer. The present invention also provides a presensitized plate a presensitized plate comprising an aluminum support including an anodized layer formed on an aluminum plate, and a particle layer containing particles having an average particle size of 8 to 800 nm and a recording layer recordable by infrared laser exposure formed in this order on the aluminum support, obtained by this manufacturing method.

Further, the present invention provides a method of manufacturing a presensitized plate, comprising the steps of coating liquid containing hydrophilic particles having an average particle size of 8 to 800 nm on an aluminum support including an anodized layer formed on an aluminum plate to form a particle layer on the aluminum support; and forming a recording layer recordable by infrared laser exposure on the particle layer. The present invention also provides a presensitized plate a presensitized plate comprising an aluminum support including an anodized layer formed on an aluminum plate, and a particle layer containing particles having an average particle size of 8 to 800 nm and a recording layer recordable by infrared laser exposure formed in this order on the aluminum support, obtained by this manufacturing method.

In these methods of manufacturing presensitized plates, preferably, after the particle layer is formed, a hydrophilic treatment is carried out before the recording layer is formed.

Preferably, a thermal conductivity of the hydrophilic particles is 60 W/(m·K) or less.

Moreover, the present invention provides a persensitized plate of the first aspect of the present invention obtained by the method of manufacturing a presensitized plate of the second aspect of the present invention.

FIG. 4 is a schematic sectional view showing a presensitized plate obtained according to the second aspect of the present invention. As shown in FIG. 4, the presensitized plate 1 obtained according to the second aspect of the invention comprises an aluminum support 4 including an anodized layer 3 formed on an aluminum plate 2, and a particle layer S containing particles having an average particle size of 8 to 800 nm and a predetermined recording layer 6 formed in this order on the aluminum support. Micropores 7 present on the anodized layer 3 are sealed by the particle layer 5, but have voids inside. In the case of conventional sealing, micropores in the anodized layer are filled with boehmite or the like, few voids being left as a result. However, the present invention is greatly different from the conventional art in that the voids are provided inside the micropores.

In the presensitized plate obtained by the present invention, heat insulating effects by the particle layer and by the voids of the micropores can be simultaneously provided. Thus, it is possible to sufficiently suppress heat diffusion from the thermosensitive layer to the aluminum support, thereby allowing heat to be efficiently used for image formation.

The particle layer is provided by dipping or coating. Thus, it is possible to provide a presensitized plate particularly high in scum resistance.

Therefore, according to the present invention, it is possible to achieve a presensitized plate high in sensitivity, and press life, with occurrence of scum at a non-image area further suppressed.

Furthermore, the present invention provides a method of making a lithographic printing plate and printing, comprising a step of executing printing by subjecting a presensitized plate described in any one of the below-listed embodiments (A) to (E) to image exposure with a laser beam, and directly attaching the plate to a printing machine, or by subjecting the presensitized plate to image exposure with a laser beam after the plate is attached to the printing machines:

(A) A presensitized plate comprising:

a support for a lithographic printing plate including an anodized layer formed on an aluminum plate and a recording layer recordable by infrared laser exposure on the support, wherein in a section of the anodized layer after the recording layer is provided, an atomicity ratio of carbon to aluminum (C/Al) represented by a following formula (1) is 1.0 or less:

$$C/Al=(I_c/S_c)/(I_{al}/S_{al}) \quad (1)$$

$I_c$: carbon (KLL) Auger electron differential peak-to-peak amplitude $I_{al}$: aluminum (KLL) Auger electron differential peak-to-peak amplitude $S_c$: relative sensitivity factor of carbon (KLL) Auger electron $S_{al}$: relative sensitivity factor of aluminum (KLL) Auger electron;

(B) A presensitized nlate according to embodiment (A), wherein a porosity of the anodized layer before the recording layer is provided is 20 to 70 %, and a diameter of a micropore exposed on a sufface of the anodized layer is 15 nm or lower;

(C) A presensitized niate comprising:

an aluminum support including an anodized layer formed on an aluminum plate, and a particle layer containing particles having an average particle size of 8 to 800 nm and a recording layer recordable by infrared laser exposure formed in this order on the aluminum support;

(D) A presensitized plate according to embodiment (A), wherein the recording layer is a thermosensitive layer containing:

(a) fine particle polymer having a thermo-reactive functional group, or (b) a microcapsule containing a compound having a thermo-reactive functional group;

(E) A presensitized plate manufactured by a method comprising the steps of:

dipping an aluminum support including an anodized layer formed on an aluminum plate in liqiuid containing hydrophilic particles having an average particle size of 8 to 800 nm to form a particle layer on the aluminum support; and forming a recording layer recordable by infrared laser exposure on the particle layer;

wherein after the particle layer is formed, a hydrophilic treatment is carried out before the recording layer is formed.

DETAILED DESCRIPTION OF THE PREFERRED EMBODIMENTS

Figure 1:
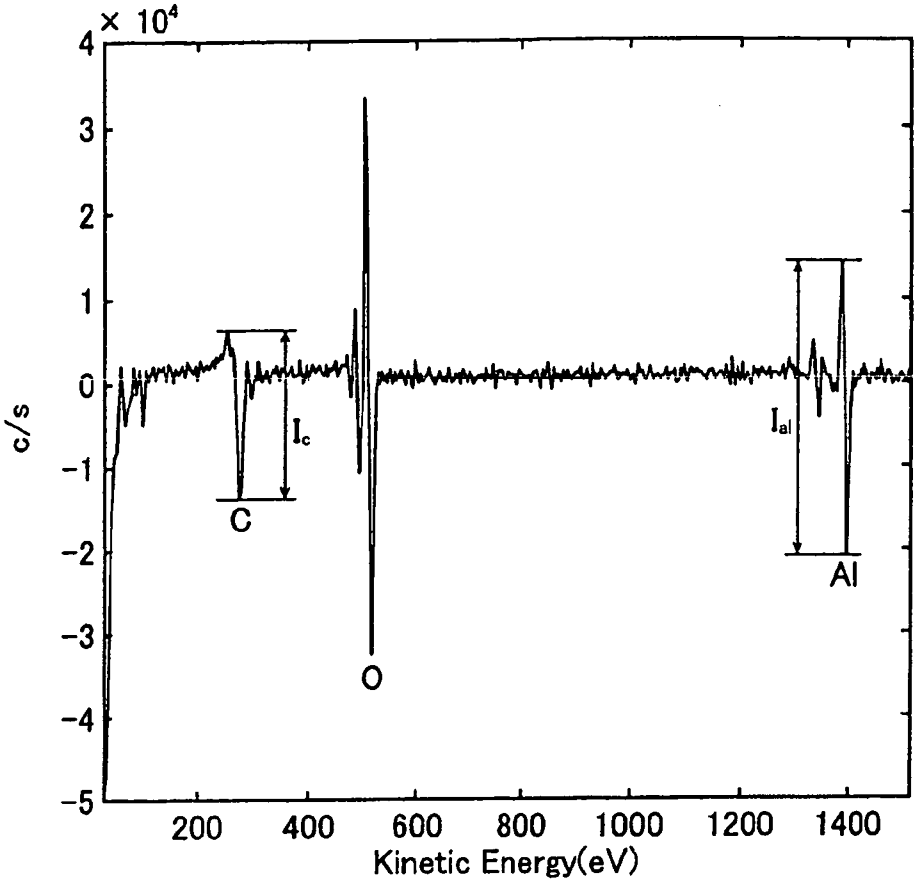
FIG. 1 is a chart showing an example of Auger electron spectroscopic analysis for a section of an anodized layer of a presensitized plate.

Next, the present invention will be described in detail.

<Aluminum Plate (Rolled Aluminum)>

An aluminum plate used for a presensitized plate of the present invention is metal that is dimensional stable and has aluminum as a main component, and is composed of aluminum or aluminum alloy. Besides a pure aluminum plate, alloy with aluminum as the main component containing very small quantity of different elements, plastic film or paper laminated or vapor deposited with aluminum or aluminum alloy may be used. Further, as described in JP 48-18327 B (the term "JP XX-XXXXXX B" as used herein means an "examined Japanese patent publication"), a composite sheet in which an aluminum sheet is combined on a polyethylene terephthalate film may be used.

While no particular limitation is placed, a pure aluminum plate is preferably used in the present invention. However, since it is difficult to produce perfectly pure aluminum from the viewpoint of refining technology, aluminum containing tiny quantity of different elements may be allowable. For example, well-known materials described in Aluminum Handbook 4-th edition (by Japan Light Metal Association, 1990), specifically, aluminum alloy plates such as JIS A1050, JIS A1100, JIS A3005, International registered alloy 3103A and the like may be used as occasion arises. Also, an aluminum plate using aluminum alloy, a scrap aluminum material, or secondary bare metal having an aluminum (Al) content set to 99.4 to 95 wt %, and containing at least five selected from iron (Fe), silicon (Si), copper (Cu), magnesium (Mg), manganese (Mn), zinc (Zn), chrome (Cr), and titanium (Ti) in a later-described range may be used.

In the present invention, an aluminum plate having an Al content set to 95 to 99.4 wt %, which can reduce costs, may be used. If an Al content exceeds 99.4 wt %, allowable quantity of impurities is reduced, and thus the effect of reducing costs may be lowered. If an Al content is less than 95 wt %, quantity of impurities contained is large, causing inconveniences such as crack in rolling. More preferably, an Al content is 95 to 99 wt %, and 95 to 97 wt % is particularly preferable.

An Fe content is preferably 0.1 to 1.0 wt %. Fe is an element contained by around 0.1 to 0.2 wt % even in new bare metal, quantity of Fe dissolved in Al is small, and most remains as an intermetallic compound. If an Fe content exceeds 1.0 wt %, cracks easily occur in rolling, and if it is less than 0.1 wt %, the effect of reducing costs is reduced, which are not preferable. More preferably, an Fe content is 0.3 to 1.0 wt %.

An Si content is preferably 0.03 to 1.0 wt %. Si is an element greatly contained in scrap materials of JIS 2000, 4000 and 6000 series. Si is an element contained by about 0.03 to 0.1 wt % even in new bare metal, and present in a state of being dissolved in Al or as an intermetallic compound. When the aluminum plate is heated in the manufacturing process of a support, Si that has been dissolved may be deposited as elemental Si. It is known that elemental Si and an intermetallic compound of FeSi series adversely affects harsh ink scum resistance. Here, "harsh ink scum" means dotted or annular scum appearing on printed paper or the like as a result of easy adhering of ink to a surface of a non-image area of a lithographic printing plate when printing is carried out with many interruptions. If an Si content exceeds 1.0 wt %, for example, this may not be completely removed in later-described treatment using sulfuric acid (desmutting). If it is less than 0.03 wt %, the effect of reducing costs may be lowered. More preferably, an Si content is 0.05 to 1.0 wt %.

A Cu content is preferably 0.000 to 1.0 wt %, more preferably 0.000 to 0.3 wt %. Cu is an element greatly contained in scraps of JIS 2000 and 4000 series. Cu is dissolved in Al relatively easily. If a Cu content exceeds 1.0 wt %, for example, this may not be completely removed in later-described acid etching or desmutting. Here, a Cu content of 0.000 wt % indicates that although the content cannot be detected in the order of 0.000, the content is not exactly 0 wt % but has trace quantity. Hereinafter, when a lower limit of content is 0.000 wt %, it means the same thing.

An Mg content is preferably 0.000 to 1.5 wt %. Mg is an element greatly contained in scraps of JIS 2000, 3000, 5000 and 7000 series materials. Especially, since it is much contained in a can end material, it is one of main impure metals contained in a scrap material. Mg is dissolved in Al relatively easily, and forms an intermetallic compound with Si. If an Mg content exceeds 1.5 wt %, for example, this may not be completely removed in later-described treatment using sulfuric acid.

An Mn content is preferably 0.000 to 1.5 wt %. Mn is an element greatly contained in scraps of JIS 3000 series materials. Especially, since it is much contained in a can body material, Mn is one of main impure metals contained in a scrap material. Mn is dissolved in Al relatively easily, and forms an intermetallic compound with Al, Fe and Si. If an Mn content exceeds 1.5 wt %, for example, this may not be completely removed in later-described treatment using sulfuric acid.

A Zn content is preferably 0.000 to 0.5 wt %. Zn is an element greatly contained especially in scraps of JIS 7000 series materials. Zn is dissolved in At relatively easily. If a Zn content exceeds 0.5 wt %, for example, this may not be completely removed in later-described treatment using sulfuric acid.

A Cr content is preferably 0.000 to 0.1 wt %. Cr is an element contained by a small quantity in scraps of JIS A5000, 6000 and 7000 series materials. If a Cr content exceeds 0.1 wt %, for example, this may not be completely removed in later-described treatment using sulfuric acid.

A Ti content is preferably 0.003 to 0.5 wt %. Ti is an element normally added by 0.01 to 0.04 wt % as a crystal refinement material. Ti is an element contained relatively greatly in scraps of JIS 5000, 6000 and 7000 series materials. If a Ti content exceeds 0.5 wt %, for example, this may not be completely removed in later-described treatment using sulfuric acid.

The aluminum plate used in the present invention is produced by using the foregoing raw material cast by a common method, executing rolling and heat treatment as occasion arises, setting a thickness to, e.g., 0.1 to 0.7 mm, and executing planarity correction when necessary. This thickness can be properly changed according to a size of a printing machine, a size of a printing plate or user's request.

With regard to a production method of the aluminum plate, for example, DC casting, a method omitting soaking and/or annealing from the DC casting method, and a continuous casting method can be used.

The aluminum support used for the presensitized plate of the present invention is obtained by executing the anodizing on the aluminum plate. However, the production process may include various steps other than the anodizing step.

Preferably, the aluminum support is formed by executing a degreasing step of removing stuck rolling oil, a desmutting step of dissolving smut on the surface of the aluminum plate, a graining step of graining the surface of the aluminum plate, and an anodizing step of covering the surface of the aluminum plate with an oxide layer on the aluminum plate.

Preferably, the production process of the aluminum support used in the present invention includes graining treatment (electrochemical graining treatment) for electrochemically graining the aluminum plate by using an alternating current in acid aqueous solution.

The production process of the aluminum support used in the present invention may include, other than the electrochemical graining treatment, an aluminum plate surface treatment step combining mechanical graining, chemical etching in acid or alkali aqueous solution, and the like. The production process, such as graining, of the aluminum support used in the present invention may be carried out by a continuous method or an intermittent method. Industrially, the continuous method is preferable.

In the present invention, further, pore widening treatment (acid or alkali treatment), treatment in aqueous solution containing an inorganic fluorine compound and a silicate compound, sealing treatment, surface hydrophilic treatment are carried out when necessary. When necessary, an undercoat layer may also be provided.

Particularly, preferably, a particle layer is formed on the aluminum support by dipping the aluminum support having an anodized layer on the aluminum plate in liquid containing hydrophilic particles having an average particle size of 8 to 800 nm. Alternatively, a particle layer is formed on the aluminum support by coating liquid containing hydrophilic particles having an average particle size of 8 to 800 nm to the aluminum support.

<Graining Treatment>

First, a graining treatment is described.

A graining treatment will be performed on the foregoing aluminum plate to have preferably shape. As a graining treatment method, there are mechanical graining as described in JP 56-28893 A, chemical etching, electrolytic graining and the like. Furthermore, an electrochemical graining (electrolytic graining) method graining a surface of aluminum in hydrochloric acid electrolyte or nitric acid electrolyte electrochemically, a mechanical graining method such as a wire brushing graining method scratching a surface of aluminum plate with metal wire, a ball graining method graining a surface of aluminum plate with abrasives and a graining ball, a brush graining method graining the surface with nylon brushes and abrasives, may be used. These graining methods may be used alone or in combination. For example, a combination of mechanical graining with nylon brushes and abrasives with electrolytic graining by hydrochloric acid electrolyte or nitric acid electrolyte, and a combination of multiple electrolytic graining treatments may be enumerated. Among these graining methods, electrochemical graining is desirable. A preferable combination is mechanical graining with electrochemical graining and, especially, the electrochemical graining is preferably carried out after the mechanical graining.

The mechanical graining treatment mechanically grains the surface of the aluminum plate by using a brush or the like. Preferably, it is carried out before the electrochemical graining.

In the preferably mechanical graining, treatment is carried out by a rotatable nylon brush roll having a bristle diameter of 0.07 to 0.57 mm, and abrasive slurry liquid fed to the surface of the aluminum plate.

A nylon brush having a lower absorption factor is preferable. A preferred example is Nylon Bristle 200T by Toray Industries, Inc., (6, 10-nylon, softening point: 180° C., melting point: 212 to 214° C., specific gravity: 1.08 to 1.09, moisture percentage: 1.4 to 1.8 wt % in 20° C. and relative humidity 65%, and 2.2 to 2.8 wt % in 20° C. and relative humidity 100%, dry tensile strength: 4.5 to 6 g/d, dry tensile elongation: 20 to 35%, boiling water contraction percentage: 1 to 4%, dry tensile resistance: 39 to 45 g/d, Young's modulus (dry): 380 to 440 kg/mm$^2$).

Well-known abrasives can be used. Preferably, however, silica sand, quartz, aluminum hydroxide, or a mixture of these described in JP 6-135175 A and JP 50-40047 B is used.

For the slurry liquid, preferably, specific gravity is set in a range of 1.05 to 1.3. As a method of feeding the slurry liquid to the surface of the aluminum plate, for example, a method of spraying the slurry liquid, a method using a wire brush, and a method of transferring the surface shape of a roll having asperities may be enumerated. Besides, methods described in JP 55-74898 A, JP 61-162351 A, JP 63-104889 A may be used. Further, as described in JP 9-509108 A, a method can be used, which brush-polishes the surface of the aluminum plate in aqueous slurry containing a mixture of particles of alumina and quarts set in a range of 95:5 to 5:95 by weight. An average particle size of the mixture in this case is preferably set in a range of 1 to 40 μm, especially in a range of 10 to 30 μm.

The electrochemical graining treatment electrochemically grains the surface of the aluminum plate by applying an alternating current while using the aluminum plate as an electrode, and it is different from the foregoing mechanical graining. According to the electrochemical graining, since micro asperities are easily provided on the surface, this method is also suitable for improving adhesion between the thermosensitive layer and the support.

According to the present invention, in the electrochemical graining, the ratio $Q_C/Q_A$ of the quantity of electricity when the aluminum plate becomes cathode, i.e., the quantity of electricity $Q_C$ at the cathode side, to the quantity of electricity when it becomes anode, i.e., the quantity of electricity $Q_A$ at the anode side, is set, for example in the range of 0.5 to 2.0. Thus, uniform honeycomb pits can be formed on the surface of the aluminum plate. If $Q_C/Q_A$ is less than 0.5, honeycomb pits easily become non-uniform. The same also occurs when it exceeds 2.0. Preferably, $Q_C/Q_A$ is set in a range of 0.8 to 1.5.

As a waveform of the alternating current used in the electrochemical graining, a sine wave, a rectangular wave, a triangular wave, a trapezoidal wave and the like may be enumerated. Among them, the rectangular wave or the trapezoidal wave is preferable. As a frequency of the alternating current, 30 to 200 Hz is preferable from a viewpoint of costs for manufacturing a power supply device, more preferably 40 to 120 Hz.

Figure 2:
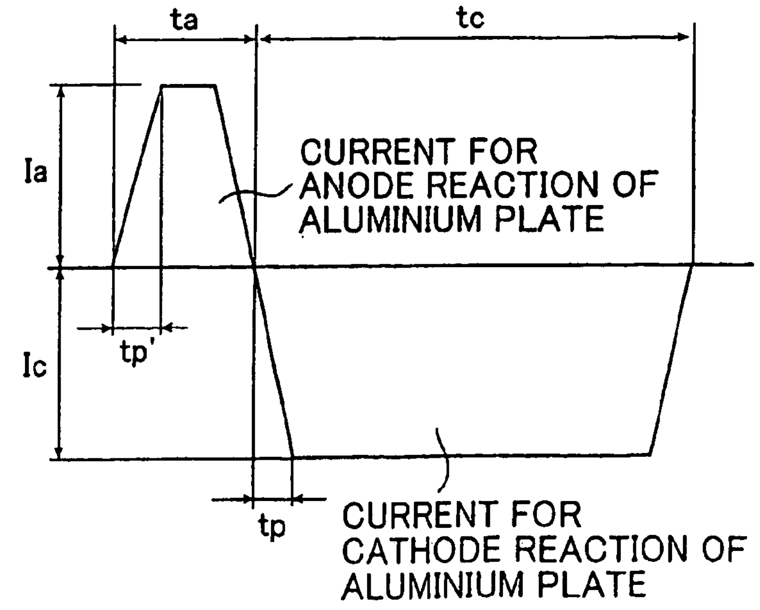
FIG. 2 is a waveform view showing an example of a trapezoidal wave used for electrochemical graining using an alternating current suitably used for the present invention.

FIG. 2 shows an example of a trapezoidal wave suitably used in the present invention. An axis of ordinate indicates a current value, while an axis of abscissa indicates time. A reference numeral ta denotes anode reaction time, tc cathode reaction time, tp time from a current value of 0 to reach a peak at a cathode cycle side, tp' time from a current value of 0 to reach a peak at an anode cycle side, Ia a current at the peak time of the anode cycle side, and Ic a current at the peak time of the cathode cycle side. In the case of using the trapezoidal wave as the waveform of the alternating current, time tp and tp' from the current values of 0 to reach the peaks are preferably 0.1 to 2 msec., and more preferably 0.3 to 1.5 msec., respectively. If tp and tp' are less than 0.1 msec., impedance of a power supply circuit may be affected, necessitating a large power supply voltage at the rising time of a current waveform. Consequently, power supply device costs may be increased. If tp and tp' exceed 2 msec., the effect of a very small quantity of component in acid aqueous solution becomes large, making the execution of uniform graining difficult.

Preferably, a duty of the alternating current used in the electrochemical graining is set in a range of 0.25 to 0.5 for the purpose of uniformly graining the surface of the aluminum plate, more preferably in a range of 0.3 to 0.4. The duty in the present invention is represented by ta/T when the time of continuing anode reaction of the aluminum plate (anode reaction time) is ta at a cycle T of the alternative current. Especially, on the surface of the aluminum plate during cathode reaction, dissolution or breaking of the oxide layer occurs in addition to the generation of smut components mainly containing aluminum hydroxide, becoming a starting point of pitting reaction at next anode reaction time of the aluminum plate. Thus, selection of the duty of the alternating current has a great effect on uniform graining.

Regarding a current density of the alternating current, in the case of the trapezoidal or rectangular wave, preferably, a current density Iap at the peak time of the anode cycle side, and a current density Icp at the peak time of the cathode cycle side are set to 10 to 200 A/dm$^2$, more preferably 10 to 100 A/dm$^2$. Preferably, Icp/Iap is set in a range of 0.9 to 1.5.

In the electrochemical graining, a total of the quantity of electricity used for the anode reaction of the aluminum plate is preferably 50 to 1000 C/dm$^2$ when the electrochemical graining is finished, more preferably 50 to 800 C/dm$^2$, further preferably 50 to 400 C/dm$^2$. Preferably, time of the electrochemical graining is 1 sec., to 30 min.

Regarding the acid aqueous solution used in the electrochemical graining, what is used in general electrochemical graining using a direct or alternating current can be used. Preferably, acid aqueous solution mainly containing nitric acid or hydrochloric acid is used. Here, “mainly” means that a main component in the aqueous solution is contained by 30 wt % or more with respect to the entire components, preferably 50 wt %. The same applies to other components, hereafter.

For the acid aqueous solution mainly containing nitric acid, what is used in general electrochemical graining using a direct or alternating current can be used. For example, one or more of nitric acid compounds such as aluminum nitrate, sodium nitrate, and ammonium nitrate can be used by being added to the nitric acid aqueous solution of nitric acid concentration 5 to 15 g/L at a concentration from 0.01 g/L to saturation. In the acid aqueous solution mainly containing nitric acid, metal contained in aluminum alloy, e.g., iron, copper, manganese, nickel, titanium, magnesium, silicon and the like, may be dissolved.

For the acid aqueous solution mainly containing nitric acid, preferably, one obtained by adding aluminum nitrate and ammonium nitrate into the nitric acid aqueous solution of nitric acid concentration 5 to 15 g/L is used such that nitric acid, ammonium salt and nitric acid salt are contained, aluminum ions are set to 1 to 15 g/L, preferably 1 to 10 g/L, and ammonium ions are set to 10 to 300 ppm. The aluminum ions and the ammonium ions are naturally increased during the electrochemical graining. In this case, preferably, a solution temperature is 10 to 95° C., more preferably 20 to 90° C., and particularly preferably 40 to 80° C.

In the case of using acid aqueous solution mainly containing hydrochloric acid, since the hydrochloric acid has a strong aluminum dissolving power, micro asperities can be formed on the surface by adding only slight electrolysis. For such micro asperities, an average opening diameter is 0.01 to 0.2 μm, and these are formed uniformly on a full surface of the aluminum plate. To obtain such grains, the total of the quantity of electricity used for the anode reaction of the aluminum plate is preferably 1 to 100 C/dm$^2$, more preferably 20 to 70 C/dm$^2$, when electrolytic reaction is finished. A current density in this case is preferably 20 to 50 A/dm$^2$.

In the electrochemical graining using electrolyte mainly containing hydrochloric acid, by increasing the total of the quantity of electricity for anode reaction up to 400 to 1000 C/dm$^2$, crater-like large undulations can be simultaneously formed. In this case, micro asperities having an average opening diameter of 0.01 to 0.4 μm are formed on a full surface by being superposed on crater-like undulations having an average opening diameter of 10 to 30 μm.

In the case of multiple electrolytic graining treatments are carried out in the electrolyte containing nitric acid or hydrochloric acid, between the electrolytic graining treatments, the aluminum plate is preferably subjected to cathode electrolysis. By this cathode electrolysis, smut is generated on the surface of the aluminum plate, and hydrogen gas is generated, thus making the electrolytic graining more uniform. This cathode electrolysis is carried out preferably with the quantity of cathode electricity preferably set to 3 to 80 C/dm$^2$, more preferably 5 to 30 C/dm$^2$, in acid solution. If the quantity of cathode electricity is less than 3 C/dm$^2$, the quantity of adhered smut may become short. If it exceeds 80 C/dm$^2$, the quantity of adhered smut may become excessive. Neither cases are preferable. The electrolyte may be similar to, or different from the solution used in the foregoing electrolytic graining treatments.

In the electrochemical graining, a well-known electrolytic system of a vertical, flat or radial type can be used. Particularly, the radial electrolytic system described in JP 5-195300 A is preferable.

Figure 3:
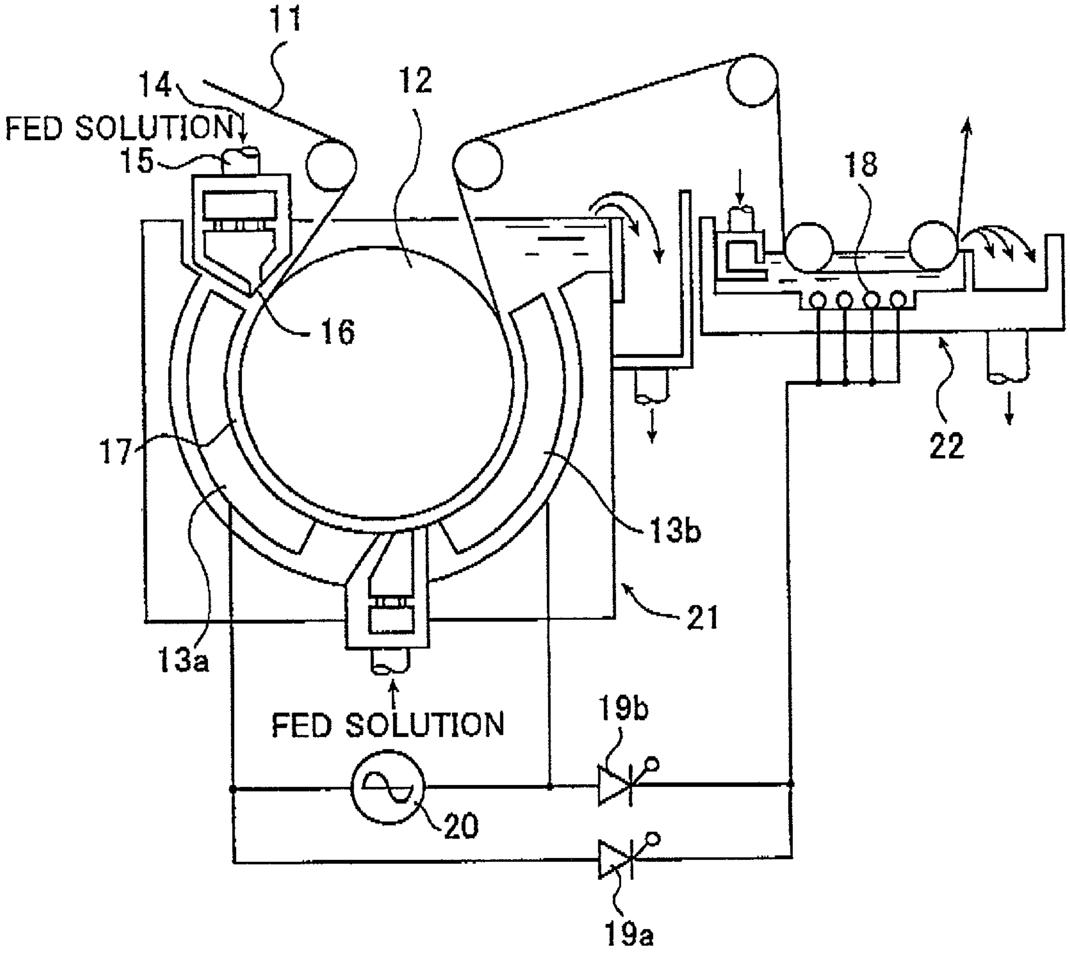
FIG. 3 is a side view showing an example of a radial cell in electrochemical graining suitably used for the present invention.
Figure 4:
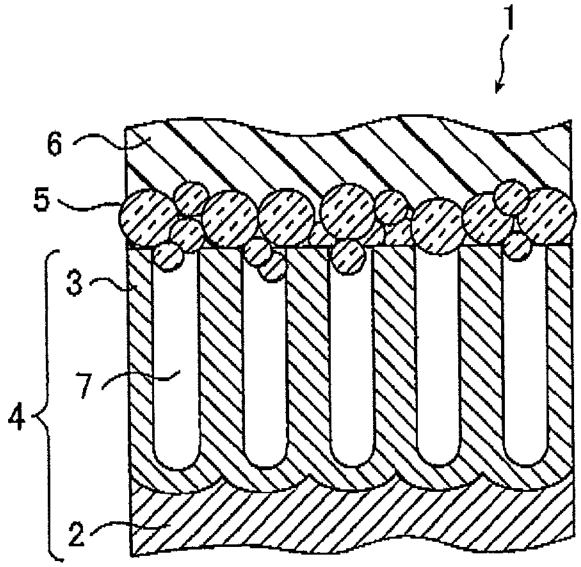
FIG. 4 is a schematic sectional view showing a presensitized plate obtained according to a second aspect of the present invention.

FIG. 3 is a schematic view of the radial electrolytic system suitably used for the present invention. In FIG. 3, in the radial electrolytic system, an aluminum plate 11 is wound on a radial drum roller 12 disposed in a main electrolytic cell 21, and electrolysis is carried out by main poles 13*a* and 13*b* connected to an alternative power supply 20 in the process of carrying. Acid aqueous solution 14 is fed from a solution feeding port 15 through a slit 16 to a solution passage 17 between the radial drum roller 12 and the main poles 13*a* and 13*b*.

Then, the aluminum plate 11 treated in a main electrolytic cell 21 is subjected to electrolysis in an auxiliary anode cell 22. This auxiliary anode cell 22 includes an auxiliary anode 18 disposed oppositely to the aluminum plate 11, and the acid aqueous solution 14 is fed to flow between the auxiliary anode 18 and the aluminum plate 11. A current supplied to the auxiliary electrode is controlled by thyristors 19*a* and 19*b*.

The main poles 13*a* and 13*b* can be selected from, carbon, platinum, titanium, niobium, zirconium, stainless, an electrode used for a fuel cell cathode or the like, and especially carbon is preferable. As carbon, commercially available impermeable graphite for a chemical device, resin-impregnated graphite or the like can be used.

The auxiliary anode 18 can be selected from well-known oxygen generating electrodes, such ferrite, iridium oxide, platinum or one obtained by cladding or plating platinum on valve metal such as titanium, niobium, or zirconium.

The feeding direction of the acid aqueous solution passed in the main electrolytic cell 21 and the auxiliary anode cell 22 may be parallel to, or counter to the advancing direction of the aluminum plate 11. A relative flow velocity of the acid aqueous solution to the aluminum plate is preferably 10 to 1000 cm/sec.

One or more alternating current power supplys can be connected to one electrolytic system. Two or more electrolytic systems may be used, and electrolytic conditions may be similar or varied from system to system.

After the end of electrolysis, preferably, liquid removal by a nip roller, and water washing by a spray are carried out in order to prevent carrying of the treatment liquid to a next step.

In the case of using the foregoing electrolytic system, to maintain the concentration of the acid aqueous solution constant, preferably, the following method is used. For example, when components of the acid aqueous solution include nitric acid and aluminum ion, for some sample solutions that have known nitric acid and aluminum ion concentration, a propagation velocity of an ultrasonic wave and a conductivity of the acid aqueous solution, as physical quantity data, are measured at varied temperature beforehand. Each of physical quantity data and nitric acid and aluminum ion concentration are compared. Depending on the result, demanded quantity of nitric acid and aluminum ion are added, or water is added to dilute. Thus, the concentration of the acid aqueous solution is controlled.

By this electrochemical graining, crater-shaped or honeycomb-shaped pits having an average diameter of about 0.5 to 20 μm can be formed by an area rate of 30 to 100% on the surface of the aluminum plate. The pits that have been formed improve scum resistance in non-image areas and press life of the printing plate. In the electrochemical graining, the quantity of electricity necessary for forming sufficient pits on the surface, i.e., a product of a current and time of feeding a current becomes an important condition. The capability of forming sufficient pits by a smaller quantity of electricity is preferable from a viewpoint of energy saving. Regarding surface roughness after the electrochemical graining, preferably, arithmetic mean roughness ($R_a$) measured by a cutoff value of 0.8 mm, and an evaluation length of 3.0 mm in accordance with JIS B0601-1994 is set to 0.2 to 0.7 μm.

Next, description is made of surface treatments including chemical etching in acid aqueous solution or alkali aqueous solution, desmutting, and the like in due order. The surface treatments are carried out before or after the electrochemical graining, and before later-described anodizing. However, the description of each surface treatment below is exemplification, and not limited to a content of each treatment. The following treatments including the foregoing surface treatments are optionally carried out.

<Alkali Etching>

Alkali etching is a treatment of chemically etching the surface of the aluminum plate in alkali aqueous solution, and preferably carried out before and after the chemical graining. If the mechanical graining is carried out before the electrochemical graining, preferably, the alkali etching is carried out after the mechanical graining. The alkali etching is more advantageous than later-described acid etching, because it can destroy a micro-structure within a short time.

For alkali etching solution used in the alkali etching, aqueous solution containing one or more selected from sodium hydroxide, sodium carbonate, sodium aluminate, sodium metasilicater sodium phosphate, potassium hydroxide, lithium hydroxide. Especially, aqueous solution mainly containing sodium hydroxide (caustic soda) is preferable. The alkali aqueous solution may contain 0.5 to 10 wt % of not only aluminum but also an alloy component contained in the aluminum plate.

Concentration of the alkali aqueous solution is preferably 1 to 50 wt %, more preferably 1 to 30 wt %.

The alkali etching is preferably carried out at a liquid temperature of the alkali aqueous solution of 20 to 100° C., preferably 40 to 80° C., for 1 to 120 sec., preferably 2 to 60 sec. The dissolving quantity of aluminum is preferably 5 to 20 $g/m^2$ if it is carried out after the mechanical graining, and is preferably 0.01 to 20 $g/m^2$ if it is carried out after the electrochemical graining. If chemical etching solution is mixed in the alkali aqueous solution first, preferably the treatment solution is adjusted by using liquid sodium hydroxide (caustic soda) and sodium aluminate (aluminate soda).

After the end of the alkali etching, in order to prevent carrying of the treatment liquid to a next step, liquid removal by the nip roller and water washing by the spray are preferably carried out.

If the alkali etching is carried out after the electrochemical graining, smut generated by the electrochemical graining can be removed. As such alkali etching, for example, a method of bringing into contact with nitric acid of 15 to 65 wt % at a temperature of 50 to 90° C. described in JP 53-12739 A, and a method of alkali etching described in JP 48-28123 B can be suitably used.

<Acid Etching>

The acid etching is a treatment for chemically etching the aluminum plate in acid aqueous solution, and preferably carried out after the electrochemical graining. If the alkali etching is carried out before and/or after the electrochemical graining, preferably, the acid etching is carried out after the alkali etching.

By carrying out the acid etching after the alkali etching is executed on the aluminum plate, an intermetallic compound containing silica or elemental Si on the surface of the aluminum plate can be removed, and defects of an anodized layer formed in subsequent anodizing can be prevented. Therefore, it is possible to prevent a trouble of dotted ink adhered to non-image areas called chip-like scum during printing.

For the acid aqueous solution used in the acid etching, aqueous solution containing phosphoric acid, nitric acid, sulfuric acid, chromic acid, hydrochloric acid, or mixed acid of two or more of these can be enumerated. Especially, sulfuric acid aqueous solution is preferable. Concentration of the acid aqueous solution is preferably 50 to 500 g/L, more preferably, 100 to 500 g/L. The acid aqueous solution may contain not only aluminum but also an alloy component contained in the aluminum plate.

The acid etching is preferably carried out at a liquid temperature of the solution of 30 to 90° C., preferably 70 to 80° C., for 1 to 10 sec. The dissolving quantity of aluminum plate in this case is preferably 0.001 to 0.2 $g/m^2$. Acid concentration, for example, sulfuric acid concentration and aluminum ion concentration are preferably selected from a range causing no crystallization at a normal temperature. Preferable aluminum ion concentration is 0.1 to 50 g/L, more preferably 0.1 to 15 g/L, particularly preferably 5 to 15 g/L.

After the end of the acid etching, in order to prevent carrying of the treatment liquid to a next step, liquid removal by the nip roller and water washing by the spray are preferably carried out.

<Desmutting>

If the alkali etching is carried out before and/or after the electrochemical graining, smut is generally generated on the surface of the aluminum plate by the alkali etching. Thus, preferably, so-called desmutting is carried out after the alkali etching, which dissolves the smut in acid solution containing phosphoric acid, nitric acid, sulfuric acid, chromic acid, hydrochloric acid, hydrofluoric acid, fluoroboric acid, or mixed acid of two kinds or more of these. After the alkali etching, it is enough to carry out either one of the acid etching or the desmutting.

Concentration of the acid solution is preferably 1 to 500 g/L, more preferably 1 to 300 g/L. In the acid solution, not only aluminum but also an alloy component contained in the aluminum plate may be dissolved by 0.001 to 50 g/L, more preferably 0.001 to 15 g/L.

A liquid temperature of the acid solution is preferably 20 to 95° C., more preferably 30 to 70° C. Treatment time is preferably 1 to 120 sec., more preferably 2 to 60 sec.

For the desmutting treatment liquid (acid solution), use of waste liquid of the acid aqueous solution used in the foregoing electrochemical graining is preferable for reducing the quantity of waste liquid.

After the end of the desmuitting, in order to prevent carrying of the treatment liquid to a next step, liquid removal by the nip roller and water washing by the spray are preferably carried out.

As a combination of the surface treatments, a preferable mode is as follows.

First, the mechanical graining and/or alkali etching is carried out, and then the desmutting is carried out. Then, the electrochemical graining using electrolyte is carried out, and subsequently one or both of the followings are carried out: (1) alkali etching, and subsequent desmutting, and (2) the electrochemical graining using electrolyte containing hydrochroric acid, and subsequent alkali etching and desmutting.

<Anodizing>

Anodizing treatment is performed on an aluminum plate that is treated as described above according to need. With regard to the anodizing treatment, methods that have been conventionally used in this field can be used. Specifically, when direct current or alternative current is fed to the aluminum plates in aqueous solution or non aqueous solution, alone or in combination, of sulfuric acid, phosphoric acid, chromic acid, oxalic acid, sulfamic acid, benzenesulfonic acid and the like, an anodized layer can be formed on the surface of the aluminum plate.

Since conditions for anodizing treatment change variously depending on the electrolyte being used, those are not decided unconditionally, but it is generally appropriate that concentration of electrolyte is 1 to 80 wt %, temperature of solution is 5 to 70° C., preferably 25 to 55° C., current density is 0.5 to 70 $A/dm^2$, preferably 15 to 60 $A/dm^2$, voltage is 1 to 200 V, and time for electrolysis is 1 to 1000 sec., preferably 5 to 60 sec.

Among these anodizing treatment methods, the method in which anodizing is carried out in sulfuric acid electrolyte with high current density, described in GB 1,412,768 B, and the method in which anodizing is carried out with phosphoric acid as electrolytic bath, described in U.S. Pat. No. 3,511,661, are preferable. In addition, multistage anodizing treatment, in which anodizing is carried out in sulfuric acid, and then anodizing is carried out in phosphoric acid, can be performed.

In the prevent invention, the quantity of the anodized layer is preferably 1.0 $g/m^2$ or more for damage resistance and press life, more preferably 1.5 $g/m^2$ or more, further preferable 2.0 $g/m^2$ or more, particularly preferably 3.0 $g/m^2$ or more. Considering that much energy is needed to form a thick layer, preferably it is 100 $g/m^2$ or less, more preferably 40 $g/m^2$ or less, more preferably 20 $g/m^2$ or less, further preferably 15 $g/m^2$ or less, further preferably 10 $g/m^2$ or less.

On the surface of the anodized layer, very small concave portions called micropores are uniformly formed. A density of the micropores present on the anodized layer can be adjusted by properly selecting treatment conditions.

In the present invention, preferably, a porosity of the anodized layer is 20 to 70%, more preferably 30 to 60%, particularly preferably 40 to 50%. If a porosity of the anodized layer is 20% or higher, heat diffusion to the aluminum support is sufficiently suppressed, providing a sufficient effect of achieving high sensitivity. If a porosity of the anodized layer is 70% or lower, generation of scum on non-image areas becomes more difficult.

A porosity of the anodized layer is calculated by the following formula.

Porosity (%)=[1-(anodized layer density/3.98)]×100

Here, the anodized layer density ($g/cm^2$) is obtained by [anodized layer weight per unit area/anodized layer thickness]. 3.98 means alumina density ($g/cm^2$) according to Kagaku Binran (Chemical Manual).

A surface pore diameter is preferably 0 to 15 nm, more preferably 0 to 12 nm, most preferably 0 to 10 nm.

By carrying out pore widening, sealing or the like described below for the anodized layer when necessary, a porosity of the anodized layer and a surface pore diameter can be set in the foregoing ranges at the end.

<Pore Widening>

In the present invention, for the purpose of reducing a thermal conductivity and adjusting the porosity of the anodized layer in a suitable range, pore widening is preferably carried out to increase a pore diameter of micropores after the anodizing. This pore widening is a treatment for dissolving the anodized layer and increasing a pore diameter of micropores by dipping an aluminum plate having an anodized layer formed in acid or alkali aqueous solution. In the pore widening, the dissolving quantity of the anodized layer is preferably 0.01 to 20 $g/m^2$, more preferably 0.1 to 5 $g/m^2$, and particularly preferably 0.2 to 4 $g/m^2$.

In the case of using the acid solution in the pore widening, preferably, solution containing inorganic acid such as sulfuric acid, phosphoric acid, nitric acid or hydrochloric acid, or a mixture of these is used. Concentration of the acid solution is preferably 10 to 1000 g/L, more preferably 10 to 500 g/L, further preferably 20 to 500 g/L, and yet further preferably 20 to 100 g/L. A temperature of the acid solution is preferably 10 to 90° C., more preferably 30 to 70° C., furthee preferably 40 to 70° C. Dipping time in the acid solution is preferably 1 to 300 sec., more preferably 2 to 100 sec., and further preferably 10 to 60 sec.

On the other hand, in the case of using the alkali aqueous solution in the pore widening, solution containing at least one selected from a group consisting of sodium hydroxide, potassium hydroxide, and lithium hydroxide is preferably used. Preferably, pH of the alkali aqueous solution is 10 to 13, more preferably 11 to 13, further preferably 11.5 to 13.0, and yet further preferably 11.5 to 12.5. A temperature of the alkali aqueous solution is preferably 10 to 90° C., more preferably 30 to 50° C. Dipping time in the alkali aqueous solution is preferably 1 to 500 sec., more preferably 2 to 100 sec.

<Sealing>

In the present invention, sealing may be carried out for the aluminum support having the anodized layer formed as described above.

For example, a sealing film is formed from a bottom of pores in the case of electrodeposition sealing, and from an upper part of the pores in the case of steam sealing. Thus, formation of a sealing film varies depending on the method of sealing.

Sealing suitably used in the present invention is a treatment for not sealing the inside of micropores, but only sealing upper part of the micropores.

As sealing used in the present invention, sealing treatments of the anodized layer by pressurized steam or hot water, described in JP 4-176690 A, and Japanese Patent Application No. 10-106819 (JP 11-301135 A) can be enumerated. Also, sealing can be carried out by using well-known methods including treatment with silicate, treatment with bichromate aqueous solution, treatment with nitrite, treatment with ammonium acetate, electrodeposition sealing, treatment with triethanolamine, treatment with barium carbonate, treatment with hot water containing a very small amount of phosphate, and the like.

For example, a method of forming an inorganic film by sputtering, CVD method or the like can be enumerated. As compounds used for the inorganic film, for example oxide, nitride, silicide, and carbide may be used. The compound is not limited to one, but a mixture thereof may be used.

Specifically, examples are alumina, silicon oxide, titanium oxide, zirconium oxide, hafnium oxide, vanadium oxide, niobium oxide, tantalum oxide, molybdenum oxide, tungsten oxide, chromium oxide; aluminum nitride, silicon nitride, titanium nitride, zirconium nitride, hafnium nitride, vanadium nitride, niobium nitride, tantalum nitride, molybdenum nitride, tungsten nitride, chromium nitride, silicon nitride, boron nitride; titanium silicide, zirconium silicide, hafnium silicide, vanadium silicide, niobium silicide, tantalum silicide, molybdenum silicide, tungsten silicide, chromium silicide; titanium boride, zirconium boride, hafnium boride, vanadium boride, niobium boride, tantalum boride, molybdenum boride, tungsten boride, chromium boride; aluminum carbide, silicon carbide, titanium carbide, zirconium carbide, hafnium carbide, vanadium carbide, niobium carbide, tantalum carbide, molybdenum carbide, tungsten carbide, and chromium carbide.

Among others, sealing suitably used in the present invention is a sealing treatment with fine particles described in Japanese Patent Application No. 2001-9871.

In the sealing treatment with fine particles, a particle layer containing particles having an average particle size of 8 to 800 nm, preferably 10 to 500 nm, more preferably 10 to 150 nm, is formed. A possibility of incursion of particles into micropores on the anodized layer is small, and thus an effect of achieving a high sensitivity is provided. If an average particle size of particles is 800 nm or less, adhesion with a thermosensitive layer becomes sufficient, improving press life. A thickness of the particle layer is preferably 8 to 800 nm, more preferably 10 to 500 nm.

For the particles used in the present invention, a thermal conductivity is preferably 60 W/(m·K) or less, more preferably 40 W/(m·K) or less, particularly preferably 0.3 to 10 W/(m·K) or less. If a thermal conductivity is 60 W/(m·K) or less, suppression of heat diffusion to the aluminum support becomes sufficient, thereby providing a sufficient effect of achieving a high sensitivity.

No limitations are placed on methods of forming particle layers. However, a preferable example is a method, in which the aluminum support is subjected to electrolysis with direct current or alternating current by using electrolyte containing hydrophilic particles having an average particle size of 8 to 800 nm. For a waveform of the alternative current used in the electrolysis, a sine wave, a rectangular wave, a triangular wave, a trapezoidal wave may be enumerated. From a viewpoint of costs for manufacturing a power supply device, a frequency of the alternative current is preferably 30 to 200 Hz, more preferably 40 to 120 Hz. If the trapezoidal wave is used for the alternating current, time tp from a current 0 to a peak is preferably set to 0.1 to 2 msec., more preferably 0.3 to 1.5 msec. If the time tp is less than 0.1 msec., impedance of a power supply circuit may be affected, necessitating a large power supply voltage at the rising time of a current waveform. Thus, power supply device costs may be increased.

For hydrophilic particles, $Al_2O_3$, $TiO_2$, $SiO_2$, or $ZrO_2$ are preferably used singly, or a combination of two or more of these may be used. Electrolyte is obtained by slurrying the hydrophilic particles in water or the like such that content is 0.01 to 20 wt % of a total. The electrolyte can be adjusted in pH by, for example adding sulfuric acid or the like, in order to obtain plus or minus charges. The electrolysis is carried out, for example, by using a direct current and the electrolyte, with the aluminum support as a cathode, at a voltage of 10 to 200 V for 1 to 600 sec.

According to this method, it is possible to easily seal the openings of the micropores present on the anodized layer while leaving voids inside.

As the methods of forming particle layers, a method of dipping the aluminum support in liquid containing hydrophilic particles having an average particle size of 8 to 800 nm, and a method of coating liquid containing hydrophilic particles having an average particle size of 8 to 800 nm to the aluminum support are particularly preferably enumerated. According to these methods, it is possible to easily seal the openings of the micropores present on the anodized layer while leaving voids inside.

Also, according to the above-described methods, compared with the method of using electrolysis, scum resistance of an obtained lithographic printing plate is higher. The particle layer obtained by the electrolysis is somewhat non-uniform and, in some micropores present on the anodized layer, incomplete sealing of openings are recognized. On the other hand, the particle layer obtained by dipping or coating is extremely uniform, and the micropores present on the anodized layer are uniformly sealed. Thus, if the dipping or the coating is used as the method of forming a particle layer, a presensitized plate having scum resistance higher than that in the case of using the electrolysis is provided.

For hydrophilic particles, preferably, colloidal silica, alumina sol, $Al_2O_3$, $TiO_2$, $SiO_2$ or $ZrO_2$ is singly used, or a combination of two or more of these is used. The liquid used in the dipping or the coating preferably has a content of the hydrophilic particles set to 0.01 wt % or more of a total, more preferably 0.05 wt % or more, and 10 wt % or less, more preferably 5 wt % or less.

A liquid temperature of the liquid used in the dipping is preferably 10° C. or higher, more preferably 30° C. or higher, and preferably 100° C. or less, more preferably 80° C. or less. Time for the dipping is preferably 1 sec. or more, more preferably 2 sec. or more, and preferably 120 sec. or less, more preferably 30 sec. or less.

As methods of coating, examples are bar coater coating, rotating coating, spray coating, curtain coating, dipping coating, air knife coating, blade coating, and roll coating. Among them, the rotating coating, and the bar coater coating are preferable.

Other than the foregoing sealing methods, spray treatment, deposition treatment, sputtering, ion plating, thermal spraying, gilding and the like can be enumerated. But no particular limitations are placed in this regard.

As specific treatment methods, methods of forming layers by coating, for example a layer made of a compound having at least one amino group, and at least one selected from the group consisting of a carboxy group, its salt group, a sulfo group and its salt group, described in JP 60-149491 A, a layer made of a compound having at least one amino group, and at least one hydroxy group and its salt, described in JP 60-232998 A, a layer containing phosphate, described in JP 62-19494 A, a layer made of a polymer compound containing at least one of monomer units having sulfo group as a repeated unit in a molecule, and the like.

Another example may be a method of forming a layer of a compound selected from carboxy-methyl cellulose; dextrin; gum Arabic; phosphonic acid having an amino group such as 2-aminoethyl phosphonic acid; organic phosphonic acid such as phenyl phosphonic acid, naphtyl phosphonic acid, alkyl phosphonic acid, glycero phosphonic acid, methylenediphosphonic acid, or ethylenediphosphonic acid, which may have a substituent; organic phosphoric acid ester such as phenyl phosphoric acid, naphtyl phosphoric acid, alkyl phosphoric acid, or glycero phosphoric acid, which may have a substituent; organic phosphinic acid such as phenyl phosphinic acid, naphtyl phosphinic acid, alkyl phosphinic acid, or glycero phosphinic acid, which may have a substituent; amino acid such as glycine or β-alanine; and amine hydrochloride having a hydroxy group such as triethanolamine hydrochloride.

In sealing, silane coupling agents having unsaturated groups may be coated. Silane coupling agents may include, for example, N-3-(acryloxy-2-hydroxy propyl)-3-amino propyl tri-ethoxy silane, (3-acryloxy propyl) di-methyl methoxy silane, (3-acryloxy propyl) methyl di-methoxy silane, (3-acryloxy propyl) tri-methoxy silane, 3-(N-allyl amino) propyl tri-methoxy silane, allyl di-methoxy silane, allyl tri-ethoxy silane, allyl tri-methoxy silane, 3-butenyl tri-ethoxy silane, 2-(chloromethyl) allyl tri-methoxy silane, methacryl amide propyl tri-ethoxy silane, N-(3-methacryloxy-2-hydroxy propyl)-3-amino propyl tri-ethoxy silane, (methacryloxy methyl) di-methyl ethoxy silane, methacryloxy methyl tri-ethoxy silane, methyacryloxy methyl trimethoxy silane, methacryloxy propyl di-metehyl ethoxy silane, methacryloxy propyl di-methyl methoxy silane, methacryloxy propyl methyl di-ethoxy silane, methacryloxy propyl methyl di-methoxy silane, methacryloxy propyl methyl tri-ethoxy silane, methacryloxy propyl methyl trimethoxy silane, methacryloxy propyl tris (emthoxy ethoxy) silane, methoxy di-methyl vinyl silane, 1-methoxy-3-(trimethylsiloxy) butadiene, stylylethyl tri-methoxy silane, 3-(N-stylylmethyl-2-amino ethyl amino)-propyl tri-methoxy silane hydrochloride, vinyl di-methyl ethoxy silane, vinyl di-phenyl ethoxy silane, vinyl methyl di-ethoxy silane, vinyl methyl di-methoxy silane, O-(vinyloxy ethyl)-N-(tri-ethoxy silyl propyl) urethane, vinyl tri-ethoxy silane, vinyl trimethoxy silane, vinyl tri-t-butoxy silane, vinyl tri-isopropoxy silane, vinyl tri-phenoxy silane, vinyl tris (2-methoxy ethoxy) silane, di-allyl amino propyl methoxy silane. Among them, silane coupling agents having metacryloyl group or acryloyl group whose unsaturated group has high reactivity is preferable.

Other methods include sol gel coating described in JP 5-50779 A, phosphonic acids coating descried in JP 5-246171 A, methods of coating backcoating materials described in JP 6-234284 A, JP 6-191173 A, and JP 6-230563 A, treatment with phosphonic acids described in JP 6-262872 A, coating described in JP 6-297875 A, a method of anodizing described in JP 10-109480 A, methods of dipping described in Japanese Patent Application No. 10-252078 (JP 2000-81704 A), and Japanese Patent Application No. 10-253411 (JP 2000-89466 A), and the like. Any one of these methods can be used.

<Treatment in Aqueous Solution Containing Inorganic Fluorine Compound and Silicate Compound>

In the present invention, preferable sealing can be performed in aqueous solution containing an inorganic fluorine compound and a silicate compound. Accordingly, it is possible to obtain a support for a lithographic printing plate, which is high in press life when processed into a lithographic printing plate.

As the inorganic fluorine compound used in the present invention, metal fluoride is preferable.

Specific examples include sodium fluoride, potassium fluoride, calcium fluoride, magnesium fluoride, sodium hexafluorozirconium, potassium hexafluorozirconium, sodium hexafluorotitanate, potassium hexafluorotitanate, hexafluorozirconium hydroacid, hexafluorotitanium hydroacid, ammonium hexafluorozirconium, ammonium hexafluorotitanate, hexafluorosilicic acid, nickel fluoride, iron fluoride, fluorophosphoric acid, ammonium fluorophosphate.

For the silicate compound used in the present invention, silicic acid and silicate can be enumerated. Among them, alkali metal silicate is preferable.

Specific examples include sodium silicate, potassium silicate, and lithium silicate. Among them, sodium silicate and potassium silicate are preferable.

For the sodium silicate, for example, 3rd sodium silicate, 2nd sodium silicate, 1st sodium silicate, sodium orsosilicate, sodium sesquisilicate, and sodium methasilicate can be enumerated. For the potassium silicate, for example, 1st potassium silicate can be enumerated. Also, aluminosilicate containing aluminum, and borosilicate containing boric acid can be used.

For the silicic acid, orthosilicate, methasilicate, metha-2-silicate, metha-3-silicate, and metha-4-silicate can be enumerated.

With regard to concentration of each compound in the aqueous solution, in the case of the inorganic fluorine compound, for the purpose of sealing the anodized layer, it is preferably 0.01 wt % or higher, more preferably 0.05 wt % or higher, particularly preferably 0.1 wt % or higher, and for scum resistance, preferably 10 wt % or lower, more preferably 1 wt % or lower, particularly preferably 0.5 wt % or lower.

For the silicate compound, for scum resistance, concentration thereof is preferably 0.01 wt % or higher, more preferably 0.1 wt % or higher, particularly preferably 1 wt % or higher, and for press life, preferably 10 wt % or lower, more preferably 7 wt % or lower, particularly preferably 5 wt % or lower.

No particular limitations are placed on a ratio of compounds in the aqueous solution. However, a ratio between the inorganic fluorine compound and the silicate compound by weight is preferably 5:95 to 95:5, more preferably 20:80 to 80:20.

In order to increase pH, the aqueous solution containing the inorganic fluorine compound and the silicate compound may contain a proper quantity of hydroxide such as sodium hydroxide, potassium hydroxide, or lithium hydroxide and the like. Among them, the sodium hydroxide and the potassium hydroxide are preferable.

In addition, the aqueous solution containing the inorganic fluorine compound and the silicate compound may contain alkaline earth metal salt or the group 4 (IVA) metallic salt. As the alkaline earth metal salt, for example, water-soluble salt such as nitrate such as calcium nitrate, strontium nitrate, magnesium nitrate, or barium nitrate; sulfate; chloride; phosphate; acetate; oxalate; borate is enumarated. As the group 4 (IVA) metal salt, for example, titanium tetrachloride, titanium trichloride, titanium potassium fluoride, titanium potassium oxalate, titanium sulfate, titanium tetraiodide, zirconium chloride oxide, zirconium dioxide, zirconium oxychloride, zirconium tetrachloride are enumarated. Alkaline earth metal salt and the group 4 (IVA) metal salt described above are used alone or in combination of 2 or more.

A temperature of the aqueous solution is preferably 10° C. or higher, more preferably 20° C. or higher, and preferably 100° C. or lower, and more preferably 80° C. or lower.

Preferably, pH of the aqueous solution is 8 or higher, more preferably 10 or higher, and preferably 13 or lower, more preferably 12 or lower.

No particular limitations are placed on the methods of treatment in the aqueous solution containing the inorganic fluorine compound and the silicate compound. For example, a dipping method and a spraying method can be enumerated. These may be used alone one or a plurality of times, or in combination of 2 kinds or more.

Among them, the dipping method is preferable. In the case of using the dipping method, treatment time is preferably 1 sec. or more, more preferably 3 sec. or more, and preferably 600 sec. or less, more preferably 120 sec. or less.

<Surface Hydrophilic Treatment>

In the present invention, surface hydrophilic treatment may be performed on the aluminum support by dipping the aluminum support in aqueous solution containing one or more kind of hydrophilic compounds. As the hydrophilic compounds, examples include polyvinyl phosphonic acid, potassium zirconium fluoride, phosphate/inorganic fluorine compound, a compound containing a sulfonic acid group, a saccharide compound, and a silicate compound. Among them, the polyvinyl phosphonic acid and the silicate compound are preferable. The silicate compound is most preferable.

The compound having the sulfonic acid group contains aromatic sulfonic acid, its formaldehyde condensate, derivatives thereof, and salts thereof.

As the aromatic sulfonic acid, examples include phenol sulfonic acid, catechol sulfonic acid, resorcinol sulfonic acid, benzen sulfonic acid, toluene sulfonic acid, lignin sulfonic acid, naphthalene sulfonic acid, acenaphthene-5-sulfonic acid, phenanthrene-2-sulfonic acid, benzaldehyde-2 (or 3)-sulfonic acid, benzaldehyde-2,4 (or 3,5)-di-sulfonic acid, oxybenzyl sulfonic acids, sulfo benzoic acid, sulfanilic acid, naphthionic acid, and taurin. Among them, the benzene sulfonic acid, the naphthalene sulfonic acid, and lignin sulfonic acid are preferable. Formaldehyde condensates of the benzene sulfonic acid, the naphthalene sulfonic acid or the lignin sulfonic acid are preferable.

Further, these may be used as sulfonates. For example, sodium salt, potassium salt, lithium salt, calcium salt, and magnesium salt may be enumerated. Among them, the sodium salt and potassium salt are preferable.

Preferably, pH of the aqueous solution containing the compound having the sulfonic acid group is 4 to 6.5, and can be adjusted in the foregoing pH range by using sulfuric acid, sodium hydroxide, ammonia or the like.

The saccharide compound includes monosaccharides and its sugar alcohols, oligosaccharides, polysaccharides, and glycosides.

As the monosaccharide and its sugar alcohol, examples include triose such as glycerol and its sugar alcohol; tetrose such as threose or erythritol, and its sugar alcohol; pentose such as arabinose or arabitol, and its sugar alcohol; hexose such as glucose or sorbitol, and its sugar alcohol; heptose such as D-glycero-D-galactoheptose, or D-glycero-D-galactohepthitol, and its sugar alcohol; octose such as D-erythro-D-galactooctytol, and its sugar alcohol; nonose such as D-erythro-L-glyco-nonurose, and its sugar alcohol.

For the oligosaccharide, for example, disaccharide such as saccharose, trehalose, lactose and trisaccharide such as raffinose can be enumerated.

For the polysaccharide, for example, amylose, arabinan, cyclodextrin, cellulose alginate can be enumerated.

In the present invention, "glycoside" means a compound having a sugar part and a non-sugar part connected through ether coupling or the like.

The glycoside can be classified based on non-sugar parts. Examples include alkyl glycoside, phenol glycoside, coumarin glycoside, oxycoumarin glycoside, flavonoid glycoside, anthraquinone glycoside, triterpene glycoside, steroid glycoside, and mustard oil glycoside.

As the sugar parts, the foregoing monosaccharide, and its sugar alcohol; oligosaccharide; and polysaccharide can be enumerated. Among them, the monosaccharide and the oligosaccharide are preferable, and the monosaccharide, and the disaccharide are more preferable.

As an example of a preferable glycoside, compounds represented by the following formula (I) can be enumerated.

(I)

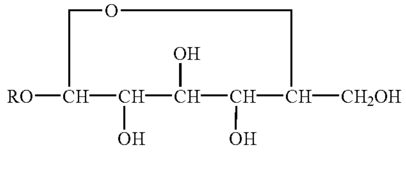

In the chemical formula (I), R represents alkyl group, alkenyl group or alkynyl group of the number of carbon atoms 1 to 20, being a straight chain or having a branched chain.

As the alkyl group of the number of carbon atoms 1 to 20, examples include methyl, ethyl, propyl, butyl, pentyl, hexyl, heptyl, octyl, nonyl, decyl, undecyl, dodecyl, tridecyl, tetradecyl, pentadecyl, hexadecyl, heptacecyl, octadecyl, nonadecyl and eicocyl groups, which may be a straight chain or have a branched chain, or be cyclic alkyl groups.

As the alkenyl group of the number of carbon atoms 1 to 20, examples include allyl and 2-butenyl groups, which may be a straight chain or have a branched chain, or be cyclic alkenyl groups.

As the alkynyl group of the number of carbon atoms 1 to 20, examples include 1-pentynel group, which may be a straight chain or have a branched chain, or be cyclic alkynyl groups.

Specific compounds represent in the foregoing formula (I) are, for example, methyl glucoside, ethyl glucoside, propyl glucoside, isopropyl glucoside, butyl glucoside, isobutyl glucoside, n-hexyl glucoside, octyl glucoside, capryl glucoside, decyl glucoside, 2-ethyl hexyl glucoside, 2-pentyl nonyl glucoside, 2-hexyl decyl glucoside, lauryl glucoside, myristyl glucoside, stearyl glucoside, cyclohexyl glucoside, and 2-butynyl glucoside. These compounds are glucosides as one kind of glycoside, in which hemiacetalhydroxy group of glucose connects other compounds in ether shape. For example, the compounds can be obtained by a well-known method of reacting glucose with alcohol. Parts of these alkyl glucosides are commercially available as brand name GLUCOPON from Henkel Inc., of Germany, which can be used in the present invention.

Other examples of preferable glycosides include saponin, rutin trihydrate, hesperidin methyl chalcone, hesperidin, narijin hydrate, phenol-β-D-glucopyranoside, salicin, 3', 5, 7-methoxy-7-rutinoside.

Preferably, pH of the aqueous solution containing the saccharide compound is 8 to 11, and can be adjusted in the foregoing pH range by using potassium hydroxide, sulfuric acid, carbonic acid, sodium carbonate, phosphoric acid, sodium phosphate or the like.

Concentration of the aqueous solution of the polyvinylphosphonic acid is preferably 0.01 to 10 wt %, more preferably 0.1 to 5 wt %, further preferably 0.2 to 2.5%. A dipping temperature is preferably 10 to 70° C., more preferably 30 to 60° C. Dipping time is preferably 0.5 sec. to 10 min., preferably 1 to 30 sec., further preferably 1 to 20 sec.

Concentration of the aqueous solution of the compound having the sulfonic acid group is preferably 0.02 to 0.2 wt %. A dipping temperature is preferably 60 to 100° C. Dipping time is preferably 1 sec. to 300 sec., more preferably 10 to 100 sec.

Further, concentration of the aqueous solution of the saccharide compound is preferably 0.5 to 10 wt %. A dipping temperature is preferably 40 to 70° C. Dipping time is preferably 2 to 300 sec., more preferably 5 to 30 sec.

As the hydrophilic treatment in the present invention, other than the foregoing, a well-known method and conditions can be adopted. As the well-known method and conditions, examples include a method of treatment with alkali metal silicate described in U.S. Pat. No. 2,714,066, and U.S. Pat. No. 3,181,461, a method of treatment with potassium zirconium fluoride described in JP 36-22063 B, a method of treatment with polyvinyl phosphonic acid described in U.S. Pat. No. 4,153, 461, a method of treatment in aqueous solution containing phosphate and inorganic fluorine compound, described in JP 9-244227 A, and a method of treatment in aqueous solution containing titanium and fluorine, described in JP 2000-81704 A and JP 2000-89466 A.

Treatment with the aqueous solution of alkali metal silicate is carried out by dipping the support in the aqueous solution of alkali metal silicate having concentration of preferably 0.01 to 30 wt %, more preferably 0.01 to 10 wt %, further preferably 0.1 to 10 w %, yet further preferably 0.5 to 5 wt %, in which pH at 25° C. is preferably 10 to 13, at a preferable dipping temperature of 30 to 100° C., more preferably 50 to 90° C., preferably for 0.5 to 40 sec., more preferably 1 to 20 sec. Treatment conditions such as the above-described concentration of the alkali metal silicate, pH, the temperature, the treatment time and the like can be selected as occasion demands. If pH of the aqueous solution of the alkali metal silicate is less than 10, the solution is easily formed into gel. If pH is higher than 13, the particle layer and the anodized layer may be possibly dissolved. Thus, these points must be born in mind.

As the alkali metal silicate used in the surface hydrophilic treatment, for example, the foregoing alkali silicates used in the aqueous solution containing the inorganic fluorine compound and the silicate compound can be enumerated.

In order to increase pH, the aqueous solution of the alkali metal silicate may contain hydroxides such as sodium hydroxide, potassium hydroxide, or lithium hydroxide by a proper quantity. Among them, the sodium hydroxide, and the potassium hydroxide are preferable.

Further, the aqueous solution of alkali metal silicate may contain alkaline earth metal salt or the group 4 (IVA) metal salt. As the alkaline earth metal salt, for example, the alkaline earth metal salts described above to be contained in the aqueous solution containing the inorganic fluorine compound and the silicate compound can be enumerated. Alkaline earth metal salt and the group 4 (IVA) metal salt described above may be used alone or in combination of 2 or more. The quantity of these metal salt used is preferably 0.01 to 10 wt %, more preferably 0.05 to 5.0 wt %.

The treatment in the aqueous solution of the potassium zirconium fluoride is carried out by dipping the support in the solution of potassium zirconium fluoride at preferable concentration of 0.1 to 10 wt %, more preferably 0.5 to 2 wt %, at a preferable temperature of 30 to 80° C., and preferably for 60 to 180 sec.

As the inorganic fluorine compound used in the surface hydrophilic treatment, metal fluoride is preferable.

Specifically, for example, the foregoing inorganic fluorine compounds used in the aqueous solution containing the inorganic fluorine compound and the silicate compound can be enumerated.

The support is dipped in the aqueous solution containing such hydrophilic compounds, then washed by water or the like and dried.

The surface hydrophilic treatment solves the problem of print scum such as deterioration of scum resistance after being left (ink removing characteristic) caused in return for the increased sensitivity (increased press life thereof in the case of the negative working type recording layer) by the pore widening after the anodizing treatment. That is, because of the expanded pore diameter, during printing, especially the printing machine stops during printing and at the time of restarting of printing after the lithographic printing plate is left on the printing machine, ink removal becomes difficult. This phenomenon (deterioration of scum resistance after being left (ink removing characteristic)) easily occurs. However, the problem is reduced by performing the surface hydrophilic treatment.

<Undercoat Layer>

In the present invention, on the aluminum support thus obtained in the foregoing manner, before a recording layer recordable by infrared laser exposure, when necessary, for example an inorganic undercoat layer containing water soluble metallic salt such as zinc borate or an organic undercoat layer, may be provided.

As the organic compounds used for the organic undercoat layer, examples include carboxymethyl cellulose; dextrin; gum Arabic; polymer or copolymer having a sulfonic acid group at a side chain; polyacrylic acid; phosphonic acid having an amino group such as 2-aminoethyl phosphonic acid; organic phosphonic acid such as phenyl phosphonic acid, naphtyl phosphonic acid, alkyl phosphonic acid, glycero phosphonic acid, methylene diphosphonic acid, or ethylene diphosphonic acid, which may have a substituent; organic phosphoric acid such as phenyl phosphoric acid, naphtyl phosphoric acid, alkyl phosphoric acid, or glycero phorphoric acid, which may have a substituent; organic phosphinic acid such as phenyl phosphinic acid, naphtyl phosphinic acid, alkyl phosphinic acid, or glycero phosphinic acid, which may have a substituent; amino acid such as glycine or β-alanine; and amine hydrochloride having a hydroxy group such as triethanol amine hydrochloride; and yellow dye. These may be used alone, or in combination of 2 kinds or more.

The organic undercoat layer can be formed by the following methods. That is, those are a method of forming an organic undercoat layer by coating liquid obtained by dissolving the organic compound in water or organic solvent such as methanol, ethanol or methylethyl ketone, or mixed solvent thereof on the aluminum support, and drying it, and a method of forming an organic undercoat layer by dipping the aluminum support in solution obtained by dissolving the organic compound in water or organic solvent such as methanol, ethanol or methylethyl ketone, or mixed solvent thereof to adsorb the organic compound, and then washing it by water or the like and drying it.

In the former method, preferably, concentration of the solution containing the dissolved organic compound is 0.005 to 10 wt %. The coating method has no particular limitation, and any selected from bar coater coating, rotating coating, spray coating, and curtain coating and the like can be used. In the latter method, preferably, concentration of the solution containing the dissolved organic compound is 0.01 to 20 wt %, more preferably 0.05 to 5 wt %. A dipping temperature is preferably 20 to 90° C., more preferably 25 to 50° C. Dipping time is preferably 0.1 sec. to 20 min., more preferably 2 sec. to 1 min. The solution used in these methods may be adjusted for pH by an bacic material such as ammonia, triethyl amine or potassium hydroxide, and an acid material such as hydrochloric acid or phosphoric acid, and can be used in a pH range of 1 to 12.

The coating quantity of organic undercoat layer after dried is preferably 2 to 200 mg/$m^2$, more preferably 5 to 100 gm/$m^2$: In the above-described ranges, press life is improved more.

Moreover, an intermediate layer of a polymer compound containing acid group and onium group, described in JP 11-109637 A, can be used as undercoat layer.

<Backcoat Layer>

On the support thus obtained in the foregoing manner, when processed into a presensitized plate, in order to prevent scratching of the recording layer if superposed, a covering layer (also referred to as "backcoat layer", hereinafter) made of an organic polymer compound may be provided on a backside (surface of a side having no recording layer formed) when necessary.

Preferably, a main component of the backcoat layer is a resin of at least one selected from a group consisting of saturated copolymer polyester resin, a phenoxy resin, a polyvinyl acetal resin, and a vinylidene chloride copolymer resin, having a glass transition point of 20° C. or higher.

The saturated copolymer polyester resin includes a dicarboxylic acid unit, and a diol unit. As the dicarboxylic acid unit, examples include aromatic dicarboxylic acid such as phthalic acid, terephthalic acid, isophthalic acid, tetrabromophthalic acid, or tetrachlorophthalic acid; saturated aliphatic dicarboxylic acid such as adipic acid, azelaic acid, succinic acid, oxalic acid, suberic acid, sebatic acid, malonic acid, or 1, 4-cyclohexane dicarboxylic acid.

The backcoat layer can contain dye or pigment for coloring, silane coupling agent for improving adhesion with the support, diazo resin containing diazonium salt, organic phosphonic acid, organic phosphoric acid, cationic polymer, wax conventionally used as smoothing agent, higher fatty acid, higher fatty acid amide, a silicone compound made of dimethyl siloxane, modified dimethyl siloxane, polyethylene powder, and the like as occasion arises.

A thickness of the backcoat layer is basically set to a level for making it difficult for the recording layer to be scratched, described later, even if an interleaving sheet is not used, preferably 0.01 to 8 μm. If a thickness is less than 0.01 μm, it is difficult to prevent rubbing scratching of the recording layer when the presensitized plate is treated by being superposed. If a thickness exceeds 8 μm, during printing, the backcoat layer is swelled by chemicals used around the lithographic printing plate, causing fluctuation in thickness. A printing pressure is thus changed to deteriorate a printing characteristic.

As the method of providing the backcoat layer on the backside of the support, various methods can be used. Examples include a method of dissolving a component for the backcoat layer in proper solvent to prepare solution, coating it, or dispersing to prepare emulsified liquid, coating it, and drying it; a method of bonding the backcoat layer formed in a film shape beforehand to the support by adhesive, heat or the like; and a method of forming a fused film by a fusion extruder, and bonding the film to the support. To secure a suitable thickness, the method of dissolving the component for the backcoat layer in proper solvent to prepare solution, coating the solution and drying it is most preferable. In this method, organic solvent described in JP 62-251739 A can be used alone, or in combination, as the solvent.

In production of the presensitized plate, any of the backcoat layer on the backside and the recording layer on the surface may be provided first, or both may be provided simultaneously.

<Recording Layer>

The presensitized plate of the present invention is thus obtained by providing a recording layer recordable by infrared laser exposure on the aluminum plate obtained in the foregoing manner.

A thermosensitive layer used in the present invention has no particular limitation placed as long as it is a recording layer recordable by infrared laser exposure (recording layer capable of forming an image by infrared laser exposure). Examples include a thermosensitive layer containing fine particle polymer having a thermo-reactive functional group, or microcapsules containing a compound having a thermo-reactive functional group, and a thermosensitive layer containing infrared absorbent and a polymer compound insoluble in water but soluble in alkali aqueous solution, having solubility in alkali developer changed by infrared laser exposure, and recordable by irradiation with infrared laser.

In the presensitized plate of the present invention, preferably, the recording layer is a thermosensitive layer containing (a) fine particle polymer having a thermo-reactive functional group, or (b) microcapsules containing a compound having a thermo-reactive functional group. By using this thermosensitive layer, the presensitized plate of an on-machine development type can be provided.

Hereinafter, the presensitized plate of the present invention is described by way of example of using the thermosensitive layer containing fine particle polymer having a thermo-reactive functional group, or microcapsules containing a compound having a thermo-reactive functional group.

As the thermo-reactive functional groups common to the foregoing (a) and (b), examples include an ethylenically unsaturated group (e.g., acryloyl group, methacryloyl group, vinyl group, and allyl group) for polymerization reaction, an isocyanate group or blocked thereof for addition reaction, a functional group (e.g., amino group, hydroxy group, and carboxy group) having active hydrogen atoms as its reaction opponent, similarly an epoxy group for addition reaction, an amino group, a carboxy group or a hydroxy group as its reaction opponent, a carboxy group and a hydroxy group or an amino group for condensation reaction, and acid anhydride and an amino group or a hydroxy group for ring opening reaction. The thermo-reactive functional group used in the present invention is not limited to such, and any functional groups for reaction can be used if a chemical bond is formed.

As the thermo-reactive functional group suitable for the (a) fine particle polymer, examples include an acryloyl group, a methacryloyl group, a vinyl group, an allyl group, an epoxy group, an amino group, a hydroxy group, a carboxy group, an isocyanate group, acetic anhydride group, and a group blocked thereof. The thermo-reactive function group may be introduced to polymer particles during polymer polymerization, or by using polymer reaction after the polymerization.

In the case of introducing the thermo-reactive functional group during polymer polymerization, emulsifying polymerization or suspending polymerization is preferably carried out by using monomer having a thermo-reactive functional group.

Specific monomer examples having thermo-reactive functional groups include allyl methacrylate, allyl acrylate, vinyl methacrylate, vinyl acrylate, glycidyl methacrylate, glycidyl acrylate, 2-isocyanate ethyl methacrylate, blocked isocyanate thereof by alcohol or the like, 2-isocyanate ethyl acrylate, blocked isocyanate thereof by alcohol or the like, 2-amino ethyl methacrylate, 2-amino ethyl acryalte, 2-hydroxy ethyl methacrylate, 2-hydroxy ethyl acrylate, acrylic acid, methacrylic acid, maleic anhydride, bifunctional acrylate, and bifunctional methacrylate. However, the monomers having the thermo-reactive functional groups used in the present invention are not limited to those.

As monomer having no thermo-reactive functional groups, to be copolymerized with the above-described monomers, examples include stylene, alkyl acrylate, alkyl methacrylate, acrylonitrile, and vinyl acetate. However, monomers having no thermo-reactive functional groups used in the present invention are not limited to those.

As polymer reaction used when the thermo-reactive functional group is introduced after the polymer polymerization, for example, polymer reaction described in WO 96/34316 can be enumerated.

Among the foregoing (a) fine particle polymers, one in which fine particle polymers are combined each other by heat is preferable, and one in which a surface is hydrophilic, and polymer can be dispersed in water is more preferable. In addition, preferably, a contact angle (water droplet in air) of a film formed by coating only fine particle polymer and drying it at a temperature lower than a coagulation temperature is set lower than that of a film formed by drying it at a temperature higher than the coagulation temperature.

To make the surface of the fine particle polymer hydrophilic, hydrophilic polymer such as polyvinyl alcohol or polyethylene glycol, or oligomer, or a hydrophilic low molecular compound may be adsorbed on the surface of the fine particle polymer. However, no limitations are placed in this regard.

A coagulation temperature of the (a) fine particle polymer is preferably 70° C. or higher, but 100° C. or higher is more preferable from a viewpoint of stability with time.

An average particle size of the (a) fine particle polymer is preferably 0.01 to 20 μm, more preferably 0.05 to 2.0 μm, and further preferably 0.1 to 1.0 μm. In this range, high resolution and high stability with time are obtained.

The adding quantity of the (a) fine particle polymer is preferably 50 wt % or more of a solid content of the thermosensitive layer, more preferably 60 wt % or more.

As the thermo-reactive functional group suitable for the (b) microcapsule, examples include a polymerizable unsaturated group, a hydroxy group, a carboxy group, a carboxylate group, an acid anhydride group, an amino group, an epoxy group, an isocyanate group, and a blocked isocyanate.

As the compound having the polymerizable unsaturated group, an ethylenically unsaturated bond, for example, a compound having at least 1, preferably 2 or more selected from an acryloyl group, a methacryloyl group, a vinyl group, and allyl group is used. A group of such compounds are well-known in this industrial field and, in the present invention, these can be used without any particular limitations. These as chemical modes include monomer, prepolymer, that is, dimer, trimer or oligomer, a mixture thereof, and copolymer thereof.

Specific examples include unsaturated carboxylic acid (e.g., acrylic acid, methacrylic acid, itaconic acid, crotonic acid, isocrotonic acid, and maleic acid), its ester, and unsaturated carboxylic acid amide. Especially, ester between unsaturated carboxylic acid and aliphatic polyhydric alcohol, and amide between unsaturated carboxylic acid and aliphatic polyamine are preferable.

In addition, an additional reactant between unsaturated carboxylic acid ester or unsaturated carboxylic acid amide having a nucleophilic substituent such as hydroxy group, an amino group or a mercapto group, and monofunctional or multifunctional isocyanate or epoxyde, and a dehydrated condensation reactant with monofunctional or multifunctional carboxylic acid, and the like are suitably used.

Other preferable examples include an additional reactant between unsaturated carboxylic acid ester or amide having an electrophilic substituent such as an isocyanate group or an epoxy group, and monofunctional or multifunctional alcohol, amine or thiol, and a substituent reactant between unsaturated carboxylic acid ester or amide having a leaving substituent such as halogen group or tosyloxy group, and monofunctional or multifunctional alcohol, amine or thiol.

Yet another example is a compound, in which unsaturated phosphonic acid or chloromethyl styrene is substituted for the foregoing unsaturated carboxylic acid.

Among polymerizable compounds as ester between the unsaturated carboxylic acid and the aliphatic polyhydricalcohol, as acrylic ester, examples include ethylene glycoldiacrylate, triethylene glycoldiacrylate, 1,3-butanediol diacrylate, tetramethyleneglycol diacrylate, propyleneglycol diacrylate, neopenthylglycol diacrylate, trimethylolpropane diacrylate, trimethylolpropane triacrylater trimethylolpropane tris(acryloyloxypropyl) ether, trimethyloletane triacrylate, hexandiol diacrylate, 1,4-cyclohexanediol diacrylate, tetraethyleneglycol diacrylate, penthaerythritol diacrylate, penthaerythritol triacrylate, penthaerythritol tetraacrylate, dipenhthaerythritol diacrylate, dipenthaerythritol penthacryalte, dipenthaerythritol hexacrylate, sorbitol triacrylate, sorbitol tetracrylate, sorbitol penthacrylate, sorbitol hexacrylate, tris(acryloyloxyethyl) isocyanulate, polyester acrylate oligomer.

As methacrylic ester, examples include tetramethyleneglycol dimethacrylate, triethyleneglycol di methacrylate, neopenthylglycol dimethacrylate, trimethylolpropane trimethacrylate, trimethyloletane trimethacrylate, ethyleneglycol dimethacrylate, 1,3-butanediol dimethacrylate, hexanediol dimethacrylate, penthaerythritol dimethacrylate, penthaerythritol trimethacrylate, penthaerythritol tetramethacrylate, dipenhthaerythritol dimethacrylate, dipenthaerythritol hexamethacrylate, sorbitol trimethacrylate, sorbitol tetramethacrylate, bis[p-(3-methycryloyloxy-2-hydroxypropoxy)phenyl] dimethylmethane, bis-[p-(methacryloyloxyethoxy)phenyl] dimethylmethane.

As the itaconic ester, examples include ethyleneglycol diitaconate, propyleneglycol diitaconate, 1,3-butanediol diitaconate, 1,4-butanediol diitaconate, tetramethyleneglycol diitaconate, penthaerythritol diitaconate, sorbitol tetraitaconate.

As the crotonic ester, examples include ethyleneglycol dicrotonate, tetramethyleneglycol dicrotonate, penthaerythritol dicrotonate, and sorbitol tetracrotonate.

As the isocrotonic ester, examples include ethyleneglycol diisocrotonate, penthaerythritol diisocrotonate, and sorbitol tetraisocrotonate.

As the maleic ester, examples include ethyleneglycol dimaleate, triethyleneglycol dimaleate, penthaerythritol dimaleate, and sorbitol tetramaleate.

Other esters are, for example, aliphatic alcohol ester described in JP 46-27926 B, JP 51-47334 B, and JP 57-196231 B, ester having aromatic structure described in JP 59-5240 A, JP 59-5241 A and JP 2-226149 A, and ester containing an amino group described in JP 1-165613 A.

As monomers of amide between the aliphatic polyamine compound and the unsaturated carboxylic acid, specific examples include methylene bisacrylamide, methylene bismethacrylamide, 1,6-hexamethylene bis-acrylamide, 1,6-hexamethylene bismethacrylamide, diethylenetriamine trisacrylamide, xylylene bis-acrylamide, and xylylene bismethacrylamide.

As other preferable amide monomers, for example, monomer having a cyclohexylene structure, described in JP 54-21726 B, can be enumerated.

A urethane addition polymerizable compound made by using addition reaction between isocyanate and hydroxy groups is also preferable. A specific example is a urethane compound containing 2 or more polymerizable unsaturated groups in 1 molecule, which is obtained by adding unsaturated monomer having a hydroxy group represented by the following formula (II) to a polyisocyanate compound containing 2 or more isocyanate groups in 1 molecule, described in JP 48-41708 B, $$CH_2{=}C(R^1)COOCH_2CH(R^2)OH \quad (II)$$

(Note that $R^1$ and $R^2$ repreesent H or $CH_3$, respectively).

Other preferable examples are urethane acrylate described in JP 51-37193 A, JP 2-32293 B, and JP 2-16765 B, and a urethane compound having an ethylene oxide structure, described in JP 58-49860 B, JP 56-17654 B, JP 62-39417 B, and JP 62-39418 B.

Further, a radical polymerizable compound having an amino structure or a sulfide structure in a molecule is preferable, which is described in JP 63-277653 A, JP 63-260909 A, and JP 1-105238 A.

Other preferable examples include polyester acrylate, described in JP 48-64183 A, JP 49-43191 B, and JP 52-30490 B, and multifunctional acrylate or methacrylate such as epoxy acrylate obtained by reacting an epoxy resin with (metha)acrylic acid. Particular unsaturated compounds described in JP 46-43946 B, JP 1-40337 B, and JP 1-40336 B, and a vinyl phosphonic acid compound described in JP 2-25493 A, or the like are also preferable. In some cases, a compound containing a perfluoroalkyl group, described in JP 61-22048 A, is preferably used. Further, photo-curing monomer and oligomer introduced in p. 300 to 308 of Journal of the Adhesion Society of Japan Vol. 20-7 (1984), are also preferable.

As the preferable epoxy compound, examples include glycerin polyglycidyl ether, polyethylene glycol diglycidyl ether, polypropylene diglycidyl ether, trimethyrol propane polyglycidyl ether, sorbitol polyglycidyl ether, and polyglycidyl ether of bisphenol or polyphenol or hydrogen additive thereof.

As the preferable isocyanate compound, examples include tolylenediisocyanate, diphenyl methane diisocyanate, polymethylene polyphenyl polyisocyanate, xylenediisocyanate, naphthalene diisocyanate, cyclohexan phenylenediisocyanate, isophorone diisocyanate, hexamethylene diisocyanate, cyclohexyl diisocyanate, and a compound obtained from these by blocking by alcohol or amine.

As the preferable amine compound, examples include ethylenediamine, diethylenetriamine, triethylenetetramine, hexamethylenediamine, propylenediamine, and polyethylenediamine.

As the preferable compound having the hydroxyl group, examples include a compound having an end methylol group, polyhydric alcohol such as pentaerythritol or the like, and bisphenol/polyphenol.

As the preferable compound having the carboxyl group, examples include aromatic multiple carboxylic acid such as pyromellitic acid, trimellitic acid, or phthalic acid, and aliphatic multiple carboxylic acid such as adipic acid.

As the preferable acid anhydride, examples include pyromellitic anhydride, benzophenon tetracarboxylic anhydride.

As the preferable copolymer of the ethylenically unsaturated compound, for example, copolymer of allylmethacrylate can be enumerated. Specific examples include allylmethacrylate/methacrylic acid copolymer, allylmethacrylate/ethylmethacryulate copolymer, and allylmethacrylate/butylmethacrylate copolymer.

As the method of forming microcapsules, well-known methods can be used. Examples include a method of using core salvation described in U.S. Pat. No. 2,800,457, and U.S. Pat. No. 2,800,458, a method by interfacial polymerization described in GB 990,443 B, U.S. Pat. No. 3,287,154, JP 38-19574 B, JP 42-446 B, and JP 42-711 B, a method by polymer precipitation described in U.S. Pat. No. 3,418,250, and U.S. Pat. No. 3,660,304, a method of using an isocyanate polyol wall material described in U.S. Pat. No. 3,796,669, a method of using an isocyanate wall material described in U.S. Pat. No. 4,001,140, a method of using urea-formaldehyde or urea-formaldehyde-resorcinol wall forming material described in U.S. Pat. No. 4,001,140, U.S. Pat. No. 4,087,376, and U.S. Pat. No. 4,089,802, a method of using a wall material such as melamine-formaldehyde resin or hydroxycellulose described in U.S. Pat. No. 4,025,445, an in situ method by monomer polymerization described in JP 36-9163 B, and JP 51-9079 B, a spray drying method described in GB 930,422 B, and U.S. Pat. No. 3,111,407, and an electrolytic dispersion cooling method described in GB 952,807 B, and GB 967,074 B. However, the present invention is not limited to such methods.

A microcapsule wall suitably used for the (b) microcapsule has a three-dimensional crosslinking, and a swelling characteristic by solvent. From this viewpoint, preferably, the wall material of the microcapsule is polyurea, polyurethane, polyester, polycarbonate, polyamide, or a mixture thereof. Especially, the polyurea and the polyurahane are preferable. In addition, a compound having a thermo-reactive functional group may be introduced to the microcapsule wall.

An average particle size of the (b) microcapsule is preferably 0.01 to 20 μm, more preferably 0.05 to 2.0 μm, particularly preferably 0.10 to 1.0 μm. In these ranges, good resolution and stability with time are obtained.

In the (b) microcapsule, capsules may be combined each other by heat, or not combined. It is only necessary that contained articles in the microcapsule, the article blotted to the capsule surface or out of the microcapsule during coating, or the article having entered the microcapsule wall can chemically react by heat. It may react with an added hydrophilic resin or an added low molecular compound. In addition, 2 or more kinds of microcapsule may be provided with different functional groups to react with each other by heat, thereby causing the capsules to react with each other.

Thus, fusion bonding of the microcapsules to each other by heat is preferable for image formation, but it is not essential.

The quantity of the (b) microcapsule added to the thermosensitive layer is preferably 10 to 60 wt % in solid content, more preferably 15 to 40 wt %. In these ranges, a high on-machine development characteristic is obtained as well as high sensitivity and press life.

In the case of adding the (b) microcapsule to the thermosensitive layer, the solvent dissolving the contained article and causing swelling of the wall material can be added into a microcapsule dispersed medium. By such solvent, the diffusion of the contained compound having a thermo-reactive functional group to the outside of the microcapsule can be promoted.

Depends on a microcapsule dispersed medium, a material of a microcapsule wall, a wall thickness, and a contained article, such solvent can be easily selected from many commercially available solvents. For example, in the case of a water dispersable microcapsule made of a crosslinking polyurea or polyurethane wall, alcohol, ether, acetal, ester, ketone, polyhydric alcohol, amide, amine, fatty acid or the like is preferable.

Specific examples include methanol, ethanol, tertiary butanol, n-propanol, tetrahydrofuran, methyl lactate, ethyl lactate, methyl ethyl ketone, propyleneglycol monomethyl ether, ethyleneglycol diethyl ether, ethyleneglycol monoethyl ether, γ-butyrolactone, N,N-dimethyl formamide, and N,N-dimethyl acetoamide. However, the present invention is not limited to such. Also, 2 or more of these may be used in combination.

Solvent which is not dissolved in the microcapsule dispersant liquid but dissolved if mixed with the foregoing solvents can be used. The quantity of added solvent is decided by a combination of materials. Normally, it is preferably 5 to 95 wt %, more preferably 10 to 90 wt %, particularly preferably 15 to 85 wt %.

In the case of using a thermosensitive layer containing the (a) fine particle polymer having a thermo-reactive functional group, or the (b) microcapsule containing a compound having a thermo-reactive functional group as a recording layer, a compound for starting or promoting reaction of these when necessary. As the compound starting or promoting reaction, for example, a compound generating radical or cation by heat can be enumerated. Specific examples include lophinedimer, a trihalomethyl compound, peroxide, an azo compound, an onium salt such as diazonium salt, or diphenyliodonium salt, acyl phosphine, and imide sulfonate.

These compounds are preferably added in range of 1 to 20 wt % of a thermosensitive layer solid content, more preferably in a range of 3 to 10 wt %. In these ranges, without losing an on-machine development characteristic, a good effect of starting or promoting reaction can be obtained.

A hydrophilic resin may be added to the thermosensitive layer. The addition of the hydrophilic resin improves not only an on-machine development characteristic but also layer strength of the thermosensitive layer itself.

As the hydrophilic resin, resins having hydrophilic groups, such as hydroxyl, carboxyl, hydroxy ethyl, hydroxyl propyl, amino, amino ethyl, amino propyl, and carboxy methyl, are preferable.

Specific examples of the hydrophilic resins include gum Arabic, casein, gelatine, starch derivative, carboxy methyl cellulose and its sodium salt, cellulose acetate, sodium alginate, vinyl acetate-maleic acid copolymer, stylene-maleic acid copolymer, polyacrylic acid and its salt, polymethacrylic acid and its salt, homopolymer and copolymer of hydroxyl ethyl methacrylate, homopolymer and copolymer of hydroxylethyl acrylate, homopolymer and copolymer of hydroxy propyl methaclylate, homopolymer and copolymer of hydroxyl propyl acrylate, homopolymer and copolymer of hydroxybutyl methacrylate, homopolymer and copolymer of hydroxybutyl acrylate, polyethylene glycol, hydroxyl propylene polymer, polyvinyl alcohol, hydrolyzed polyvinyl acetate, polyvinyl formal, polyvinyl butylal and polyvinyl pyrrolidon having a degree of hydrolysis set to at least 60 wt %, preferably at least 80 wt %, homopolymer and copolymer of acrylamide, homopolymer and polymer of methacryl amide, and homopolymer and copolymer of N-methyrol acrylamide.

The quantity of the hydrophilic resin added to the thermosensitive layer is preferably 5 to 40 wt % of a solid content of the thermosensitive layer, more preferably 10 to 30 wt %. In these ranges, good on-machine development characteristic and layer strength can be obtained.

In order to increase a sensitivity, photothermal conversion agent for generating heat by absorbing infrared rays can be contained in the thermosensitive layer. For the photothermal conversion agent, a light absorptive material having an absorption zone in at least a part of 700 to 1200 nm is used, and various pigments, dyes and metal fine particles can be used.

As types of the pigments, examples are black pigment, brown pigment, red pigment, purple pigment, blue pigment, green pigment, fluorescent pigment, metal powder pigment, polymer bonded pigment and the like. Specific examples include insoluble azo pigment, azolake pigments condensed azo pigment, chelate azo pigment, phthalocyanine pigment, anthraquinone pigment, perylene and perynon pigments, thioindigo pigment, quinacrydon pigment, dioxazine pigment, isoindolynon pigment, quinophthalon pigment, dye attached lake pigment, azine pigments nitroso pigment, nitro pigment, natural pigment, inorganic pigment, and carbon black.

In the present invention, commercially available pigments, and infrared ray absorptive pigments described in Color Index (C.I) Manual, "Latest Figment Manual" (Japan Pigment Technology Association, 1977), "Latest Pigment Applied Technology" (CMC publisher, 1986), and "Printing Ink Technology" (CMC publisher, 1984) can be used.

For the pigment, execution of surface treatment thereof is selective. As a method of surface treatment, examples include a method of coating a hydrophilic resin or an lipophilic resin on the surface, a method of adhering surfactant, and a method of bonding a reactive material (e.g., silica sol, alumina sol, silane coupling agent, an epoxy compound, and isocyanate compound) to the pigment surface. These surface treatment methods are described in "Metal Soap Property and Application" (Saiwai Shobo), "Printing Ink Technology" (CMC publisher, 1984), and "Latest Pigment Application Technology" (CMC publisher, 1986). Among these pigments, an infrared ray absorptive pigment is preferable, because it can be suitably used for a laser emitting infrared rays. As the infrared ray absorptive pigment, carbon black is preferable.

A particle size of the pigment is preferably in a range of 0.01 to 1 μm, more preferably 0.01 to 0.5 μm.

Regarding dyes, commercially available dyes, and well-known dyes described in documents (e.g., "Dye Manual" (Organic Synhetic Chemical Association, 1970), "Near-infrared Ray Absorptive Pigment" in page 45 to 51 of "Chemical Industry" March, 1986, and "Development and Market Trend in 90's Functional Pigment" 2 chapter 2–3 (CMC publisher, 1990)) or patents can be used.

Specific preferable examples include azo dye, metal complex azo dye, pyrazolone azo dye, anthraquinone dye, phthalocyanine dye, carbonium dye, quinonimine dye, polymethine dye, cyanine dye and the like.

Further examples include cyanine dyes described in JP 58-125246 A, JP 59-84356 A, JP 60-78787 A and the like, methine dyes described in JP 58-173696 A, JP 58-181690 A, JP 58-194595 A and the like, naphthoquinone dyes described in JP 58-112793 A, JP 58-224793 A, JP 59-48187 A, JP 59-73996 A, JP 60-52940 A, JP 60-63744 A and the like, squarilium dyes described in JP 58-112792 A and the like, a cyanine dye described in GB 434,875 B, a dye described in U.S. Pat. No. 4,756,993, a cyanine dye described in U.S. Pat. No. 4,973,572, a dye described in JP 10-268512 A, and phthalocyanine compound described in JP 11-235883 A.

Other suitably used dyes include near infrared ray absorptive sensitizer described in U.S. Pat. No. 5,156,938, substituted arylbenzo(thio)pyrilium salt described in U.S. Pat. No. 3,881,924, trimethynthia pyrilium salt described in JP 57-142645 A, pyrilium compounds described in JP 58-181051 A, JP 58-220143 A, JP 59-41363 A, JP 59-84248 A, JP 59-84249 A, JP 59-146063 A, and JP 59-146061, a cyanine dye described in JP 59-216146 A, penthamethynthio pyrilium salt or the like described in U.S. Pat. No. 4,283,475, pyrilium compounds described in JP 5-13514 B, and JP 5-19702 A, Epolite III-178, Epolite III-130, and Epolite III-125 manufactured by Epolin Inc.

Among these, water soluble dyes are preferable. Specific examples are described below.

(IR-1)

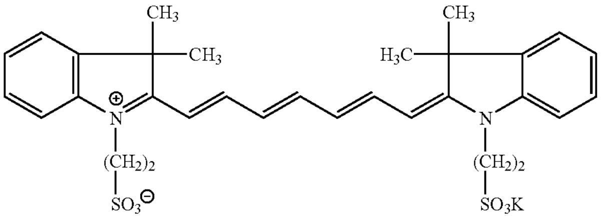

(IR-2)

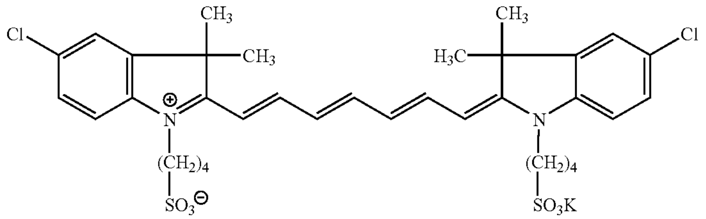

(IR-3)

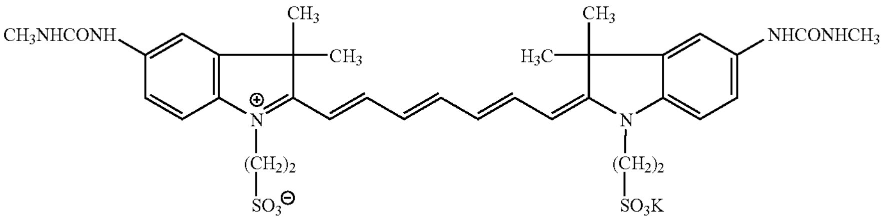

-continued
(IR-4)
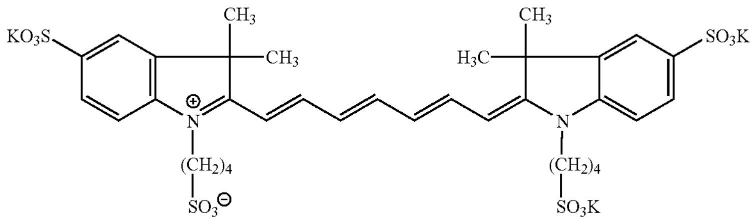
(IR-5)
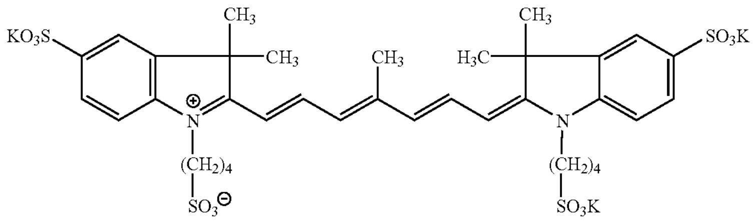
(IR-6)
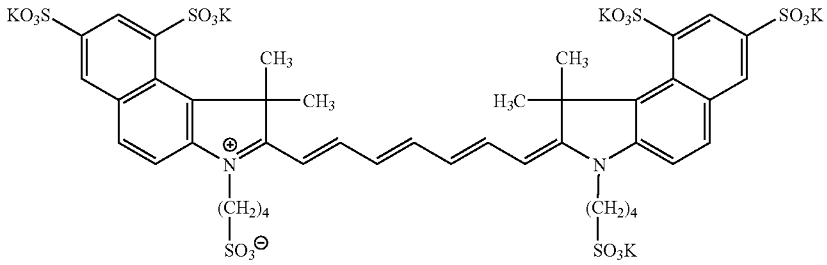
(IR-7)
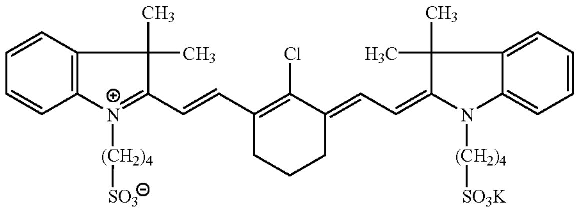
(IR-8)
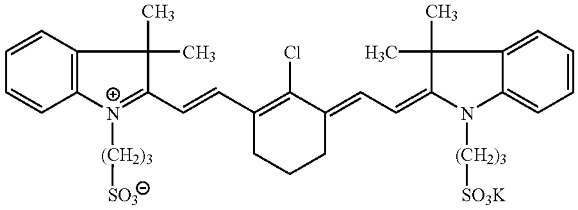
(IR-9)
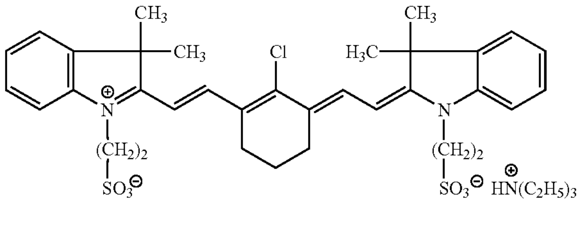

-continued
(IR-10)
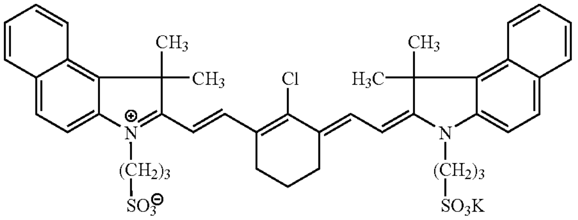
(IR-11)
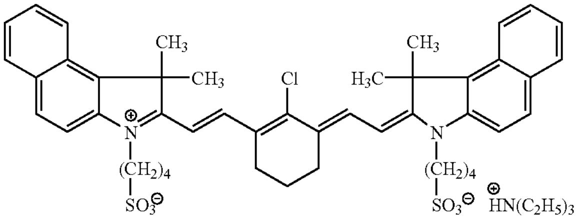
As the photothermal conversion agent used with the compound having the lipophilic thermo-reactive functional group of the microcapsule of the thermosensitive layer, the foregoing infrared ray absorptive dyes can be used, but use of lipophilic dyes is preferable. A specific example is a cyanine dye described below.
(IR-21)
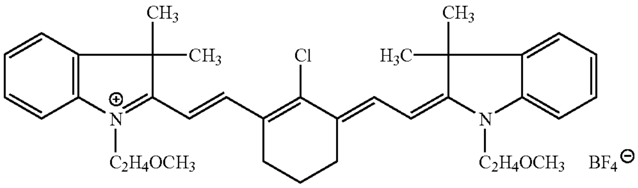
(IR-22)
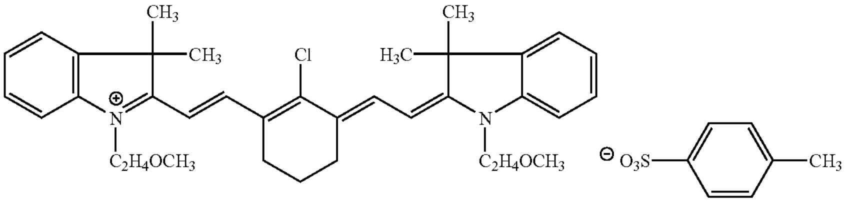
(IR-23)
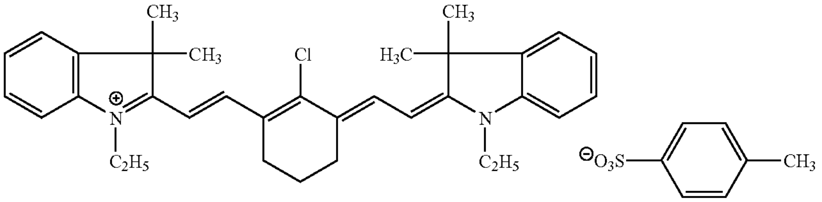
(IR-24)
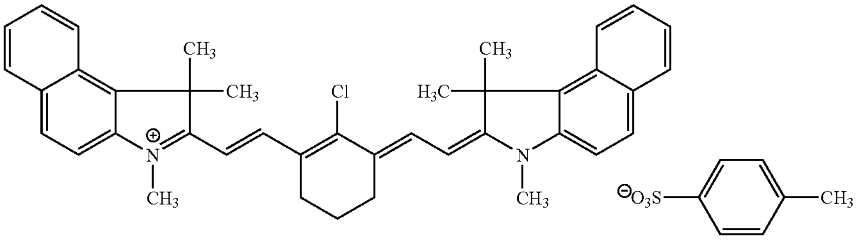

-continued (IR-25)

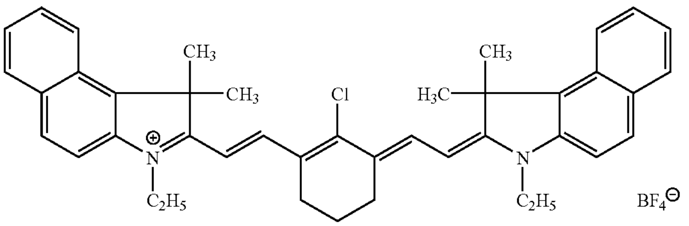

Preferably, the organic photothermal conversion agent is added in a range up to 30 wt % in the thermosensitive layer, more preferably 5 to 25 wt %, particularly preferably 7 to 20 wt %. In these ranges, a high sensitivity is obtained.

For the thermosensitive layer, metal fine particles can also be used as the photothermal conversion agent. Many of the metal fine particles are photothermal convertible, and self heat-generating. As preferable metal fine particles, for example, Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re and Sb can be used alone or in alloy form, or fine particles of their oxides or sulfides can be enumerated.

Most preferable metals among the metals constituting the above-described metal fine particles are those easily bonded by heat during light irradiation, having melting points of about 1000° C. or lower, absorptive in infrared, visible or ultraviolet ray areas, for example, Re, Sb, Te, Au, Ag, Cu, Ge, Pb, and Sn.

Particularly preferable metal fine particles are those having relatively low melting points, and relatively high absorbance of infrared rays, for example Ag, Au, Cu, Sb, Ge, and Pb. Most preferable elements are Ag, Au and Cu.

2 or more photothermal convertible materials may be mixed and used, for example, fine particles of low-melting point metal such as Re, Sb, Te, Au, Ag, Cu, Ge, Pb, Sn or the like, with fine particles of self heat-generating metal Ti, Cr, Fe, Co, Ni, W, Ge or the like. Also preferably, very small pieces of metal having a very large light absorbance when it is a very small piece, such as Ag, Pt or Pd, and very small pieces of other metal may be used in combination.

A particle size of these particles is preferably 10 μm or lower, more preferably 0.003 to 5 μm, particularly preferably 0.01 to 3 μm. In these ranges, high sensitivity and resolution can be obtained.

In the present invention, if the above-described metal fine particles are used as photothermal conversion agent, the quantity of addition is preferably 10 wt % or more of a solid content of the thermosensitive layer, more preferably 20 wt % or more, particularly preferably 30 wt % or more. In these ranges, a high sensitivity can be obtained.

The photothermal conversion agent may be contained in the undercoat layer as a layer adjacent to the thermosensitive layer, or a later-described water-soluble overcoat layer. At least one of the thermosensitive layer, the undercoat layer and the overcoat layer containing the photothermal conversion agent, it is possible to increase infrared ray absorption efficiency, and sensitivity.

When necessary, various compounds other than the foregoing may be added to the thermosensitive layer. For example, multifunctional monomer can be added into the thermosensitive layer matrix in order to further improve press life. As this multifunctional monomer, one contained as the monomer in the microcapsule, exemplified above, can be used. As particularly preferable monomer, trimethylol propane triacrylate is enumerated.

Moreover, in order to discriminate between an image area and a non-image area easily after image formation, for the thermosensitive layer, a dye having a large light absorbing capability in a visible ray area can be used as image colorant. Specific examples of dyes include oil yellow #101, oil yellow #103, oil pink #312, oil green BG, oil blue BOS, oil blue #603, oil black BY, oil black BS, oil black T-505 (all are manufactured by Orient Chemical Industries, Ltd.), Victoria pure blue, crystal violet (CI42555), methyl violet (CI42535), ethyl violet, rhodamine B (CI145170B), malachite green (CI42000), methylene blue (CI52015), and a dye described in JP 62-293247 A. In addition, pigments such as phthalocyanine pigment, azo pigment, and titanium oxide can be suitably used. The quantity of addition is preferably 0.01 to 10 wt % of a solid content of the thermosensitive layer.

In the present invention, preferably, a small quantity of thermal polymerization preventive agent is added in order to prevent unnecessary thermal polymerization of the ethylenically unsaturated compound in adjustment or storage of the thermosensitive layer coating solution. As proper thermal polymerization preventive agent, examples include hydroquinone, p-methoxy phenol, di-t-butyl-p-cresol, pyrogallol, t-butyl catechol, benzoquinone, 4,4'-thiobis(3-methyl-6-t-butyl phenol), 2,2'-methylene bis(4-methyl-6-t-butyl phenol), and N-nitroso-N-phenyl hydroxyl amin aluminum salt. Preferably, the quantity of adding the thermal polymerization preventive agent is about 0.01 to 5 wt % of weight of the entire composition.

When necessary, in order to prevent polymerization interference by oxygen, higher fatty acid such as behenic acid or behenic acid amide, and its derivative, or the like may be added, and unevenly distributed on the surface of the thermosensitive layer in the drying step after coating. Preferably, the quantity of adding the higher fatty acid or its derivative is about 0.1 to 10 wt % of a solid content of the thermosensitive layer.

Further, when necessary, plasticizer for providing coated layer flexibility or the like can be added to the thermosensitive layer. As the plasticizer, examples include polyethylene glycol, tributyl citrate, diethyl phthalate, dibutyl phthalate, dihexyl phthalate, dioctyl phthalate, tricresyl phosphate, tri-butyl phosphate, trioctyl phosphate, and tetrahydrofurfuryl oleate.

For the thermosensitive layer, each necessary component described above is dissolved in solvent to prepare coating liquid, and coating is carried out. As the solvent used in this case, examples include ethylene dichloride, cyclohexanone, methyl ethyl ketone, methanol, ethanol, propanol, ethylene glycol monomethyl ether, 1-methoxy-2-propanol, 2-methoxy ethyl acetate, 1-methoxy-2-propyl acetate, dimethoxy ethane, methyl lactate, ethyl lactate, N,N-dimethyl acetoamide, N,N-dimethyl foramide, tetramethyl urea, N-methyl pyrrolidone, di-methyl sulfoxide, sulfolane, γ-butyrolactone, toluene, and water. But no limitations are placed in this regard. These solvents are used alone or in combination. Solid content of the coating liquid is preferably 1 to 50 wt %.

The thermosensitive layer coating quantity (solid content) on the support obtained after coating and drying is different depending on use, but it is preferably 0.5 to 5.0 $g/m^2$ generally. If the coating quantity is less than aforementioned range, a characteristic of the thermosensitive layer for recording images is reduced, while an apparent sensitivity is increased. As the coating method, various methods can be used. Examples include bar coater coating, rotating coating, spray coating, curtain coating, dipping coating, air knife coating, blade coating, and roll coating.

Surfactant for improving a coating characteristic can be added to the thermosensitive layer coating liquid, for example fluorine surfactant described in JP 62-170950 A. The quantity of addition is preferably 0.01 to 1 wt % of an entire solid content of the thermosensitive layer, more preferably 0.05 to 0.5 wt %.

In the case of a presensitized plate of the present invention, in order to prevent scum on the surface of the thermosensitive layer by the lipophilic material, a water soluble overcoat layer can be provided on the thermosensitive layer. The water soluble overcoat layer used in the present invention can be easily removed in printing, and contains a resin selected from water soluble organic polymer compounds.

As the water soluble organic polymer compound, a layer formed by coating and drying and having a film forming capability is enumerated. Specific examples include polyvinyl acetate (hydrolysis rate of 65% or more); polyacrylic acid, and its alkali metal salt or amine salt; polyacrylic acid copolymer, and its alkali metal salt or amine salt; polymethacrylic acid, and its alkali metal salt or its amine salt; polymethacrylic acid copolymer, and its alkali metal salt or amine salt; polyacryl amide, and its copolymer; polyhydroxyethyl acrylate; poly vinyl pyrrolidone, and its copolymer; polyvinyl methyl ether; vinyl methyl ether/maleic anhydride copolymer; poly-2-acrylamide-2-methyl-1-propane sulfonic acid, and its alkali metal salt or amine salt; poly-2-acrylamide-2-methy-1-propane sulfonic acid copolymer, and its alkali metal salt or amine salt; gum Arabic; cellulose derivative (e.g., carboxymethyl cellulose, carboxyethyl cellulose, and methyl cellulose), and modified thereof; white dextrin; pullulan; and oxygen decomposition etherified dextrin. According to purposes, these can be used in combination of 2 or more.

The foregoing photothermal conversion agent may be added to the overcoat layer.

The pigment used as the photothermal conversion agent can be used by executing well-known surface treatment when necessary for improving dispersibility of the added layer. As the method of surface treatment, the foregoing methods can be used.

For the pigment added to the overcoat layer, a pigment having a surface coated with a hydrophilic resin or silica sol is preferable for easy dispersion with a water soluble resin, and prevention of loss of hydrophilicity. As a method of dispersing the pigment, a well-known dispersion technology used in ink production or toner production can be used.

As a particularly preferable pigment, carbon black is enumerated.

In the case of the photothermal conversion agent of the pigment or dye type, its addition rate is preferably 1 to 70 wt % of a solid content of the overcoat layer, more preferably 2 to 50 wt %.

In the above ranges, a high sensitivity is obtained. However, when the photothermal conversion agent is added to the overcoat layer, according to the quantity of its addition, the quantity of adding the photothermal conversion agent to the thermosensitive layer or the undercoat layer can be reduced or none may be added.

Further, for the purpose of securing uniformity of coating, in the case of aqueous solution coating, nonionic surfactant such as polyoxyethylene nonylphenyl ether, or polyoxyethylene dodecl ether can be added to the overcoat layer.

The dry coating quantity of the overcoat layer is preferably 0.1 to 2.0 $g/m^2$. In this range, without losing the on-machine development characteristic, it is possible to greatly prevent scum on the surface of the thermosensitive layer caused by an lipophilic material such as scum of adhered fingerprint.

In the presensitized plate of the present invention, as the recording layer, a thermosensitive layer other than the foregoing containing the (a) fine particle polymer having a thermo-reactive functional group, or the (b) microcapsule containing the compound having a thermo-reactive functional group can be used. Examples include a thermosensitive layer using a negative working infrared laser recording material, a thermosensitive using a positive infrared laser recording material, and a thermosensitive layer using a sulfonate type infrared laser recording material.

In the case of using the presensitized plate of the present invention as that of a negative working type to be exposed with infrared laser, i.e., the presensitized plate of the thermal negative working type, it is preferable to provide a thermosensitive layer by a negative infrared laser recording material.

As the negative infrared laser recording material, the following composition containing an (A) compound decomposed by light or heat to generate acid, a (B) crosslinking agent for crosslinking by acid, a (C) alkali soluble resin, a (D) infrared absorbent, and an (E) compound represented by a general formula $(R^3—X)_n—Ar—(OH)_m$ (in the formula, $R^3$ represents an alkyl group or an alkenyl group having the number of carbons 6 to 32, X represents a single bond, O, S, COO or CONH, Ar represents an aromatic hydrocarbon group, an aliphatic hydrocarbon group or a hetrocyclic group, n represents an integer of 1 to 3, and m represents an integer of 1 to 3) is suitably used.

Generally, the presentisized plate of the thermal negative working type has the disadvantage of getting fingerprints easily after development, and a strength of an image area is weak. However, these drawbacks can be solved by forming the thermosensitive layer based on the foregoing compositions.

As the (A) compound decomposed by light or heat to generate acid, examples are a compound that can be photolyzed to generate sulfonic acid, represented by imino sulfonate or the like described in Japanese Patent Application No. 3-140109 (JP 4-365048 A), and a compound generating acid by being irradiated with a light of a wavelength 200 to 500 nm or heated at 100° C. or higher.

As suitable acid generating agent, for example, light cation polymerization starting agent, light radical polymerization starting agent, light decoloring agent of pigment, light altrant. These acid generating agents are preferably added by 0.01 to 50 wt % of an entire solid content of a recording material.

As the (b) crosslinking agent for crosslinking by acid, suitable examples are a (i) aromatic compound substituted by an alkoxymethyl group or a hydroxy group, a (ii) compound having an N-hydroxymethyl group, an N-alkoxymethyl group or an N-acyloxymethyl group, and a (iii) epoxy compound.

As the (C) alkali soluble resin, for example, a novolac resin, and polymer having a hydroxyaryl at a side chain can be enumerated.

As the (D) infrared absorbent, examples include commercially available dyes such as an azo dye, an anthraquinone dye, or a phthalocyanine dye for effectively absorbing infrared rays of 760 to 1200 nm; a black pigment, a red pigment, a metal powder pigment, and phthalocyanine pigment described in a Color Index. To improve image visibility, preferably, image colorants such as oil yellow, oil blue #603 or the like are added. To improve flexibility of the thermosensitive layer coating film, plasticizer such as polyethylene glycol or phthalic acid ester can be added.

In the case of using the presensitized plate of the present invention as that of a positive working type to be exposed with infrared laser, that is, in the case of the presensitized plate of a thermal positive working type, it is preferable to provide a thermosensitive layer by a positive working type infrared laser recording material.

As the positive working infrared laser recording material, those made of (A) alkali soluble polymer, a (B) compound dissolved with the alkali soluble polymer to reduce alkaline solubility, and a (C) compound for absorbing infrared laser can be suitably used.

By using such a positive working type infrared laser recording material, a solubility shortage of non-image areas to alkali developer can be solved, scratching resistance, high resistance of an image area to the alkali developer is provided, and thus a presensitized plate of high development stability can be provided.

As the (A) alkali soluble polymer, examples include a (i) polymer compound having a phenolic hydroxy group represented by a phenol resin, a cresol resin, a novolac resin, pyrogallol or the like, a (ii) compound obtained by singly polymerizing polymerizable monomer having a sulfonic amid group, or copolymerizing it with other polymerizable monomer, and a (iii) compound having an active imide group in a molecule, represented by N-(p-toluene sulfonyl) methacrylamide, N-(p-toluenesulfonyl) acrylamide or the like.

As the (B) compound dissolved with the (A) component to reduce the alkali solubility, examples include a sulfone compound, ammonium salt, sulfonium salt, an amide compound and the like, which operate mutually with the (A) component. For example, if the (A) component is a novolac resin, a cyanine pigment is preferable as the (B) component.

As the (C) compound absorbing infrared laser, a material having an absorbing capability in an infrared area of 750 to 1200 nm, and a photothermal conversion capability is preferable. Examples having such functions include an squarilium pigment, a pyrilium salt pigment, carbon black, an insoluble azo dye, and an anthraquinone dye. Size of these is preferably set in a range 0.01 to 10 μm.

The presensitized plate of the thermal positive working type can be obtained by dissolving the positive infrared ray recording material in organic solvent such as methanol or methyl ethyl ketone, adding a dye when necessary, and coating and drying it on the support so as to have weight of 1 to 3 $g/m^2$ after drying.

In the presensitized plate of the present invention, a sulfonate type infrared laser recording material may be used as a recording layer.

As the sulfonate type infrared laser recording material, for example, sulfonate compounds described in JP 2704870 B, JP 2704872 B, and the like can be used. Also, a photosensitive material for generating sulfonic acid by heat generated by infrared laser irradiation and becoming water soluble, a photosensitive material having stylene sulfonic acid ester hardened by sol-gel, and a surface polarity changed by subsequent infrared laser irradiation, a photosensitive material having a hydrophobic surface changed to be hydrophilic by laser exposure, described in Japanese Patent Application No. 9-89816 (JP 10-282646 A), Japanese Patent Application No. 10-22406 (JP 11-218928 A), and Japanese Patent Application No. 10-27655 (JP 10-282672 A).

In order to further improve the characteristic of the thermosensitive layer made of the polymer compound for generating a sulfonic acid group by heat, the following methods are preferably used. Examples are (1) a method used with acid or base generating agent, described in Japanese Patent Application No. 10-7062 (JP 11-202483 A), (2) a method of forming a particular intermediate layer, described in Japanese Patent Application No. 9-340358 (JP 11-174685 A), (3) a method used with particular crosslinking agent, described in Japanese Patent Application No. 9-248994 (JP 11-84658 A), and (4) a method using solid particle surface modification, described in Japanese Patent Application No. 10-115354 (JP 11-301131 A).

Furthermore, as the compositions for changing hydrophilicity/lipophilicity of the thermosensitive layer by using heat generated by laser exposure, other examples include a composition for a change into hydrophobic by heat of Werner complex, described in U.S. Pat. No. 2,764,085, a composition for a change into hydrophilic by exposure, containing a particular sugar, a melamine formaldehyde resin or the like, described in JP 46-27219 B, a composition for a change into hydrophobic by heat mode exposure, described in JP 51-63704 A, a composition made of polymer causing dehydration and becoming hydrophobic by heat, such as phthalyl hydrazid polymer, described in U.S. Pat. No. 4,081,572, a composition having a tetrazolium salt structure, and becoming hydrophilic by heat, described in JP 3-58100 B, a composition made of sulfonic acid modified polymer, and becoming hydrophobic by exposure, described in JP 60-132760 A, a composition made of imide precursor polymer, and becoming hydrophobic by exposure, described in JP 64-3543 A, and a composition made of carbon fluoride polymer, and becoming hydrophilic by exposure, described in JP 51-74706 A. A recording layer can be formed by using these compositions.

Further, other examples include a composition made of hydrophobic crystalline polymer, and becoming hydrophilic by exposure, described in JP 3-197190 A, a composition made of polymer having a side group made insoluble, which become hydrophilic by heat, and photothermal conversion agent, described in JP 7-186562 A, a composition made of hydrophilic binder containing microcapsules and three-dimensionally crosslinked, and becoming hydrophobic by exposure, described in JP 7-1849 A, a composition atomic value isomerizing or proton movement isomerizing, described in JP 8-3463 A, a composition causing phase-structure changes (becoming compatible) in the layer by heat, and changing hydrophilicity/hydrophobicity, described in JP 8-141819 A, and a composition changing in a surface form or surface hydrophilicity/hydrophobicity by heat, described in JP 60-228 B. A recording layer can be formed by using these compositions.

In the present invention, other preferable examples of recording materials used for the recording layer include a composition, in which its adhesion between the thermosensitive layer and the support is changed by so-called heat mode exposure using heat generated by high power and high density laser beam. Specifically, a composition made of a thermo-fusible material or thermo-reactive material, described in JP 44-22957 B.

The presensitized plate of the present invention obtained in the foregoing manner is characterized in which, in the section of the anodized layer after the recording layer is provided, an atomicity ratio of carbon to aluminum (C/Al) represented by a following formula (1) is 1.0 or less:

$$C/Al=(I_c/S_c)/(I_{al}/S_{al}) \quad (1)$$

$I_c$: carbon (KLL) Auger electron differential peak-to-peak amplitude $I_{al}$: aluminum (KLL) Auger electron differential peak-to-peak amplitude $S_c$: relative sensitivity factor of carbon (KLL) Auger electron $S_{al}$: relative sensitivity factor of aluminum (KLL) Auger electron Now, specific description is made of a method for calculating an atomicity ratio (C/Al) of carbon to aluminum with reference to the drawings.

FIG. 1 is a chart showing an example of Auger electron spectroscopic analysis carried out in a section of an anodized layer of a presensitized plate. In FIG. 1, C denotes a peak of carbon, Al denotes a peak of aluminum, and O denotes a peak of oxygen. Also. "c/s" refers to "counter per second". The Auger electron spectroscopic analysis can be carried out by bending the presensitized plate at about 180° immediately before the analysis to form a section of the anodized layer, fixing it to a sample holder attached to Auger electron spectroscopic analyzer, and introducing it into the analyzer.

From FIG. 1, $I_c$ (carbon (KLL) Auger electron differential peak-to-peak amplitude), and $I_{al}$ (aluminum (KLL) Auger electron differential peak-to-peak amplitude) are obtained. By setting a value of $S_c$ (relative sensitivity factor of carbon (KLL) Auger electron) to 0.076, and a value of $S_{al}$ (relative sensitivity factor of aluminum (KLL) Auger electron) to 0.105, and substituting the value of the obtained $I_c$ and $I_{al}$ for $I_c$ and $I_{al}$ in the formula (1), C/Al is calculated. In FIG. 1, C/Al=0.76.

Preferably, Auger electron spectroscopic analysis is performed at a plurality of points (e.g., 5 points) in the section of the anodized layer, and then C/Al is calculated as an average value thereof.

An example of conditions for Auger electron spectroscopic analysis is as follows.

Measuring device: FE-AES model SMART-200, manufactured by ULVAC-PHI, Inc.

Irradiation current: about 10 nA

Acceleration voltage: 10 kV

Irradiation electron beam diameter: focused

Chamber inner pressure: about $1\times10^{-10}$ Torr (about $1.33\times10^{-8}$ Pa)

Detection range: 20 to 2020 eV, 0 eV/step, 20 ms/step

Multiplier voltage: 2250 V

In the present invention, in the section of the anodized layer after the recording layer is provided, C/Al is 1.0 or less, preferably 0.8 or less. By suppressing incursion into the micropores of the anodized layer so as to set C/Al to 1.0 or less, a thermal conductivity of the anodized layer after the recording layer is provided can be maintained low. Thus, when the presensitized plate of the invention is processed into a lithographic printing plate, high press life, high sensitivity and high scum resistance can be provided.

Hereinafter, description is made of a manufacturing device of an aluminum support used in the present invention.

The manufacturing process of the aluminum support used in the present invention preferably includes the steps of (1) feeding an aluminum plate rolled and wound into a coil shape, from a feeder composed of a multiaxial turret, (2) drying the aluminum plate after each of the foregoing treatments (mechanical graining, electrochemical graining, alkali etching, acid etching, desmuitting, anodizing, pore widening (treatment with acid or alkali), sealing, surface hydrophilic treatment, and the like), (3) winding the aluminum plate into a coil shape by a winder including the multiaxial turret, or correcting planarity of the aluminum plate, and then cutting it into predetermined lengths and collecting them. In the process, when necessary, a step may be provided of forming undercoat and recording layers, and drying them, and after a presensitized plate is made, it may be wound into a coil shape by the winder.

In the manufacturing of the aluminum support, preferably, 1 or more steps are provided for continuously inspecting defects by using a device for inspecting the defects on the surface of the aluminum plate, and attaching label as a mark on an edge part of a discovered defect portion. Further, in the manufacturing of the presensitized plate of the present invention, in the steps of feeding and winding the aluminum plate, a reserver device is preferably provided so as to maintain constant a traveling speed of the aluminum plate in each step even if the traveling of the aluminum plate is stopped during replacement of an aluminum coil. After the step of feeding the aluminum coil, preferably, a step of jointing the aluminum plates by ultrasonic wave or arc welding is provided.

Regarding the devices used for manufacturing the aluminum support, preferably, 1 or more devices are provided for detecting a traveling position of the aluminum plate, and correcting the traveling position. In addition, 1 or more driving devices for tension-cutting of the aluminum plate and controlling the traveling speed, and 1 or more dancer rollers for controlling tension are preferably provided.

Preferably, whether a state of each step is under a desired condition or not is recorded by a tracking device, a label is attached to an edge part of an aluminum web before the aluminum coil is wound, so that whether a part after the mark is under a desired condition or not can be determined later.

In the present invention, preferably, the aluminum plate is charged together with an interleaving sheet to be attracted to each other, then cut and/or slit into predetermined lengths. Preferably, based on information of the label attached to the edge part of the aluminum plate, after or before the cutting into predetermined lengths, good and defective portions are separated from each other with the label as a mark, and only good portions are collected.

In the respective steps including the feeding step or the like, it is important to set optimal tension under respective conditions based on a size (thickness and width) of the aluminum plate, an aluminum material, or a traveling speed of the aluminum web. Here, preferably, a plurality of tension controllers are provided, which feedback-control signals from a tension sensor by using the driving device for tension cutting and a traveling speed control, and the dancer roller for tension control. The driving device generally uses a control method combining a DC motor and a main driving roller. The main driving roller uses a general rubber material, and a roller manufactured by laminating nonwoven cloth can be used in a step where the aluminum web is wet. For each pass roller, rubber or metal is generally used. However, in a place where slipping easily occurs with the aluminum web, in order to prevent such slippage, an auxiliary driving device can be provided which connects a motor or a reduction gear to each pass roller, and controls rotation at a constant speed based on a signal from the main driving device.

For the aluminum support used in the present invention, as described in JP 10-114046 A, when arithmetical mean roughness ($R_a$) in a rolling direction is $R_1$, and arithmetical mean roughness ($R_a$) in a width direction is $R_2$, preferably, $R_1-R_2$ (a value of $R_1$ minus $R_2$) is within 30% of $R_1$, mean curvature in the rolling direction is $1.5\times10^{-3}$ $mm^{-1}$ or lower, mean curvature in the width direction is $1.5\times10^{-3}$ $mm^{-1}$ or lower, and mean curvature in a direction perpendicular to the rolling direction is $1.0\times10^{-3}$ $mm^{-1}$ or lower.

The aluminum support manufactured by executing the foregoing graining and the like is preferably corrected by using a correction roll having a roll diameter of 20 to 80 mm, and rubber hardness of 50 to 95 degree. Accordingly, even in an automatic feeing step of printing machine for the presensitized plate, a flat aluminum coil material plate, in which no exposure shifting occurs in the presensitized plate, can be fed. In JP 9-194093 A, a method and a device for measuring a web curl, a method and a device for correcting a curl, and a web cutter are described, and these can also be used in the present invention.

In the continuous manufacturing of the aluminum support, whether each step is carried out under a proper condition or not can be electrically monitored, whether a state of each step is under a desired condition or not can be recorded by the tracking device, a mark can be attached to the edge part of the aluminum web before the aluminum coil is wound, and whether a part after the mark is under a desired condition or not can be determined later. Thus, during cutting and collecting, whether the part is good or not can be determined.

Preferably, the treatment device of the aluminum plate used in the foregoing graining measures 1 or more among temperature, specific gravity, electric conductivity and a propagation speed of an ultrasonic wave of liquid, obtains a liquid composition, executes feedback control, and/or feed-forward control to control liquid concentration constant.

In the acid aqueous solution in the treatment device, components contained in the aluminum plate such as aluminum ions are dissolved following the progress of the surface treatment of the aluminum plate. Thus, preferably, in order to maintain constant aluminum ion concentration, and acid or alkali concentration, water and acid, or water and alkali are intermittently added to maintain liquid composition constant. Preferably, concentration of acid or alkali added is 10 to 98 wt %.

To control the concentration of acid or alkali, for example, the following methods are preferable.

First, electric conductivity, specific gravity or an ultrasonic wave propagation speed of each component liquid of a concentration range scheduled to be used beforehand is measured at each temperature, and a data table is made therefrom. Then, concentration is measured by referring to a data table of measured liquid made beforehand regarding electric conductivity, specific gravity or an ultrasonic wave propagation speed of the measured liquid. The method of measuring the ultrasonic wave propagation time highly accurately and highly stably is described in JP 6-235721 A.

Regarding the concentration measuring system using the ultrasonic wave propagation speed, it is described in JP 58-77656 A. The method of measuring concentration of multicomponent liquid is described in JP 4-19559 A, the method making a data table containing a plurality of physical quantity data showing correlations of liquid components, and then referring this data table.

When the concentration measuring method using the ultrasonic wave propagation speed is applied to the graining step of the aluminum support by combining the electric conductivity and the temperature value of the measured liquid, process management can be accurately carried out in real time. Thus, products of constant quality can be produced, increasing a yield ratio. Combinations are not limited to the temperature, the ultrasonic wave propagation speed and the electric conductivity, but combinations may be made of the temperature and the specific gravity, the temperature and the electric conductivity, the temperature, the electric conductivity and the specific gravity, and the like. Based on these combinations, a data table is formed beforehand for each concentration and each temperature at each physical quantity. Then, concentration of the multicomponent liquid is measured by referring to the data table. If this method is applied to the graining step of the aluminum support, an effect similar to the foregoing can be obtained.

In addition, the specific gravity and the temperature are measured and, by referring to the data table prepared beforehand, slurry concentration of the measured article is calculated. Thus, measurement of the slurry concentration can be carried out quickly and accurately.

Because of its susceptibility to bubbles in the liquid, more preferably, the measurement of the ultrasonic wave propagation speed is carried out in a pipe disposed vertically, and having a flow velocity from lower to upper directions. The measurement of the ultrasonic wave propagation speed is preferably carried out while pressure in the pipe is 1 to 10 $kg/cm^2$, and a frequency of an ultrasonic wave is 0.5 to 3 MHz.

The measurement of the specific gravity, the electric conductivity and the ultrasonic wave propagation speed is easily affected by a temperature. Thus, preferably, it is carried out in a pipe in a warmth retaining state, with temperature fluctuation controlled within ±0.3°. Further, since the electric conductivity and the specific gravity, or the electric conductivity and the ultrasonic wave propagation speed are preferably measured at the same temperature, it is particularly preferable to carry out measurement in the same pipe or the same pipe flow. Pressure fluctuation during measurement causes temperature fluctuation, and thus it is preferably reduced as much as possible. Also, a flow velocity distribution in the pipe to be measured is preferably reduced as much as possible. Further, since the foregoing measurement is easily affected by slurry, dust and bubbles, preferably, liquid passed through a filter, a degasifier or the like is measured.

On the presensitized plate of the present invention thus obtained, an image is formed by heat. Specifically, direct image recording by a thermal recording head or the like, scanning exposure by infrared laser, high illumination flash exposure by a xenon discharge lamp or the like, and exposure by solid high power infrared laser of an infrared lamp are preferable.

In the presensitized plate of the present invention, if the recording layer is a thermosensitive layer of an on-machine development type, containing (a) fine particle polymer having a thermo-reactive functional group, or (b) microcapsules containing a compound having a thermo-reactive functional group, after image exposure, the presensitized plate is loaded on the printing machine without further treatments, and printing can be carried out through a normal process by using ink and/or fountain solution. As described above JP 2938398 B, it is subjected to exposure by a laser loaded on the printing machine after it is attached onto the printing machine cylinder, and then it is supplied ink and/or fountain solution to be developed on the machine. In these cases, since the thermosensitive layer is removed by ink and/or fountain solution on the printing machine, without providing any other development steps, or without any need to stop the printing machine for printing after development, printing can be continued instant that the development is finished.

That is, a method of making a lithographic printing plate and printing is characterized in which, executing printing by subjecting a presensitized plate having a thermosensitive layer of the on-machine development type to image exposure with a laser beam, and directly attaching the plate to a printing machine, or by subjecting the presensitized plate to image exposure with a laser beam after the plate is attached to the printing machine. As the laser beam, a solid-state laser or a semiconductor laser can be used, which emits infrared rays of wavelengths 760 to 1200 nm.

Also, in the case having the thermosensitive layer of the on-machine development type, it is possible to carry out development by using water or proper aqueous solution as developer and use for printing.

In the presensitized plate of the present invention, if a conventional thermal positive or negative working type recording layer or the like is present, according to the conventional method, the presensitized plate can be developed by developer after it is subjected to image exposure, loaded on the printing machine, and then it can be used for printing.

For details on the foregoing treatments, well-known conditions can be used as occasion demands. The contents of the documents described in the present specification are referenced herein to be included in the present invention.

EXAMPLES

Next, specific examples of the present invention will be described, but these are not restrictive of the present invention.

1-1. Manufacturing of Aluminum Support

Example of Manufacturing Support 1

An aluminum plate used for examples of the present invention and comparative examples was prepared as described below from aluminum alloy molten metal containing an alloy component of a composition A shown in Table 1.

First, molten metal processing including degassing and filtering was carried out for the aluminum alloy molten, and an ingot having a thickness of 500 mm was made by a DC casting method. After the surface of the obtained ingot was chipped 10 mm, the ingot was heated, hot rolling was started at 400° C. without soaking, and rolling was carried out to reach a plate thickness of 4 mm. Then, the plate was set to a thickness of 1.5 mm by cold rolling. After intermediate annealing, the plate was finished to a thickness of 0.24 mm by carrying out cold rolling again, planarity was corrected, and thus an aluminum plate was obtained.

TABLE 1

| Composition | Fe (wt %) | Si (wt %) | Cu (wt %) | Ti (wt %) | Mn (wt %) | Mg (wt %) | Zn (wt %) | Cr (wt %) | Others total (wt %) | Al (wt %) |
|---|---|---|---|---|---|---|---|---|---|---|
| A | 0.31 | 0.06 | 0.01 | 0.03 | 0.01 | 0.01 | 0.0 | 0.01 | 0.01 | 99.55 |

For the prepared aluminum plate of the composition A, surface treatments were carried out by processes (1) to (9) described below. After each surface treatment and wash, solution removal was carried out by a nip roller. The wash was carried out by spraying water from a spray pipe.

(1) Mechanical Graining

Mechanical graining was carried out by brush roller having rotating nylon brushes while supplying suspension containing abrasive (silica sand, average diameter:25 μm) and water having specific gravity of 1.12 as abrasive slurry liquid to the surface of the aluminum plate through a spray pipe.

A material for the nylon brush was 6,10-nylon, having a bristle length of 50 mm, and a bristle diameter of 0.48 mm. The nylon brush was made by boring holes in a ϕ300 mm stainless cylinder and densely implanting bristles therein. Three of such nylon brushes were placed to the brush roller. Each distance between two supporting rollers (ϕ200 mm) provided in the lower part of the brush was 300 mm.

The brush roller was pressed against the aluminum plate such that a load of the driving motor for rotating the brush was controlled with respect to a load before the nylon brush was pressed against the aluminum plate, and arithmetical mean roughness ($R_a$) of the aluminum plate after graining reached 0.45 μm. Then, wash was carried out.

Concentration of the abrasive was calculated from a temperature and a specific gravity by referring to a table made beforehand based on a relation among concentration, a temperature and a specific gravity. Water and the abrasive were added by feedback control, and the concentration of the abrasive was maintained constant. When the abrasive is crushed to reduce the particle sizes, the surface shape of the grained aluminum plate is changed. Thus, abrasives having small particle sizes were discharged out of the system by a cyclone each time. A particle size of the abrasive was in a range of 1 to 35 μm.

(2) Alkali Etching

The aluminum plate was subjected to alkali etching by spraying aqueous solution containing 27 wt % of NaOH and 6.5 wt % of aluminum ions at a liquid temperature of 70° C. to the aluminum plate. A surface of the aluminum plate to be subjected to electrochemical graining later was dissolved by 8 g/m$^2$, and a backside was dissolved by 2 g/m$^2$.

Concentration of etching solution used in the alkali etching was calculated based on a temperature, specific gravity and an electric conductivity by referring to a table made beforehand based on a relation among NaOH concentration, aluminum ion concentration, a temperature, specific gravity and liquid electric conductivity, and maintained constant by adding water and 48 wt % of NaOH aqueous solution based on feedback control. Then, wash was carried out.

(3) Desmutting

The aluminum plate was subjected to spray desmutting treatment with aqueous solution of nitric acid at a liquid temperature of 35° C. for 10 sec. For the aqueous solution of nitric acid, waste solution overflown from an electrolysis device used in the next step was used. Then, spray pipes for spraying desmuitting treatment solution were installed in a plurality of places, and thus drying of the surface of the aluminum plate was prevented until a next step.

(4) Electrochemical Graining

Electrochemical graining was continuously carried out by using an alternative current of a trapezoidal wave shown in FIG. 2, and 2 electrolytic cells shown in FIG. 3. Acid aqueous solution in this case was the aqueous solution of nitric acid of 1 wt % (containing aluminum ions 0.5 wt %, and ammonium ions 0.007 wt %), and the liquid temperature was 50° C. For the alternating current, the conditions were set as follows, that is, a time period tp in which a current value goes up from 0 to a peak at cathode cycle side and a time period tp' in which a current value goes up from 0 to a peak at anode cycle side were 1 msec., and carbon electrodes were set as counter electrodes. Current densities at the peak of the alternating current were 50 A/$dm^2$ at both times when the aluminum plate was at the anode and at the cathode side, a ratio ($Q_C/Q_A$) of the quantities of electricity of the alternating current at cathode time ($Q_C$) to at anode time ($Q_A$) was 0.95, a duty ratio was 0.50, a frequency was 60 Hz, and the total quantity of electricity at the anode side was 180 C/$dm^2$. Then, wash was carried out by spraying.

Concentration control of the aqueous solution of nitric acid was carried out by adding nitric acid stock solution of 67 wt % and water in proportion to the quantity of supplied electricity, overflowing acid aqueous solution (aqueous solution of nitric acid) equal in quantity to the added volume of nitric acid and water from the electrolysis device each time, and discharging it out of the electrolysis device. Also, concentration of the aqueous solution of nitric acid was calculated based on a temperature, an electric conductivity and an ultrasonic wave propagation speed of the nitric acid aqueous solution by referring to a table made beforehand based on a relation among nitric acid concentration, aluminum ion concentration, a temperature, a liquid electric conductivity and a liquid ultrasonic wave propagation speed. Then, the concentration was maintained constant by performing control to adjust the added quantity of the nitric acid stock solution and water successively.

(5) Alkali Etching

The aluminum plate was subjected to alkali etching by spraying aqueous solution containing 26 wt % of NaOH and 6.5 wt % of aluminum ions at a liquid temperature of 45° C. to the aluminum plate. The aluminum plate was dissolved by 1 g/$m^2$. Concentration of etching solution was calculated based on a temperature, specific gravity and an electric conductivity by referring to a table made beforehand based on a relation among NaOH concentration, aluminum ion concentration, a temperature, specific gravity and liquid electric conductivity, and maintained constant by adding water and 48 wt % of NaOH aqueous solution based on feedback control. Then, wash was carried out.

(6) Acid Etching

The aluminum plate was subjected to acid etching by using sulfuric acid (sulfuric acid concentration 300 g/L, and aluminum ion concentration 15 g/L) as an acid etching solution, and spraying this to the aluminum plate from a spray pipe at a temperature of 80° C. for 8 sec. Concentration of the acid etching solution was calculated based on a temperature, specific gravity and an electric conductivity by referring to a table made beforehand based on a relation among sulfuric acid concentration, aluminum ion concentration, a temperature, specific gravity and liquid electric conductivity, and maintained constant by adding water and 50 wt % of sulfuric acid aqueous solution based on feedback control. Then, wash was carried out.

(7) Anodizing

The aluminum plate was subjected to anodizing by using aqueous solution (containing aluminum ion 0.5 wt %) of oxalic acid concentration 50 g/L as an anodizing solution, and using a DC voltage at a current density of 12 A/$dm^2$, at a temperature of 50° C. for 30 sec., thus forming an anodized layer. Concentration of the anodizing solution was calculated based on a temperature, specific gravity and an electric conductivity by referring to a table made beforehand based on a relation among oxalic acid concentration, aluminum ion concentration, a temperature, specific gravity and liquid electric conductivity, and maintained constant by adding water and 50 wt % of oxalic acid based on feedback control. Then, wash was carried out by spraying.

(8) Pore Widening

The aluminum plate after the anodizing was subjected to pore widening by dipping it in NaOH aqueous solution of pH 13, at a temperature of 50° C. for 30 sec. Then, wash was carried out.

(9) Surface Hydrophilic Treatment

Surface hydrophilic treatment was carried out by treating the aluminum plate in aqueous solution of 3rd sodium silicate concentration 2.5 wt % at a temperature of 70° C. for 10 sec.

Then, the plate was washed by water, and dried. Thus, an aluminum support 1 was obtained.

Example of Manufacturing Support 2

An aluminum support 2 was obtained by a method similar to that of Example of manufacturing support 1 except for execution of a (10) treatment with aqueous solution containing an inorganic fluorine compound and a silicate compound described bellow, in place of the foregoing (9) surface hydrophilic treatment.

(10) Treatment with Aqueous Solution Containing Inorganic Fluorine Compound and Silicate Compound The aluminum plate after the pore widening was dipped in aqueous solution prepared by using purified water to set concentrations of sodium fluoride and 3rd sodium silicate to 2 wt % and 2.5 wt % respectively, at 100° C. for 10 sec. Then, wash was carried out.

Example of Manufacturing Support 3

An aluminum support 3 was obtained by a method similar to that of Example of manufacturing support 1, except for execution of a (11) treatment with aqueous solution containing particles described below, between (8) the pore widening and (9) the surface hydrophilic treatment.

(11) Treatment with Liquid Containing Particles

Electrolysis was carried out at constant voltage by using a plate after the pore widening as a cathode, and water suspension containing 1 wt % of alumina particles having an average particle size of 30 nm as electrolyte, at a voltage of 110 V for 60 sec. Then, the plate was washed and dried to complete sealing.

Example of Manufacturing Support for Comparative Examples 1

An aluminum support for comparative examples 1 was obtained by a method similar to that of Example of manufacturing support 1, except for execution of (7') anodizing described below in place of (7) the anodizing and (8) the pore widening.

(7') Anodizing

The aluminum plate was subjected to anodizing by using aqueous solution (containing 0.5 wt % of aluminum ion) of sulfuric acid concentration 170 g/L as anodizing solution, and DC voltage, at a current density of 5 $A/dm^2$, at a temperature of 43° C. for 33 sec., thus forming an anodized layer. Concentration of the anodizing solution was calculated based on a temperature, specific gravity and liquid electric conductivity by referring to a table made beforehand based on a relation among sulfuric acid concentration, aluminum ion concentration, a temperature, specific gravity and a liquid electric conductivity, and was maintained constant by adding water and 50 wt % of sulfuric acid based on feedback control. Then, wash was carried out by spraying.

Example of Manufacturing Support for Comparative Examples 2

An aluminum support for comparative examples 2 was obtained by a method similar to that of Example of manufacturing support 2, except for execution of a (12) treatment with phosphate/inorganic fluorine compound described below in place of the (10) treatment in the aqueous solution containing the inorganic fluorine compound and the silicate compound.

(12) Treatment with Phosphate/Inorganic Fluorine Compound

The aluminum plate after the pore widening was dipped in aqueous solution prepared so as to set concentrations of sodium fluoride and sodium dihydrogen phosphate to 0.1 wt % and 10 wt % respectively by using purified water at 100° C. for 10 sec. Then, the plate washed by water.

<Measurement of Porosity of Anodized Layer>

For the aluminum supports 1 to 3 and the aluminum supports for comparative examples 1 and 2, porosity of the anodized layer was calculated by the following formula, and shown in Table 2.

$$\text{Porosity (\%)}=(1-(\text{anodized layer density}/3.98))\times 100$$

In the formula, the anodized layer density ($g/cm^3$) was obtained by dividing an anodized layer weight per unit area ($g/cm^2$) by an anodized layer thickness (cm). The anodized layer weight per unit area was obtained by chipping out the non-image area of the lithographic printing plate obtained by development of the presensitized plate obtained from each of these supports in a later-described manner into proper sizes, dipping it in Mason liquid containing chromic acid/phosphoric acid to dissolve the anodized layer, measuring weights before and after the dissolution, and dividing a difference thereof by the chipped out area. For the thickness of the anodized layer, the anodized layer of the developed non-image area was observed by a scanning microscope (T20, JEOL), and averaging values of thickness measured at 50 places.

3.98 means a density ($g/cm^3$) of aluminum oxide according to "Kagaku Binran (Chemical Manual)" (Maruzen) edited by The Chemical Society of Japan.

<Measurement of Micropore Diameter on Surface of Anodized Layer>

For each presensitized plate, a micropore diameter on the surface of the anodized layer of the non-image areas after on-machine development using fountain solution was calculated by SEM photograph resulted from observation made with the scanning electron microscope (S-900, Hitachi, Ltd.) by an acceleration voltage of 12 kV, with no vapor deposition, and at a magnification of 150,000. An average value of micropore diameters for randomly selected 50 micropores is shown as a micropore diameter in Table 2.

1-2. Synthesis of Fine Particle Polymer and Preparation of Microcapsule (1) Synthesis of Fine Particle Polymer Allylmethacrylate 7.5 g, butylmetharylate 7.5 g, and polyoxyethylene nonylphenol aqueous solution (concentration $9.84\times10^{-3}$ mol/L) 200 mL were added, and nitrogen gas was substituted for the inside of the system while carrying out stirring at 250 rpm. After this solution was set to 25° C., cerium (IV) ammonium salt aqueous solution (concentration $0.984\times10^{-3}$ mol/L) 10 mL was added. Here, ammonium nitrate aqueous solution (concentration $58.8\times10^{-3}$ mol/L) was added, and pH was adjusted to 1.3 to 1.4. Then, stirring was carried out for 8 hours, and liquid containing fine particle polymer was obtained. Solid content of the obtained liquid was 9.5 wt %, and an average particle size of the fine particle polymer was 0.2 μm.

(2) Preparation of Microcapsule

An oil phase component was prepared by dissolving xylene diisocyanate 40 g, trimethylol propane diacrylate 10 g, copolymer of allylmethacryalte and butylmethacrylate (mol ratio 7/3) 10 g and surfactant (Paionin A41C, Takemoto Oil & Fat Co., Ltd.) 0.1 g in ethyl acetate 60 g. On the other hand, 4 wt % aqueous solution of polyvinyl alcohol 120 g (PVA 205, Kuraray Co., Ltd.) was prepared, forming a water phase component. The oil phase and water phase components were introduced to a homogenizer, and emulsified at 10,000 rpm. Then, water 40 g was added, stirring was carried out at a room temperature for 30 min., then stirring was further carried out at 40° C. for 3 hours, and then microcapsule liquid was obtained. Solid content of the obtained microcapsule liquid was 20 wt %, and an average particle size of the microcapsules was 0.2 μm.

1-3. Manufacturing of Presensitized Plate

Examples 1 to 3 and Comparative Examples 1 and 2

Thermosensitive layer coating liquid (1) having a composition below was coated on the aluminum supports 1 to 3 and the aluminum supports for comparative examples 1 and 2 obtained above, dried in an oven at 60° C. for 150 sec., thereby obtaining the presensitized plates of Examples 1 to 3 and Comparative Examples 1 and 2. The dry coating quantity of the thermosensitive layer (1) was 0.5 $g/m^2$.

<Composition of Thermosensitive Layer Coating Liquid (1)>

Liquid containing the fine particle polymer synthesized above 5 g (solid content)

Polyhydroxyethyl acrylate (weight-average molecular weight 25,000) 0.5 g

Photothermal conversion agent (IR-11 in the present specification) 0.3 g
Water 100 g Examples 4 to 6 and Comparative Examples 3 and 4

Thermosensitive layer coating liquid (2) having a composition below was coated on the aluminum supports 1 to 3 and the aluminum supports for comparative examples 1 and 2 obtained above, dried in an oven at 60° C. for 150 sec., thereby obtaining the presensitized plates of Examples 4 to 6 and Comparative Examples 3 and 4. The dry coating quantity of the thermosensitive layer (2) was 0.7 g/m$^2$.

<Composition of Thermosensitive Layer Coating Liquid (2)>
Microcapsule liquid synthesized above 5 g (solid content)
Trimethylol propane triacrylate 3 g
Photothermal conversion agent (IR-11 in the present specification) 0.3 g
Water 60 g
1-methoxy-2-propanol 40 g 1-4. Measurement of Atomicity Ratio of Carbon to Aluminum (C/Al) in a Section of the Anodized Layer After Thermosensitive Layer was Provided For Examples 1 to 6 and Comparative Examples 1 to 4, measurement was made, of an atomicity ratio (C/Al) of carbon to aluminum in a section.

A section of the anodized layer was formed by bending the presensitized plate substantially at 180° immediately before analysis. After fixing to the sample holder provided in the Auger Electron Spectroscopic analyzer and introducing into the analyzer, Auger Electron Spectroscopic analysis was carried out.

From an obtained chart, $I_c$ and $I_{al}$ were calculated. A value of $S_c$ was set to 0.076, a value of $S_{al}$ to 0.105, and the calculated values of $I_c$ and $I_{al}$ were substituted for $I_c$ and $I_{a1}$ in the foregoing formula (1), and thus C/Al was calculated. A result is shown in Table 2.

Auger Electron Spectroscopic analysis was carried out at 5 points of positions of about 0.2 μm from an interface between the thermosensitive layer and the anodized layer in the section of the anodized layer, and C/Al was calculated as average value thereof.

Conditions for Auger Electron Spectroscopic analysis were as follows.

Measuring device: FE-AES model SMART-200, manufactured by ULVAC-PHI, Inc.
Irradiation current: about 10 nA
Acceleration voltage: 10 kV
Irradiation electron beam diameter: focused
Chamber inner pressure: about $1\times10^{-10}$ Torr (about $1.33\times10^{-8}$ Pa)
Detection range: 20 to 2020 eV, 0 eV/step, 20 ms/step
Multiplier voltage: 2250 V 1-5. Measurement of Sensitivity Examples 1 to 3 and Comparative Examples 1 and 2

The presensitized plates of Examples 1 to 3 and the Comparative Examples 1 and 2, which can be developed on machine, were subjected to exposure by using Trendsetter 3244 VFS from Creo Inc., having a water-cooled 40 W infrared semiconductor laser loaded, and by outputting under a condition of resolution 2400 dpi. At the same timer plate surface energy was changed by changing a revolutionary speed of an outer surface drum, and a sensitivity was evaluated based on a lowest exposure quantity for enabling image formation. A result is shown in Table 2.

Examples 4 to 6 and Comparative Examples 3 and 4

The presensitized plates of Examples 4 to 6 and Comparative Examples 3 and 4, which can be developed on machine, were subjected to exposure by using Luxel T-9000 CTP by Fuji Photo Film Co., Ltd., having a multichannel laser head loaded, and by outputting under a condition of resolution 2400 dpi. At the same time, an outputting per 1 beam and a revolutionary speed of an outer surface drum were changed, and a sensitivity was evaluated based on a lowest exposure quantity for enabling image formation. A result is shown in Table 2.

1-6. Printing Test

After the presensitized plates of Examples 1 to 6, and the comparative examples 1 to 4 were subjected to exposure as described above, without any treatments, the plates were attached to a cylinder of printing machine SOR-M made by Heidelberg. After fountain solution was supplied, ink was fed, and a paper was fed, carrying out printing test. For all the presensitized plates of Examples, on-machine development was carried out without any problems, and so was printing.

In the foregoing printing test, scum, scum after being left (ink removal), and press life were evaluated by the following methods. Results are all shown in Table 2.

(1) Scum

In the printing test, a water scale of the printing machine was adjusted, and scum was evaluated based on a water scale where scum occurred. If a water scale where scum occurred was less than 2, it was indicated by ○, if it was 2 or more and less than 3, ○Δ, and if it was 3 or more and less than 4, Δ, and if it was 4 or more, x.

(2) Scum After Being Left (Ink Removal)

After on-machine development, only ink was supplied to the printing plate, then fountain solution was supplied, and the number of printed sheets was counted until the ink was removed, and thus, a clear print was obtained. The smaller the number of printed sheets is, the better the resistance to scum after being left (ink removability) is.

(3) Press Life

Number of printed sheets was counted while a clear print was obtained, and thus press life was evaluated. The more the number of clearly printed sheets is, the better the press life is.

From Table 2, it can be understood that the presensitized plates of the present invention (Examples 1 to 6) had high sensitivities, the scum was difficult to occur, resistance to scum after being left (ink removability) was high, and press life was long.

On the other hand, if C/Al was too large in the section of the anodized layer after the thermosensitive layer is provided (Comparative Examples 1 to 4), one of the following problems occurs, that is, easy occurrence of scum and low resistance to scum after being left (ink removability), or a low sensitivity and short press life.

TABLE 2

| | Support | Thermo-sensitive layer | C/Al | Porosity (%) | Micropore diameter (nm) | Scum | Scum after being left | Sensi-tivity (m/cm$^2$) | Press life(number Of 1000 sheets) |
|---|---|---|---|---|---|---|---|---|---|
| Example 1 | 1 | (1) | 0.88 | 60 | 40 | ○Δ | 19 | 190 | 2.2 |
| Example 2 | 2 | (1) | 0.65 | 55 | 8 | ○ | 15 | 180 | 1.9 |
| Example 3 | 3 | (1) | 0.62 | 40 | 12 | ○ | 16 | 180 | 2.0 |
| Comparative Example 1 | 4 | (1) | 1.09 | 15 | 10 | ○ | 19 | 370 | 0.1 |
| Comparative Example 2 | 5 | (1) | 1.10 | 40 | 15 | X | 48 | 250 | 0.5 |
| Example 4 | 1 | (2) | 0.88 | 60 | 40 | ○Δ | 19 | 230 | 1.8 |
| Example 5 | 2 | (2) | 0.65 | 55 | 8 | ○ | 15 | 220 | 1.7 |
| Example 6 | 3 | (2) | 0.62 | 40 | 12 | ○ | 16 | 200 | 2.0 |
| Comparative Example 3 | 4 | (2) | 1.09 | 15 | 10 | ○Δ | 19 | 390 | 0.1 |
| Comparative Example 4 | 5 | (2) | 1.10 | 40 | 15 | X | 48 | 270 | 0.5 |

2-1. Preparation of Presensitized Plate

Example 7

As a plqte, an aluminum plate having a thickness of 0.24 mm, defined in JIS A1050, was used and, executing the following treatments to manufacture an aluminum support.

(a) Etching with Alkali Agent

An aluminum plate was subjected to etching by spraying a solution having caustic soda concentration of 26 wt % and aluminum ion concentration of 6.5 wt %, at a temperature of 70° C., and the aluminum plate was dissolved by 6 g/m$^2$. Then, wash was carried out by spraying.

(b) Desmutting

Desmutting was carried out by spraying aqueous solution of nitric acid concentration of 1 wt % (containing 0.5 wt % of aluminum ion) at a temperature of 30° C. Then, wash was carried out by spraying. For the nitric acid aqueous solution used in the desmuitting, waste liquid in a step of electrochemical graining was used, the step being carried out by using an alternating current in the nitric acid aqueous solution.

(c) Electrochemical Graining

Electrochemical graining was carried out continuously by using an AC voltage of 60 Hz. Electrolyte in this case was aqueous solution of nitric acid 1 wt % (containing 0.5 wt % of aluminum ion, and 0.007 wt % of ammonium ion), and a temperature was 50° C. A waveform of an AC power supply was the waveform shown in FIG. 2. Time TP for a current value to reach a peak from 0 was 2 msec., a DUTY ratio was 1:1. a trapezoidal rectangular wave alternating current was used, and a carbon electrode was set as a counter electrode. Under these conditions, the ectrochemical graining was carried out. Ferrite was used for an auxiliary anode. Two electrolytic cells were used, each was as shown in FIG. 3

A current density was 30 A/dm$^2$ at a peak current value, and the total of the quantity of electricity when the aluminum plate was at the anode side was 270 c/dm$^2$. Current flowing from the power supply was divided to the auxiliary anode by 5%.

Then, wash was carried out by spraying.

(d) Etching

An aluminum plate was subjected to etching by spraying solution having caustic soda concentration of 26 wt % and aluminum ion concentration of 6.5 wt %, at a temperature of 70° C., and the aluminum plate was dissolved by 0.2 g/m$^2$. A smut component was removed, the smut mainly containing aluminum hydroxide generated in the electrochemical graining executed by using the alternative current in the previous stage, and an edge portion of a generated pit was solved to smooth the edge portion. Then, wash was carried out by spraying.

(e) Desmutting

Desmutting was carried out by spraying aqueous solution of sulfuric acid concentration of 25 wt % (containing 0.5 wt % of aluminum ion) at a temperature of 60° C. Then, the plate was washed by spraying, and dried, thus obtaining a substrate 1.

(f) Anodizing

The substrate 1 was subjected to anodizing in electrolyte of sulfuric acid concentration 170 g/L, at a temperature of 33° C., and a current density of 5A/dm$^2$, with a direct current for 66 sec. Thus, an anodized layer was formed.

(g) Pore Widening

Pore widening was carried out by dipping the substrate 1 after the anodizing in sodium hydroxide aqueous solution of pH 13 at a temperature of 30° C. for 60 sec., then washing it, and drying it.

(h) Formation of Particle Layer

The substrate 1 after the pore widening, was treated by being dipped at a liquid temperature of 70° C. for 14 sec. in a solution obtained by diluting alumina sol dispersant (Alumina sol 520, Nissan Chemical Industries, Ltd., 20 wt % of solid content ($Al_2O_3$)) containing $Al_2O_3$ of an average particle size 10 to 20 nm by purified water such that solid content is set to 0.2 wt %. Then, the substrate was washed, and dried, thus forming a particle layer.

(i) Hydrophilic Treatment

Hydrophilic treatment (silicate treatment) was carried out by continuously dipping the substrate 1 after the particle layer was formed, in aqueous solution of 3rd sodium silicate 2.5 wt %. A treatment liquid temperature was 70° C., and dipping time was 10 sec. Then, the substrate was washed by spraying, and dried. Thus, a support for a lithographic printing plate having the particle layer formed on the anodized layer was obtained.

(j) Formation of Thermosensitive Layer

As described below, thermosensitive layer coating liquid was applied on the obtained support for a lithographic printing plate, and dried, thus providing a presensitized plate.

The thermosensitive layer coating liquid having a composition described below was prepared. This thermosensitive layer coating liquid was coated on the support for a lithographic printing plate by using the bar coater so as to set the quantity of coating (thermosensitive layer coating quantity) after drying to 0.7 g/$m^2$. Then, it was dried by using an oven at 100° C. for 60 sec., thus forming a thermosensitive layer. Therefore, presensitized plate was obtained.

| <Composition of thermosensitive layer coating liquid> | |
|---|---|
| Later-described microcapsule liquid content 5 g) | 25 g (solid |
| Trimethylol propane triacrylate | 3 g |
| Infrared ray absorbent dye described in the present specification (IR-11) | 0.3 g |
| Water | 60 g |
| 1-methoxy-2-propanol | 1 g |

<Microcapsule>

Xylene diisocyanate 40 g, trimethylol proplane diacrylate 10 g, copolymer (mol ratio 7/3) 10 g of allylmethacrylate and butylmethacrylate and surfactant (Paionin A41C, Takemoto Oil & Pat Co., Ltd.) 0.1 g were dissolved in ethyl acetate 60 g to form an oil phase component. On the other hand, aqueous solution containing 4% of polyvinyl alcohol (PVA 205, Kuraray Co., Ltd.) was prepared by 120 g to form a water phase component. The oil and water phase components were supplied to the homogenizer, and used at 10,000 rpm for 10 min., and emulsified. Then, water was added by 40 g, stirring was carried out at a room temperature for 30 min., stirring was further carried out at 40° for 3 hours, and thus microcapsule liquid was obtained. Solid content of the obtained microcapsule liquid was 20 wt %, and an average particle size of the microcapsules was 0.5 μm.

Examples 8 to 10

A presensitized plate was obtained by a method similar to that of Example 7, except for use of colloidal silica dispersant of an average particle size shown in Table 3 (Snowtex N, Snowtex XL and Snowtex ZL; all by Nissan Chemical Industries, Ltd.) in place of the alumina sol dispersant, in the (h) formation of the particle layer.

Examples 11 and 12

A presensitized plate was obtained by a method similar to that of Example 7, except for use of water suspension containing $Al_2O_3$ of an average particle size shown in Table 3 in place of the alumina sol dispersant, in the (h) formation of the particle layer.

Example 13

A presensitized plate was obtained by a method similar to that of Example 7, except for execution of hydrophilic treatment by dipping the sustrate 1 after the formation of the particle layer in aqueous solution containing 1 wt % of polyvinyl phosphonic acid at 50° C. for 10 sec., in place of the (i) hydrophilic treatment.

Example 14

A presensitized plate was obtained by a method similar to that of Example 13, except for use of colloidal silica dispersant of an average particle size of 10 to 20 μm (Snowtex N, Nissan Chemical Industries, Ltd.) in place of the alumina sol dispersant, in the (h) formation of the particle layer.

Example 15

A presensitized plate was obtained by a method similar to that of Example 7, except for non-execution of the (i) hydrophilic treatment.

Example 16

A presensitized plate was obtained by a method similar to that of Example 8, except for non-execution of the (i) hydrophilic treatment.

Examples 17 to 19

A presensitized plate was obtained by a method similar to that of Example 7, except for various change s of the solid content after the dilution of the alumina sol dispersant to solid contents in Table 3, in the (h) formation of the particle layer.

Examples 20 and 21

A presensitized plate was obtained by a method similar to that of Example 7, except for various changes of a temperature into those shown in Table 3, in the (h) formation of the particle layer.

Examples 22 and 23

A presensitized plate was obtained by a method similar to that of Example 7, except for various changes of the dipping time into dipping times shown in Table 3, in the (h) formation of the particle layer.

Example 24

A presensitized plate was obtained by a method similar to that of Example 7, except for non-execution of the (g) pore widening.

Examples 25 to 27

A presensitized plate was obtained by a method similar to that of Example 7, except for various changes of the dipping time into dipping times shown in Table 3, in the (g) pore widening.

Example 28

A presensitized plate was obtained by a method similar to that of Example 7, except for the fact that in place of the dipping in the (h) formation of the particle layer, the substrate 1 after the pore widening was subjected to rotary coating by Wheeler (Kitamura Shashin Seihan Youhin Seizou) at 180 rpm for 10 sec., using solution obtained by diluting alumina sol dispersant (Alumina sol 520, Nissan Chemical Industries, Ltd., solid content ($Al_2O_3$) 20 wt %) containing $Al_2O_3$ particles having an average particle size of 10 to 20 nm with mixed solution containing 10 wt % of purified water and 90 wt % of methanol so as to set the solid content to 0.2 wt %, then the substrate was dried in an oven (thermoregulater SHP-201, Tabai Espec Corp.) at a temperature of 120° C. for 1 min, and thus a particle layer was formed.

Examples 29 to 31

A presensitized plate was obtained by a method similar to that of Example 28, except for use of colloidal silica dispersant of an average particle size shown in Table 5 (Snowtex N, Snowtex XL, and Snowtex ZL; all by Nissan Chemical Industries, Ltd.) in place of the alumina sol dispersant, in the (h) formation of the particle layer.

Examples 32 and 33

A presensitized plate was obtained by a method similar to that of Example 28, except for use of water suspension containing $Al_2O_3$ having an average particle size shown in Table 5 in place of the alumina sol dispersant, in the (h) formation of the particle layer.

Example 34

A presensitized plate was obtained by a method similar to that of Example 28, except for execution of hydrophilic treatment by dipping the sustrate 1 after the formation of the particle layer in aqueous solution containing 1 wt % of polyvinyl phosphonic acid at 50° C. for 10 sec., in place of the (i) hydrophilic treatment.

Example 35

A presensitized plate was obtained by a method similar to that of Example 34, except for use of colloidal silica dispersant of an average particle size of 10 to 20 μm (Snowtex N, Nissan Chemical Industries, Ltd.) in place of the alumina sol dispersant, in the (h) formation of the particle layer.

Example 36

A presensitized plate was obtained by a method similar to that of Example 28, except for non-execution of the (i) hydrophilic treatment.

Example 37

A presensitized plate was obtained by a method similar to that of Example 29, except for non-execution of the (i) hydrophilic treatment.

Examples 38 to 40

A presensitized plate was obtained by a method similar to that of Example 28, except for various change s of the solid content after the dilution of the alumina dispersant into solid contents shown in Table 5, in the (h) formation of the particle layer.

Example 41

A presensitized plate was obtained by a method similar to that of Example 28, except for non-execution of the (g) pore widening.

Examples 42 to 44

A presensitized plate was obtained by a method similar to that of Example 28, except for various changes of the dipping time into dipping times shown in Table 5, in the (g) pore widening.

Example 45

A presensitized plate was obtained by a method similar to that of Example 7, except for the fact that in the (h) formation of the particle layer, constant-voltage electrolysis was carried out by a voltage 110 V for 60 sec., using the substrate 1 after the pore widening as a cathode, and water suspension containing 0.5 wt % of $Al_2O_3$ particles having an average particle size of 15 nm as the electrolyte, then the substrate was washed, and dried, thus forming a particle layer.

2-2. Observation of Section of Presensitized Plate

For each presensitized plate, a section of a non-image area after on-machine development using fountain solution was observed by a scanning electron microscope (S-900, Hitachi, Ltd.) at an acceleration voltage of 12 kV, with no vapor deposition, and magnification of 5 to 150,000.

Figure 5:
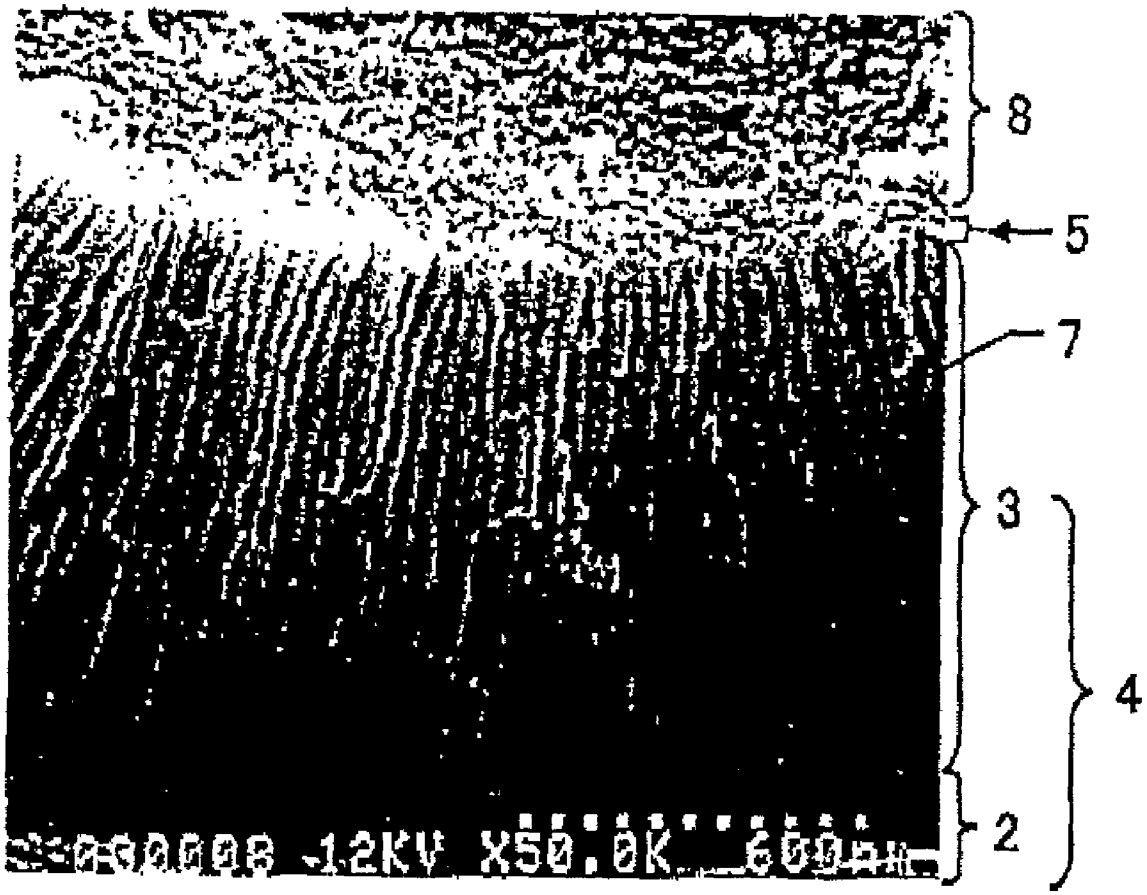
FIG. 5 is a view showing an electron micrograph in a section of an example of the presensitized plate obtained according to the second aspect of the present invention.

FIG. 5 shows an SEM photograph of a section of a non-image area after on-machine development using fountain solution of the presensitized plate obtained in Example 7. It can be understood that a particle layer 5 was present on an aluminum support 4 including an anodized layer 3 formed on an aluminum plate 2. It can also be understood that a micropore 7 present on the anodized layer 3 was covered with the particle layer 5, but it had voids inside. In FIG. 5, not only the section of the presensitized plate but also a surface 8 of the non-image area are seen.

The presensitized plates of Examples 8 to 45 were in states similar to the above.

2-3. Micropore Diameter on Surface of Anodized Layer of Presensitized Plate

For each presensitized plate, by a method similar to the foregoing, a micropore diameter on the surface of the anodized layer of the non-image area after the on-machine development using fountain solution was calculated, shown in Tables 3 and 5.

2-4. Porosity of Anodized Layer of Presensitized Plate

For each presensitized plate, porosity of the anodized layer was calculated by a method similar to the foregoing, and shown in Tables 3 and 5.

2-5. Thermal Conductivity of Hydrophilic Particles of Particle Layer of Presensitized Plate A thermal conductivities of hydrophilic particles shown in Tables 3 and 5 are in accordance with "Fine Ceramics Jiten (Dictionary of Fine Ceramics)" by Fine Ceramics Jiten Hensyu Iinkai (Fine Ceramics Dictionary Editorial Committee), "Fine Ceramics Gijutsu Handbook (Fine Ceramics Technology Handbook)" by Shorai Kakou Gijutsu Dai 136 Iinkai (Future Processing Technology 136$^{th}$ Committee) at Japan Society for the Promotion of Science, and "Kagaku Binran (Chemical Manual)" (Maruzen) edited by The Chemical Society of Japan.

2-6. Measurement of Atomicity Ratio of Carbon to Aluminum (C/Al) in Section of Anodized Layer After Thermosensitive Layer was Provided For the presensitized plates of Examples 7 to 45, by a method similar to the foregoing, measurement was made for an atomicity ratio (C/Al) of carbon to aluminum in the section. Results are shown in Tables 3 and 5.

2-7. Sensitivity of Presensitized Plate

Each presensitized plate was subjected to image exposure at 2400 dpi using Plate Setter Trendsetter 3244F (multibeam of 192 channels is loaded) from Creo, after various parameters (Sr, Sd, bmslope and bmcurve) were adjusted. The exposure was carried out by changing a drum revolutionary speed and output in stages. After the exposure, development was carried out on the printing machine, and the quantity of energy which was capable of forming 1% dots was set as a sensitivity of the presensitized plate. Results are shown in Tables 4 and 6.

2-8. Press Life and Scum Resistance

Each exposed presensitized plate was attached to the printing machine, then development was carried out on the printing machine by supplying ink after fountain solution was supplied, and subsequently printing was carried out. Here, as the printing machine, a printing machine sprint from Komori Insatsuki, was used. As ink, Geos Black from Dainippon Ink And Chemicals, Inc. was used. As fountain solution, a mixture of 90 vol % of water diluted solution of fountain solution EU-3 (1:100) from Fuji Photo Film Co., Ltd., and 10 vol % of isopropanol was used. As a paper for printing, woodfree paper was used.

The printing was carried out under the foregoing conditions. The number of sheets with no ink adhered on the image area was counted, to evaluate the press life. Results are shown in Tables 4 and 6.

In addition, after 500 sheets were printed under the foregoing conditions, the lithographic printing plate was removed from the printing machine, and left in a room for 30 min. Then, it was attached to the printing machine again, supplying of fountain solution, ink and sheets were simultaneously started. The number of loss sheets was counted until ink sticking disappeared in an area corresponding to the non-image area of a print, and a non-image area having no scum was formed, and set as evaluation of scum resistance. Smaller the number of loss sheets is, higher the scum resistance is. Results are shown in Tables 4 and 6.

As apparent from Tables 3 to 6, the presensitized plates obtained by the manufacturing methods (Examples 7 to 45) of presensitized plates in accordance with the second aspect of the present invention were all high in sensitivity, press life and scum resistance.

In the case where the particle layer was provided by the electrolysis (Example 45), the presensitized plate was high in sensitivity and press life, but lower in scum resistance compared with the case when the particle layer was provided by dipping or coating (Examples 11 and 32).

TABLE 3

| | Anodized layer | | | | | Particle layer | | | | | | | |
|---|---|---|---|---|---|---|---|---|---|---|---|---|---|
| | | Pore widening | | Micropore | | | | | | | | | |
| | Electrolyte | Temperature (° C.) | Time (sec.) | diameter (nm) | Porosity (%) | Kind of treatment liquid | Average particle size of particles (nm) | Thermal conductivity of particles (W/(m · k)) | Forming method | Concentration of treatment liquid (wt %) | Treatment liquid temperature (° C.) | Treatment time | C/Al |
| Example 7 | Sulfuric acid | 30 | 60 | 15 | 50 | Aluminasol 520 | 10~20 | 36 | Dipping | 0.2 | 70 | 14 | 0.64 |
| Example 8 | Sulfuric acid | 30 | 60 | 15 | 50 | Snowtex N | 10~20 | 10 | Dipping | 0.2 | 70 | 14 | 0.68 |
| Example 9 | Sulfuric acid | 30 | 60 | 15 | 50 | Snowtex XL | 40~60 | 10 | Dipping | 0.2 | 70 | 14 | 0.78 |
| Example 10 | Sulfuric acid | 30 | 60 | 15 | 50 | Snowtex ZL | 70~100 | 10 | Dipping | 0.2 | 70 | 14 | 0.82 |
| Example 11 | Sulfuric acid | 30 | 60 | 15 | 50 | $Al_2O_3$ water suspension | 15 | 36 | Dipping | 0.2 | 70 | 14 | 0.74 |
| Example 12 | Sulfuric acid | 30 | 60 | 15 | 50 | $Al_2O_3$ water suspension | 750 | 36 | Dipping | 0.2 | 70 | 14 | 0.88 |
| Example 13 | Sulfuric acid | 30 | 60 | 15 | 50 | Aluminasol 520 | 10~20 | 36 | Dipping | 0.2 | 70 | 14 | 0.58 |
| Example 14 | Sulfuric acid | 30 | 60 | 15 | 50 | Snowtex N | 10~20 | 10 | Dipping | 0.2 | 70 | 14 | 0.54 |
| Example 15 | Sulfuric acid | 30 | 60 | 15 | 50 | Aluminasol 520 | 10~20 | 36 | Dipping | 0.2 | 70 | 14 | 0.64 |
| Example 16 | Sulfuric acid | 30 | 60 | 15 | 50 | Snowtex N | 10~20 | 10 | Dipping | 0.2 | 70 | 14 | 0.54 |
| Example 17 | Sulfuric acid | 30 | 60 | 15 | 50 | Aluminasol 520 | 10~20 | 36 | Dipping | 0.01 | 70 | 14 | 0.92 |
| Example 18 | Sulfuric acid | 30 | 60 | 15 | 50 | Aluminasol 520 | 10~20 | 36 | Dipping | 5 | 70 | 14 | 0.64 |
| Example 19 | Sulfuric acid | 30 | 60 | 15 | 50 | Aluminasol 520 | 10~20 | 36 | Dipping | 10 | 70 | 14 | 0.72 |
| Example 20 | Sulfuric acid | 30 | 60 | 15 | 50 | Aluminasol 520 | 10~20 | 36 | Dipping | 0.2 | 10 | 14 | 0.59 |
| Example 21 | Sulfuric acid | 30 | 60 | 15 | 50 | Aluminasol 520 | 10~20 | 36 | Dipping | 0.2 | 85 | 14 | 0.69 |

TABLE 3-continued

| | Anodized layer | | | | | Particle layer | | | | | | | |
|---|---|---|---|---|---|---|---|---|---|---|---|---|---|
| | | Pore widening | | Micro-pore | | | | | | | | | |
| | Electro-lyte | Tempera-ture (° C.) | Time (sec.) | dia-meter (nm) | Poro-sity (%) | Kind of treatment liquid | Average particle size of particles (nm) | Thermal con-ductiv-ity of particles (W/(m · k)) | Form-ing method | Concentra-tion of treatment liquid (wt %) | Treatment liquid temperature (° C.) | Treatment time | C/Al |
| Example 22 | Sulfuric acid | 30 | 60 | 15 | 50 | Aluminasol 520 | 10~20 | 36 | Dipping | 0.2 | 70 | 2 | 0.64 |
| Example 23 | Sulfuric acid | 30 | 60 | 15 | 50 | Aluminasol 520 | 10~20 | 36 | Dipping | 0.2 | 70 | 120 | 0.58 |
| Example 24 | Sulfuric acid | — | — | 7 | 16 | Aluminasol 520 | 10~20 | 36 | Dipping | 0.2 | 70 | 14 | 0.59 |
| Example 25 | Sulfuric acid | 30 | 30 | 10 | 25 | Aluminasol 520 | 10~20 | 36 | Dipping | 0.2 | 70 | 14 | 0.69 |
| Example 26 | Sulfuric acid | 30 | 65 | 18 | 60 | Aluminasol 520 | 10~20 | 36 | Dipping | 0.2 | 70 | 14 | 0.68 |
| Example 27 | Sulfuric acid | 30 | 70 | 20 | 75 | Aluminasol 520 | 10~20 | 36 | Dipping | 0.2 | 70 | 14 | 0.79 |

TABLE 4

| | Hydrophilic treatment | Sensitivity ($mJ/cm^2$) | Press life (1000 sheets) | Scum resistance (sheets) |
|---|---|---|---|---|
| Example 7 | Silicate | 250 | 15 | 18 |
| Example 8 | Silicate | 250 | 14 | 18 |
| Example 9 | Silicate | 250 | 14 | 18 |
| Example 10 | Silicate | 250 | 13 | 18 |
| Example 11 | Silicate | 250 | 13 | 20 |
| Example 12 | Silicate | 250 | 12 | 20 |
| Example 13 | Polyvinyl phosphonic acid | 250 | 14 | 20 |
| Example 14 | Polyvinyl phosphonic acid | 250 | 14 | 20 |
| Example 15 | None | 250 | 15 | 23 |
| Example 16 | None | 250 | 14 | 23 |
| Example 17 | Silicate | 300 | 12 | 20 |
| Example 18 | Silicate | 250 | 14 | 15 |

TABLE 4-continued

| | Hydrophilic treatment | Sensitivity ($mJ/cm^2$) | Press life (1000 sheets) | Scum resistance (sheets) |
|---|---|---|---|---|
| Example 19 | Silicate | 250 | 12 | 23 |
| Example 20 | Silicate | 300 | 12 | 18 |
| Example 21 | Silicate | 250 | 14 | 23 |
| Example 22 | Silicate | 300 | 12 | 20 |
| Example 23 | Silicate | 280 | 15 | 23 |
| Example 24 | Silicate | 320 | 12 | 15 |
| Example 25 | Silicate | 280 | 12 | 15 |
| Example 26 | Silicate | 250 | 15 | 18 |
| Example 27 | Silicate | 280 | 15 | 20 |

TABLE 5

| | Anodized layer | | | | | Particle layer | | | | | |
|---|---|---|---|---|---|---|---|---|---|---|---|
| | | Pore widening | | Micro- | | | | | | | |
| | Electro-lyte | Tempera-ture (° C.) | Time (sec.) | pore diameter (nm) | Porosity (%) | Kind of treatment liquid | Average particle size of particles (nm) | Thermal conductivity of particles (W/(m · k)) | Forming method | Concentration of treatment liquid (wt %) | C/Al |
| Example 28 | Sulfuric acid | 30 | 60 | 15 | 50 | Aluminasol 520 | 10~20 | 36 | Coating | 0.2 | 0.62 |
| Example 29 | Sulfuric acid | 30 | 60 | 15 | 50 | Snowtex N | 10~20 | 10 | Coating | 0.2 | 0.64 |
| Example 30 | Sulfuric acid | 30 | 60 | 15 | 50 | Snowtex XL | 40~60 | 10 | Coating | 0.2 | 0.72 |

TABLE 5-continued

| | Anodized layer | | | | | Particle layer | | | | | |
|---|---|---|---|---|---|---|---|---|---|---|---|
| | | Pore widening | | | | | | | | | |
| | Electrolyte | Temperature (° C.) | Time (sec.) | Micro-pore diameter (nm) | Porosity (%) | Kind of treatment liquid | Average particle size of particles (nm) | Thermal conductivity of particles (W/(m · k)) | Forming method | Concentration of treatment liquid (wt %) | C/Al |
| Example 31 | Sulfuric acid | 30 | 60 | 15 | 50 | Snowtex ZL | 70~100 | 10 | Coating | 0.2 | 0.83 |
| Example 32 | Sulfuric acid | 30 | 60 | 15 | 50 | $Al_2O_3$ water suspension | 15 | 36 | Coating | 0.2 | 0.72 |
| Example 33 | Sulfuric acid | 30 | 60 | 15 | 50 | $Al_2O_3$ water suspension | 750 | 36 | Coating | 0.2 | 0.88 |
| Example 34 | Sulfuric acid | 30 | 60 | 15 | 50 | Aluminasol 520 | 10~20 | 36 | Coating | 0.2 | 0.58 |
| Example 35 | Sulfuric acid | 30 | 60 | 15 | 50 | Snowtex N | 10~20 | 10 | Coating | 0.2 | 0.52 |
| Example 36 | Sulfuric acid | 30 | 60 | 15 | 50 | Aluminasol 520 | 10~20 | 36 | Coating | 0.2 | 0.57 |
| Example 37 | Sulfuric acid | 30 | 60 | 15 | 50 | Snowtex N | 10~20 | 10 | Coating | 0.2 | 0.53 |
| Example 38 | Sulfuric acid | 30 | 60 | 15 | 50 | Aluminasol 520 | 10~20 | 36 | Coating | 0.01 | 0.89 |
| Example 39 | Sulfuric acid | 30 | 60 | 15 | 50 | Aluminasol 520 | 10~20 | 36 | Coating | 5 | 0.62 |
| Example 40 | Sulfuric acid | 30 | 60 | 15 | 50 | Aluminasol 520 | 10~20 | 36 | Coating | 10 | 0.74 |
| Example 41 | Sulfuric acid | — | — | 7 | 16 | Aluminasol 520 | 10~20 | 36 | Coating | 0.2 | 0.58 |
| Example 42 | Sulfuric acid | 30 | 30 | 10 | 25 | Aluminasol 520 | 10~20 | 36 | Coating | 0.2 | 0.68 |
| Example 43 | Sulfuric acid | 30 | 65 | 18 | 60 | Aluminasol 520 | 10~20 | 36 | Coating | 0.2 | 0.62 |
| Example 44 | Sulfuric acid | 30 | 70 | 20 | 75 | Aluminasol 520 | 10~20 | 36 | Coating | 0.2 | 0.69 |
| Example 45 | Sulfuric acid | 30 | 60 | 15 | 50 | $Al_2O_3$ water suspension | 15 | 36 | Electrolysis | 0.5 | 0.72 |

TABLE 6

| | Hydrophilic treatment | Sensitivity ($mJ/cm^2$) | Press life (1000 sheets) | Scum resistance (sheets) |
|---|---|---|---|---|
| Example 28 | Silicate | 250 | 16 | 20 |
| Example 29 | Silicate | 250 | 15 | 18 |
| Example 30 | Silicate | 250 | 15 | 18 |
| Example 31 | Silicate | 250 | 15 | 18 |
| Example 32 | Silicate | 250 | 13 | 20 |
| Example 33 | Silicate | 250 | 12 | 20 |
| Example 34 | Polyvinyl phosphonic acid | 250 | 15 | 20 |
| Example 35 | Polyvinyl phosphonic acid | 250 | 15 | 20 |
| Example 36 | None | 250 | 16 | 25 |
| Example 37 | None | 250 | 15 | 25 |
| Example 38 | Silicate | 300 | 12 | 20 |
| Example 39 | Silicate | 250 | 14 | 20 |
| Example 40 | Silicate | 250 | 14 | 23 |
| Example 41 | Silicate | 320 | 12 | 18 |
| Example 42 | Silicate | 280 | 14 | 18 |
| Example 43 | Silicate | 250 | 16 | 20 |
| Example 44 | Silicate | 280 | 15 | 25 |
| Example 45 | Silicate | 300 | 12 | 45 |

In the presensitized plate according to the first aspect of the present invention, C/Al in the section of the anodized layer after the recording layer is provided is a predetermined value or less. Thus, a good on-machine development characteristic is provided, a sensitivity is high, press life is high, and scum resistance during printing and after being left (ink removability) are high. In this case, by the method of making a lithographic printing plate and printing of the present invention, wherein executing printing by subjecting the presensitized plate to image exposure with a laser beam, and directly attaching the plate to a printing machine, or by subjecting the presensitized plate to image exposure with a laser beam after the plate is attached to the printing machine, development can be carried out on the printing machine without performing any other developments, and the printing can be continued. Thus, the method is advantageous.

In the presensitized plate according to the first aspect of the present invention, since C/Al in the section of the anodized layer after the recording layer is provided is a predetermined value or less, even when the exposure quantity of infrared laser is low, or a liquid sensitivity of developer is low, solubility to the developer becomes high. Thus, a sensitivity is high, development latitude is wide, residual layers are limited even during low exposure making it difficult for the non-image area to be stained.

In the presensitized plate of the present invention, since C/Al in the section of the anodized layer after the recording layer is provided is a predetermined value or less, insolubility of the laser exposed portion to the developer becomes high. Thus, a sensitivity is high, and press life is high.

In the manufacturing method of the presensitized plate according to the second aspect of the present invention, heat can be efficiently used for image formation, and a presensitized plate high in sensitivity, press life and scum resistance can be provided. Thus, this presensitized plate can be suitably used for both of thermal positive working type and thermal negative working type. Moreover, it can be suitably used for the on-machine development type. Thus, the presensitized plate is very useful.

What is claimed is:

1. A presensitized plate comprising:

a support for a lithographic printing plate including an anodized layer formed on an aluminum plate and a recording layer recordable by infrared laser exposure on the support, wherein in a section of the anodized layer after the recording layer is provided, an atomicity ratio of carbon to aluminum (C/Al) represented by a following formula (1) is 1.0 or less:

$$C/Al=(I_c/S_c)/(I_{al}/S_{al}) \quad (1)$$

$I_c$: carbon (KLL) Auger electron differential peak-to-peak amplitude $I_{al}$: aluminum (KLL) Auger electron differential peak-to-peak amplitude $S_c$: relative sensitivity factor of carbon (KLL) Auger electron $S_{al}$: relative sensitivity factor of aluminum (KLL) Auger electron wherein the recording layer is formed on the anodized layer directly or through an undercoat layer, and the recording layer is a thermosensitive layer containing a fine particle polymer having a thermo-reactive functional group, or microcapsules containing a compound having a thermo-reactive functional group, a thermosensitive layer using a negative working infrared laser recording material, a thermosensitive layer using a positive infrared laser recording material comprising alkali soluble polymer, a compound dissolved with the alkali soluble polymer to reduce alkaline solubility, and a compound for absorbing infrared radiation, or a thermosensitive layer using a sulfonate type infrared laser recording material.

2. A presensitized plate according to claim 1, wherein the recording layer is a thermosensitive layer containing:

(a) fine particle polymer having a thermo-reactive functional group, or (b) a microcapsule containing a compound having a thermo-reactive functional group.

3. A method of making a lithographic printing plate and printing, comprising a step of:

executing printing by subjecting a presensitized plate described in claim 2 to image exposure with a laser beam, and directly attaching the plate to a printing machine, or by subjecting the presensitized plate to image exposure with a laser beam after the plate is attached to the printing machine.

4. A method of making a lithographic printing plate and printing, comprising a step of:

executing printing by subjecting a presensitized plate described in claim 1 to image exposure with a laser beam, and directly attaching the plate to a printing machine, or by subjecting the presensitized plate to image exposure with a laser beam after the plate is attached to the printing machine.

5. A presensitized plate comprising:

a support for a lithographic printing plate including an anodized layer formed on an aluminum plate and a recording layer recordable by infrared laser exposure on the support, wherein in a section of the anodized layer after the recording layer is provided, an atomicity ratio of carbon to aluminum (C/Al) represented by a following formula (1) is 1.0 or less:

$$C/Al=(I_c/S_c)/(I_{al}/S_{al}) \quad (1)$$

$I_c$: carbon (KLL) Auger electron differential peak-to-peak amplitude $I_{al}$: aluminum (KLL) Auger electron differential peak-to-peak amplitude $S_c$: relative sensitivity factor of carbon (KLL) Auger electron $S_{al}$: relative sensitivity factor of aluminum (KLL) Auger electron;

wherein the recording layer is formed on the anodized layer directly or through an undercoat layer, and the recording layer is a thermosensitive layer contains a fine particle polymer having a thermo-reactive functional group, or microcapsules containing a compound having a thermo-reactive functional group, a thermosensitive layer using a negative working infrared laser recording material, thermosensitive layer using a positive infrared laser recording material, or a thermosensitive layer using a sulfonate type infrared laser recording material, wherein said support has a particle layer containing particles having an average particle size of 8 to 800 nm and said recording layer recordable by infrared laser exposure formed in this order on the support.

6. A presensitized plate according to claim 5, wherein the recording layer is a thermosensitive layer containing:

(a) fine particle polymer having a thermo-reactive functional group, or (b) a microcapsule containing a compound having a thermo-reactive functional group.

7. A method of making a lithographic printing plate and printing, comprising a step of:

executing printing by subjecting a presensitized plate described in claim 6 to image exposure with a laser beam, and directly attaching the plate to a printing machine, or by subjecting the presensitized plate to image exposure with a laser beam after the plate is attached to the printing machine.

8. A method of manufacturing a presensitized plate, comprising the steps of:

dipping an aluminum support including an anodized layer formed on an aluminum plate in liquid containing hydrophilic particles having an average particle size of 8 to 800 nm to form a particle layer on the aluminum support; and forming a recording layer recordable by infrared laser exposure on the particle layer to thereby form a presensitized plate, wherein said presensitized plate is a presensitized plate according to claim 5.

9. A method according to claim 8, wherein after the particle layer is formed, a hydrophilic treatment is carried out before the recording layer is formed.

10. A method according to claim 8, wherein a thermal conductivity of the hydrophilic particles is 60 W/(m·K) or less.

11. A method of manufacturing a presensitized plate, comprising the steps of:

coating liquid containing hydrophilic particles having an average particle size of 8 to 800 nm on an aluminum support including an anodized layer formed on an aluminum plate to form a particle layer on the aluminum support; and forming a recording layer recordable by infrared laser exposure on the particle layer to thereby form a presensitized plate, wherein said presensitized plate is a presensitized plate according to claim 5.

12. A method according to claim 11, wherein after the particle layer is formed, a hydrophilic treatment is carried out before the recording layer is formed.

13. A method according to claim 11, wherein a thermal conductivity of the hydrophilic particles is 60 W/(m·K) or less.

14. A method of making a lithographic printing plate and printing, comprising a step of:

executing printing by subjecting a presensitized plate described in claim 5 to image exposure with a laser beam, and directly attaching the plate to a printing machine, or by subjecting the presensitized plate to image exposure with a laser beam after the plate is attached to the printing machine.

* * * * *